United States Patent
Guedon

(10) Patent No.: US 12,040,724 B2
(45) Date of Patent: Jul. 16, 2024

(54) LDO FREE WIRELESS POWER RECEIVER HAVING REGTIFIER

(71) Applicant: STMicroelectronics Asia Pacific Pte Ltd, Singapore (SG)

(72) Inventor: Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 374 days.

(21) Appl. No.: 17/576,120

(22) Filed: Jan. 14, 2022

(65) Prior Publication Data
US 2022/0140744 A1    May 5, 2022

Related U.S. Application Data

(63) Continuation-in-part of application No. 16/930,651, filed on Jul. 16, 2020, now Pat. No. 11,368,052.

(51) Int. Cl.
| | |
|---|---|
| H02M 1/08 | (2006.01) |
| H02J 50/12 | (2016.01) |
| H02M 7/219 | (2006.01) |

(52) U.S. Cl.
CPC ............. *H02M 7/219* (2013.01); *H02J 50/12* (2016.02)

(58) Field of Classification Search
CPC ........ H02J 50/12; H02J 50/10; H02M 1/0003; H02M 1/08; H02M 7/219; H02M 7/2195
See application file for complete search history.

(56) References Cited

U.S. PATENT DOCUMENTS

| | | | |
|---|---|---|---|
| 6,757,875 B2 | 6/2004 | Matsuoka | |
| 9,001,543 B2 | 4/2015 | Knoedgen | |
| 10,312,743 B2 * | 6/2019 | Ouda | ........................ H02M 7/02 |

(Continued)

FOREIGN PATENT DOCUMENTS

| | | |
|---|---|---|
| CN | 111030314 A | 4/2020 |
| DE | 102015107957 A1 | 12/2015 |

(Continued)

OTHER PUBLICATIONS

Cheng, Lin, et al: "A 6.78-MHz Single-Stage Wireless Charger With Constant-Current Constant-Voltage Charging Technique," IEEE Journal of Solid-State Circuits, vol. 55, No. 4, Apr. 2020, pp. 999-1010.

(Continued)

*Primary Examiner* — Kyle J Moody
*Assistant Examiner* — Jye-June Lee
(74) *Attorney, Agent, or Firm* — Crowe & Dunlevy LLC

(57) ABSTRACT

A bridge rectifier and associated control circuitry collectively form a "regtifier" which rectifies an input time varying voltage and regulates the rectified output voltage produced without the use of a traditional voltage regulator. To accomplish this, the gate voltages of transistors of the bridge rectifier that are on during a given phase may be modulated via analog control (to increase the on-resistance of those transistors) or via pulse width modulation (to turn off those transistors prior to the end of the phase). The transistors of the bridge rectifier that would otherwise be off during a given phase may be turned on to help dissipate excess power and thereby regulate the output voltage. This modulation is based upon both a voltage feedback signal and a current feedback signal.

26 Claims, 38 Drawing Sheets

(56) References Cited

U.S. PATENT DOCUMENTS

| | | |
|---|---|---|
| 10,355,514 B2 | 7/2019 | Terry et al. |
| 11,025,156 B2 | 6/2021 | Huang et al. |
| 11,368,052 B2 | 6/2022 | Guedon |
| 2012/0081027 A1 | 4/2012 | Anissimov |
| 2016/0126844 A1* | 5/2016 | Tschirhart ............... H02M 3/01 |
| | | 363/17 |
| 2017/0149353 A1* | 5/2017 | Hung .................... H02M 7/217 |
| 2019/0113570 A1 | 4/2019 | Astrauskas |
| 2019/0296786 A1 | 9/2019 | Cai et al. |
| 2020/0166960 A1 | 5/2020 | Poletto et al. |
| 2021/0088567 A1* | 3/2021 | Guedon ................ H02M 7/219 |
| 2021/0091597 A1* | 3/2021 | Hegde .................... H02M 1/32 |
| 2022/0140657 A1 | 5/2022 | Guedon |
| 2022/0140744 A1 | 5/2022 | Guedon |
| 2023/0275508 A1 | 8/2023 | Guedon et al. |

FOREIGN PATENT DOCUMENTS

| | | |
|---|---|---|
| EP | 3940945 A1 | 1/2022 |
| GB | 2187312 A | 9/1987 |
| JP | 2008154377 A | 7/2008 |

OTHER PUBLICATIONS

EPO Search Report for family-related EP Appl. No. 21184168.9, report dated Nov. 18, 2021, 9 pages.

\* cited by examiner

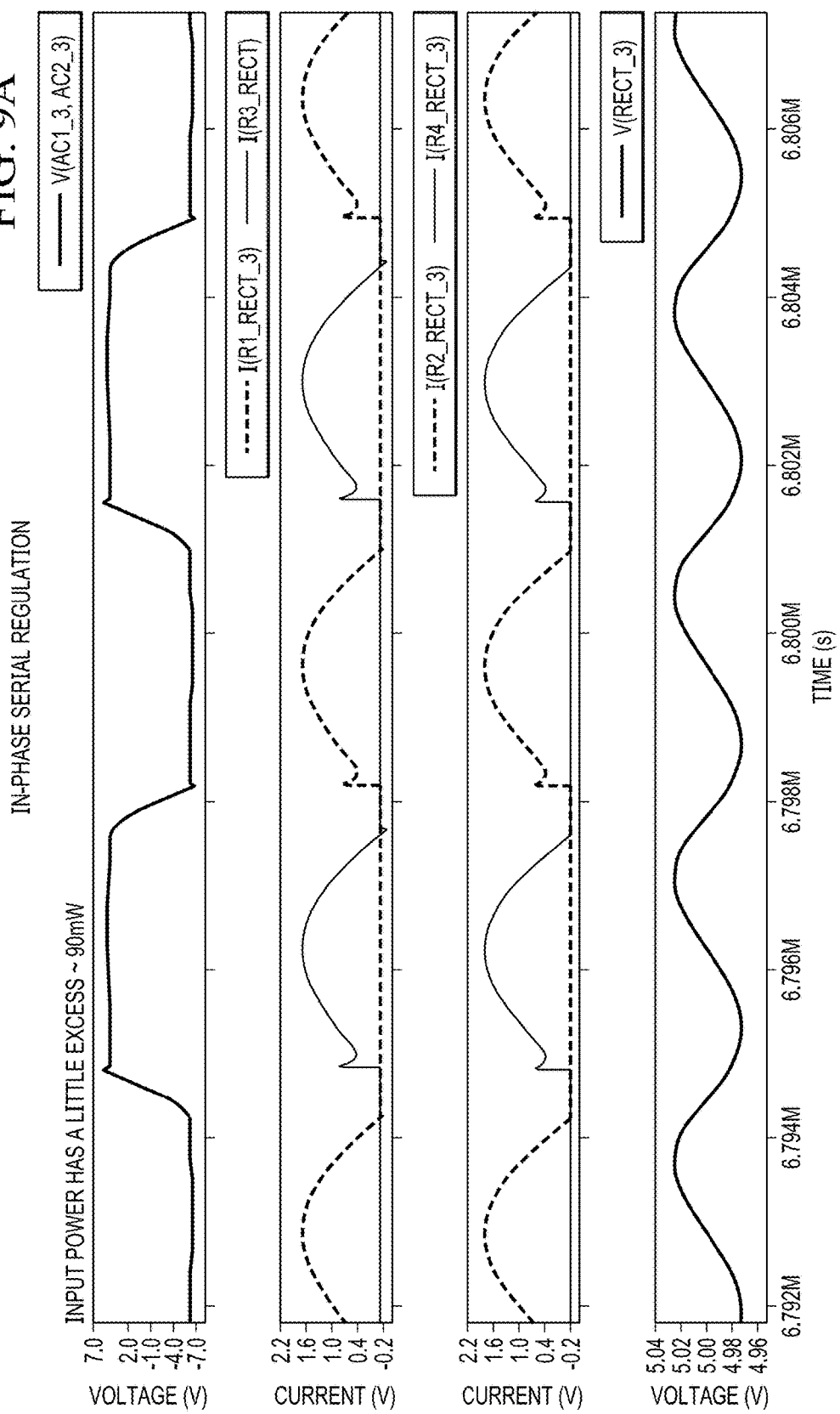

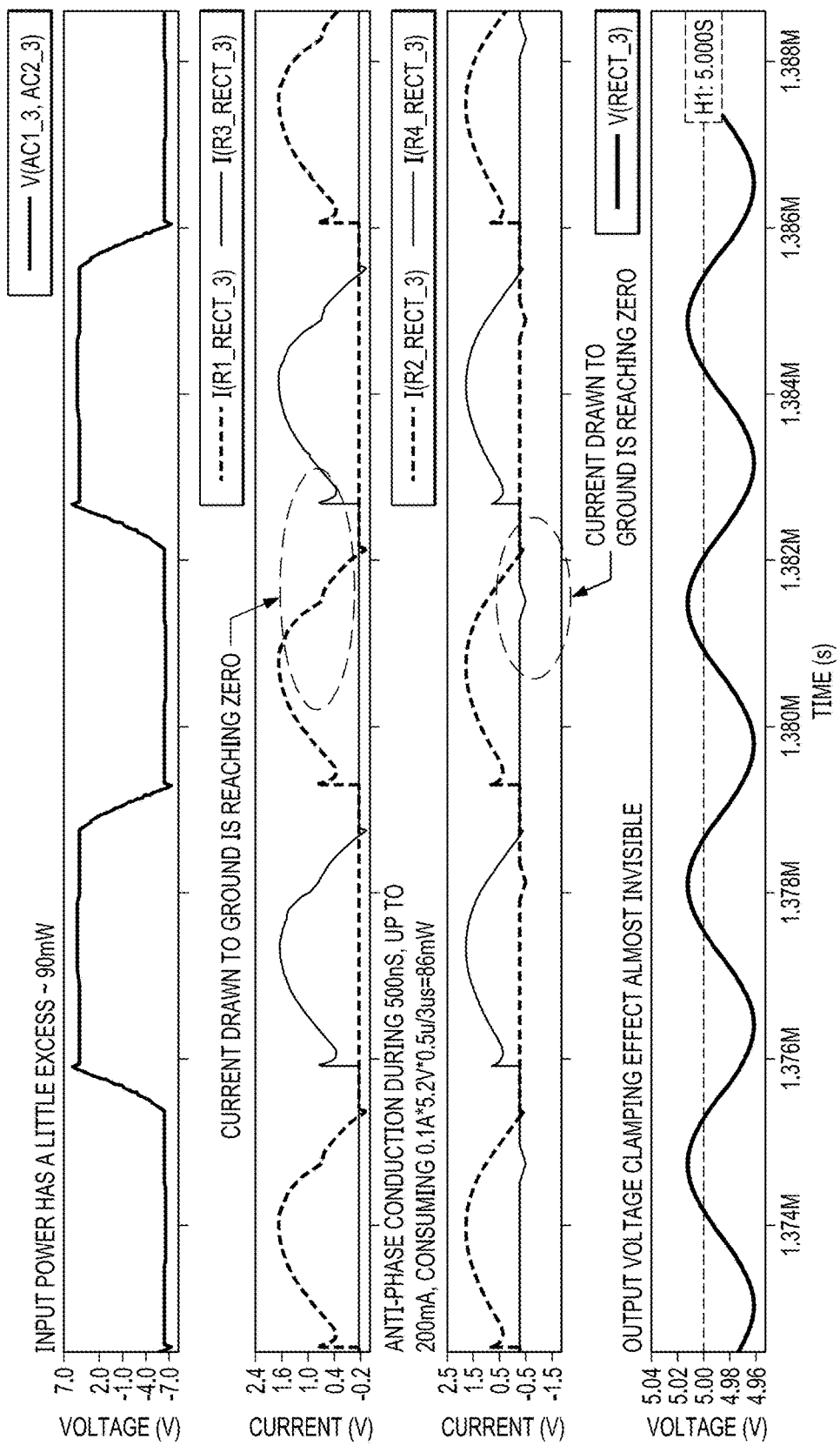

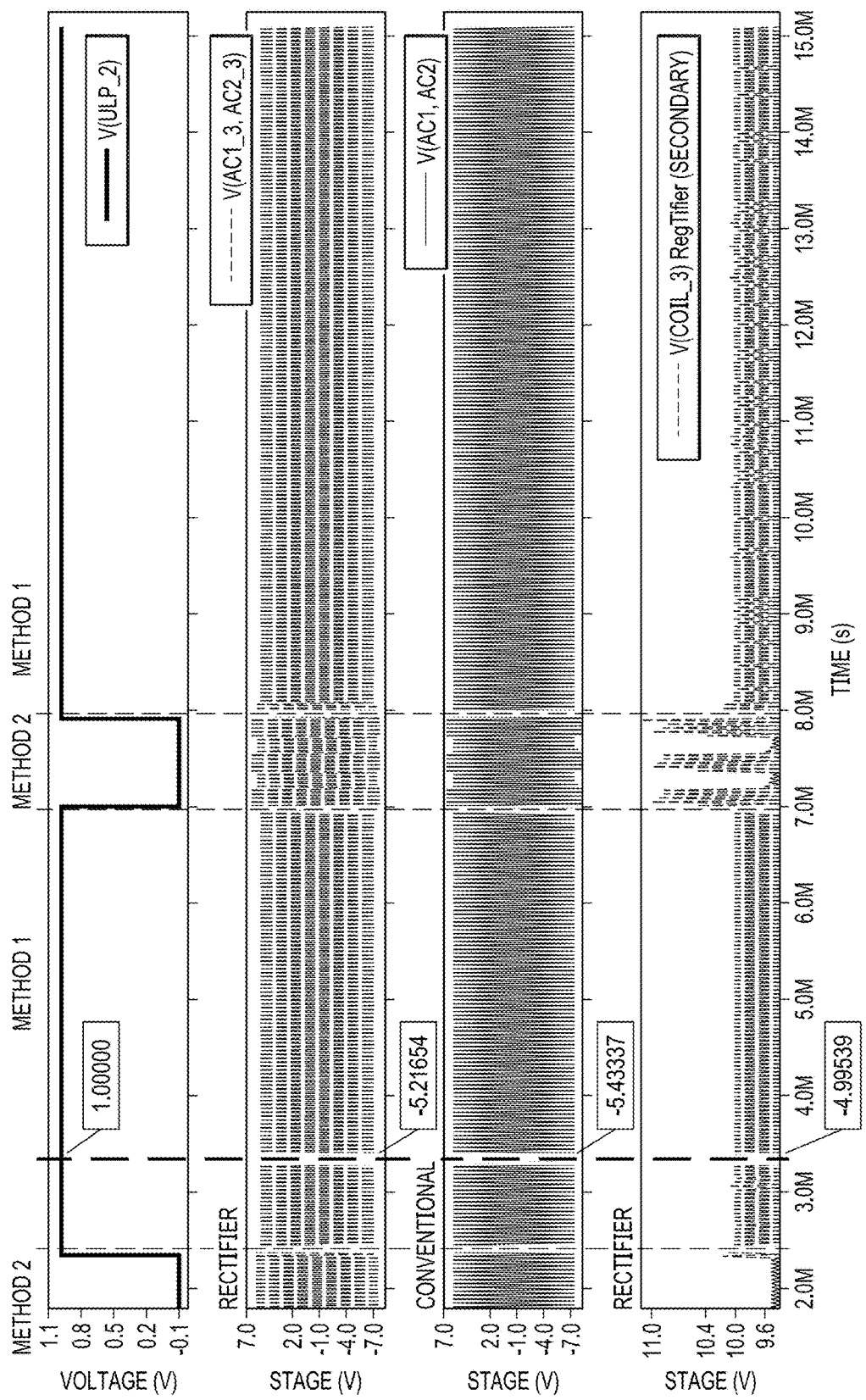

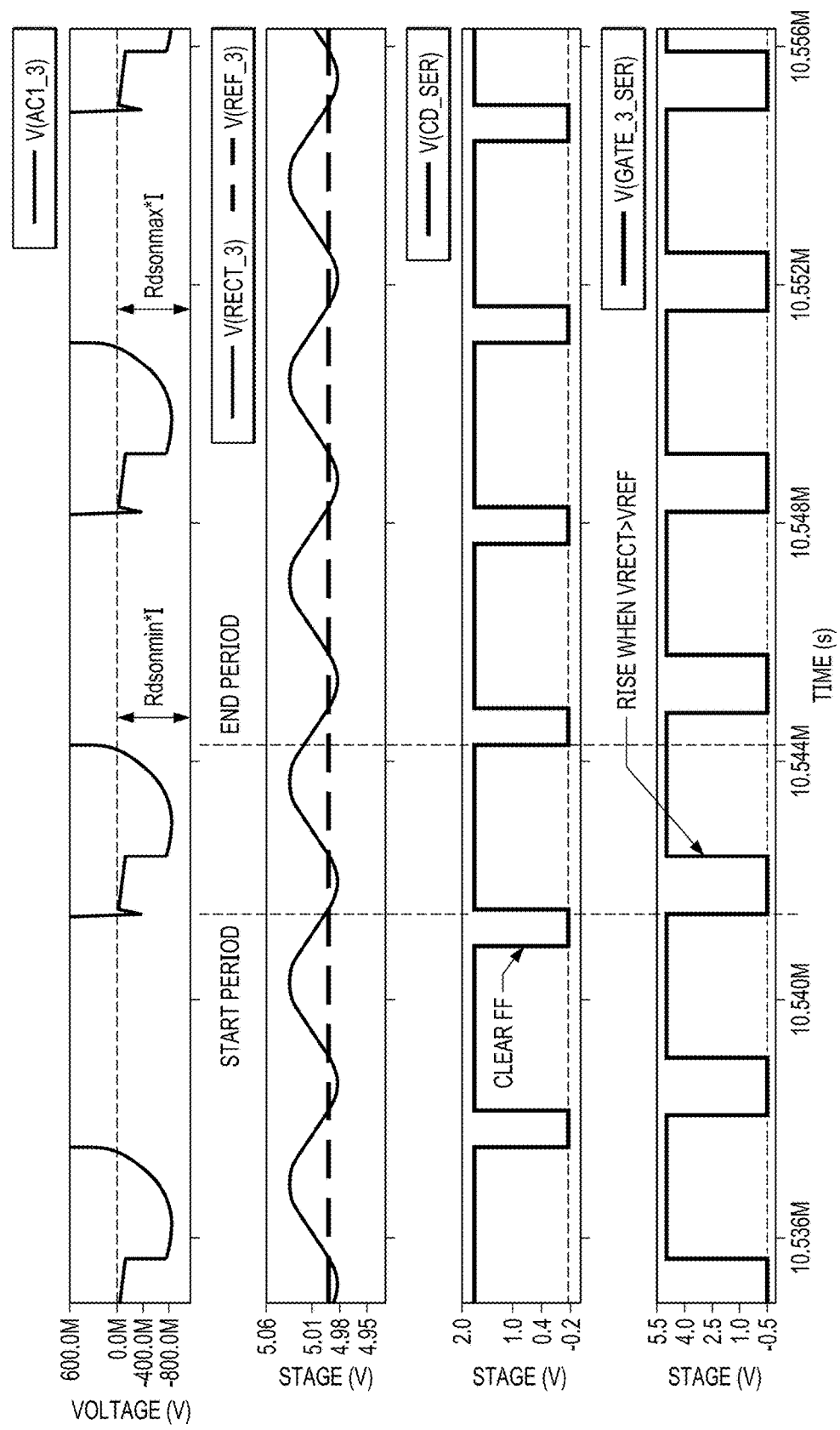

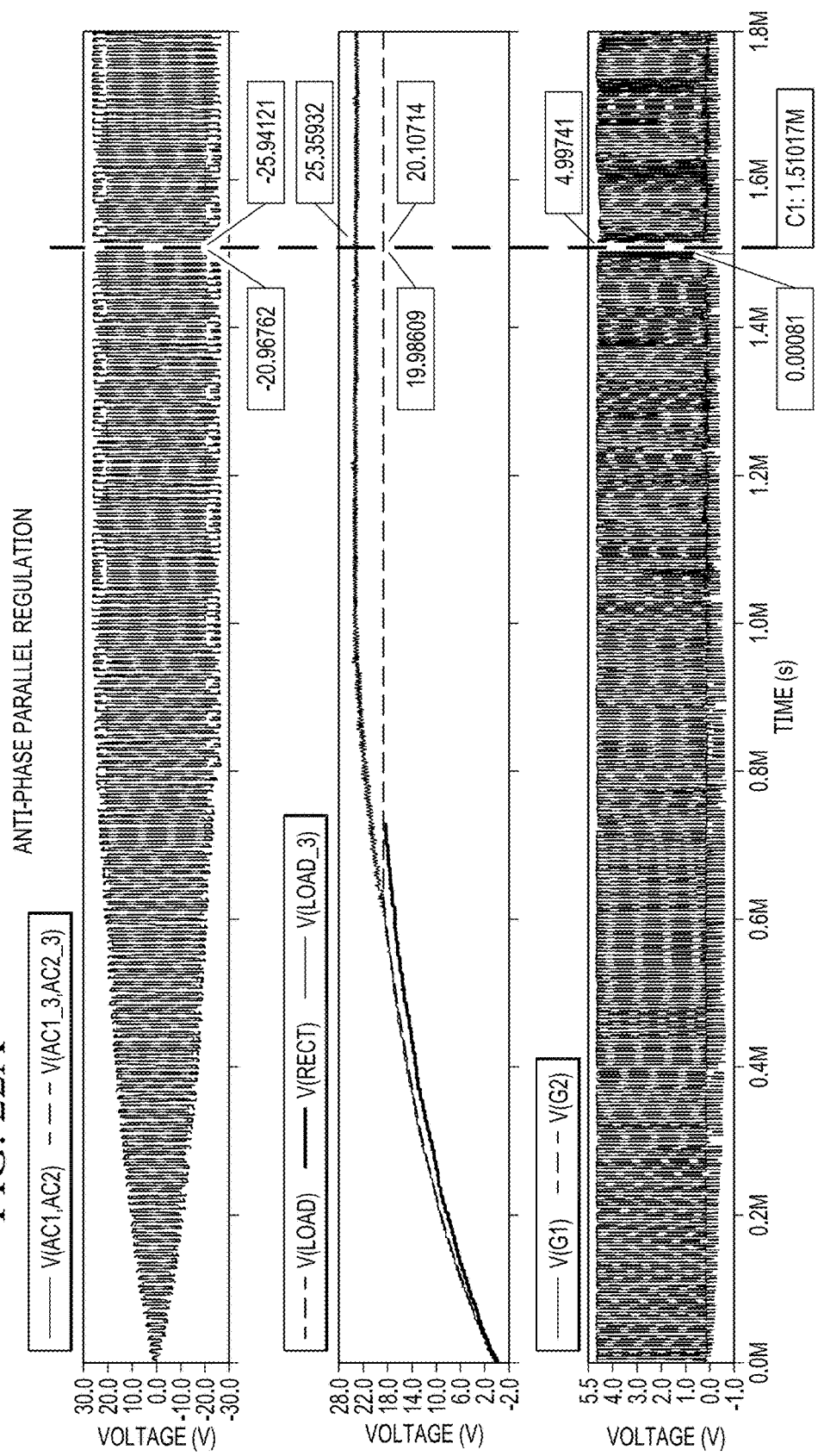

LDO FREE WIRELESS POWER RECEIVER HAVING REGTIFIER

RELATED APPLICATION

This is a continuation-in-part of U.S. patent application Ser. No. 16/930,651, filed on Jul. 16, 2020, the contents of which is incorporated by reference in its entirety.

TECHNICAL FIELD

This disclosure is directed to the field of wireless power transmission and, in particular, to hardware, operating techniques for the hardware, and methods for causing a bridge rectifier to perform both rectification and regulation functions based on both voltage and current feedback.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. As shown in FIG. 1, a typical prior art wireless power transmission system 10 utilizes a transmitter 11 including a transmission coil Lp and a serial capacitance Cp forming a serial resonant L,C network, driven by electric power from a power source 12 (typically a wired connection, but in some cases a battery), that generates a time-varying electric field, and a receiver 15 including a receiver coil Ls and a serial capacitance Cs forming a similar serial resonant L,C network in which the time-varying electric field induces an AC current. Other possible configurations exist where L,C are in parallel on the primary side and/or the secondary side, offering four possible schemes—serial-serial, serial-parallel, parallel-serial, and parallel-parallel. Each scheme may present some advantages and/or disadvantages depending on the application, and the serial-serial configuration is the most widely used in recent developments for the mobile device market. The receiver 15 includes a bridge rectifier 16 (comprised of the illustrated diodes D1-D4) that rectifies the AC current to produce a DC current that charges a tank capacitor Ctank connected to an input node Nin of a regulator 17 to a regulator input voltage. The regulator 17, typically a low dropout amplifier, produces a regulated output voltage at its output node Nout, which is provided to a load (represented by the load resistance R1 and the load capacitance C1). While such prior art wireless power transmission systems 10 are functional and in wide use, the usage of the regulator 17 consumes a substantial amount of integrated circuit area due to its use of a large power MOS device. Since such wireless power transmission systems 10 are primarily utilized in portable electronic devices, this area consumption is undesirable. Therefore, further development into wireless power transmission systems is needed.

SUMMARY

Disclosed herein is a bridge rectifier and associated control circuitry collectively forming a "regtifier", capable of both rectifying an input time varying voltage as well as regulating the rectified output voltage produced. To accomplish this, the gate voltages of transistors of the bridge rectifier that are on during a given phase may be modulated via analog control (to increase the on-resistance of those transistors) or via pulse width modulation (to turn off those transistors prior to the end of the phase), in what is called "in-phase regulation". Alternatively or additionally, the transistors of the bridge rectifier that would otherwise be off during a given phase may be turned on to help dissipate excess power and thereby regulate the output voltage, in what is called "anti-phase regulation".

The feedback upon which the control of the gate voltages of the transistors is based includes both the rectified output voltage and a sensed current flowing into the load. The load may be directly powered by the regtifier, or the load may be powered by a voltage converter that is powered by the regtifier. In the case where the load is powered by a voltage converter that is powered by the regtifier, the feedback is instead based on the voltage across the load and the sense current flowing into the load.

BRIEF DESCRIPTION OF THE DRAWINGS

FIG. 9, which includes FIGS. 9A and 9B, is a timing diagram showing voltages of the wireless power transmission system of FIG. 2 in operation, when the feedback loop is controlling the bridge rectifier to perform low-side in-phase serial voltage regulation. The regulation is applied on the low-side only in this example for allowing a better appreciation of the substantial difference between the drive signal applied to the low-side as per the wireless power transmission system disclosed herein and the conventional drive signal applied to the high-side as per the prior art.

FIG. 10, which includes FIGS. 10A and 10B, is a timing diagram showing voltages of the wireless power transmission system of FIG. 2 in operation, when the feedback loop is controlling the bridge rectifier to perform low-side anti-phase parallel voltage regulation.

FIG. 11, which includes FIGS. 11A and 11B, is a timing diagram showing voltages of the wireless power transmission system of FIG. 2 in operation, wherein the feedback loop switches between controlling the bridge rectifier to perform in-phase serial voltage regulation and controlling the bridge rectifier to perform anti-phase parallel voltage regulation illustrating ASK symbols transmitted during power transmission.

FIG. 13, which includes

FIG. 16, which includes FIGS. 16A and 16B, is a timing diagram showing one of the PWM control techniques available when the feedback loop is controlling the bridge rectifier to perform low-side PWM based in-phase serial voltage regulation using the regtifier of FIG. 16.

FIG. 22, which includes FIGS. 22A and 22B, is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.

FIG. 24, which includes

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that when transistors are described below as being "on", this means that those transistors are operating in the linear region or saturation region, and are not operating in the cut-off region.

A. Hardware Description

Figure 1:
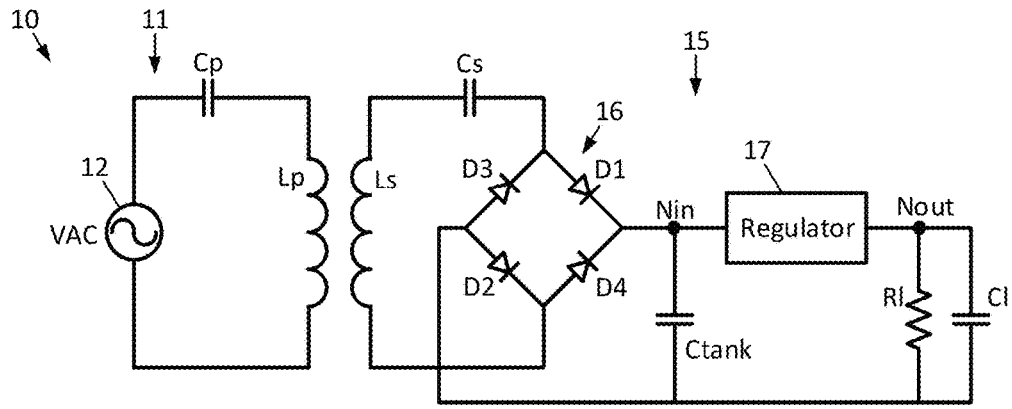
FIG. 1 is a schematic block diagram of a prior art wireless power transmission system.
Figure 2:
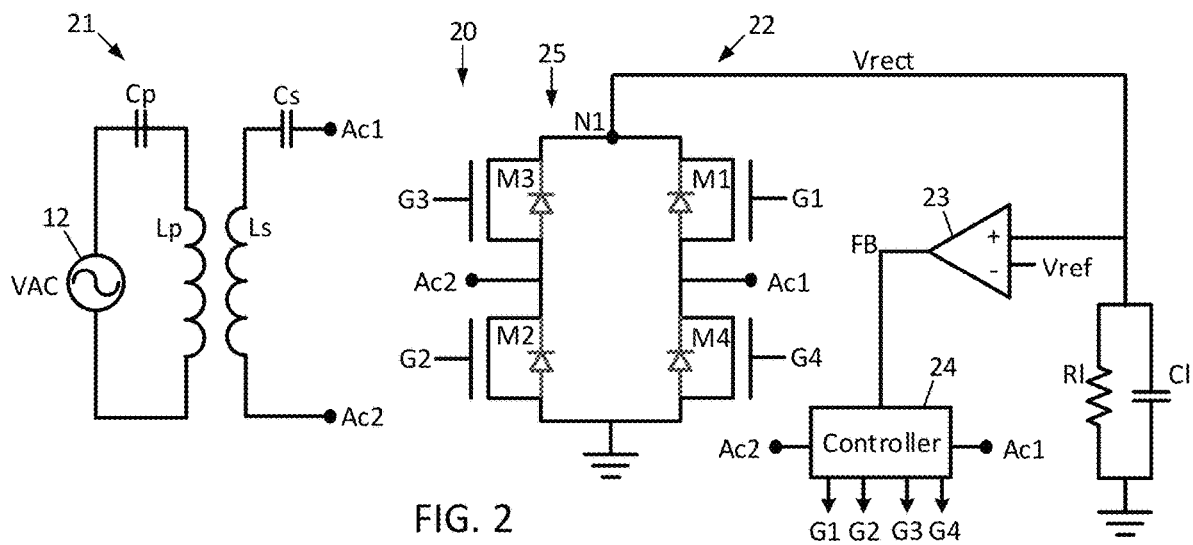
FIG. 2 is a schematic block diagram of a wireless power transmission system disclosed herein in which the bridge rectifier also performs a regulation function, enabling the lack of an additional voltage regulation circuit.

Now described with reference to FIG. 2 is a wireless power transmission system 20 including a transmitter 21 and a receiver 22. The transmitter 21 is comprised of an AC voltage source 12 coupled to a serial resonant transmitter coil Lp and capacitance Cp. The receiver 22 includes a serial resonant receiver coil Ls and capacitance Cs coupled between nodes Ac1 and Ac2, and a "regtifier" 25 (a bridge rectifier also capable of voltage regulation when controlled using techniques described below) formed by transistors M1-M4 coupled between node N1 and ground.

The regtifier is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An amplifier 23 has an inverting input terminal coupled to receive a reference voltage Vref (which is set to be equal to a desired output voltage Vrect at node N1), a non-inverting input terminal coupled to node N1, and an output coupled to control circuitry 24 and generating a feedback signal FB. A load is connected between node N1 and ground, and is represented by resistor R1 and capacitor C1. The control circuitry 24 itself receives input from the feedback signal FB, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitable modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit.

Therefore, the amplifier 23 and the control circuitry 24 form a feedback loop.

B. Operation Using In-Phase Serial Voltage Regulation

Operation of the wireless power transmission system 20 under an in-phase serial voltage regulation scheme controlled by the control circuitry 24 is now described.

Figure 3:
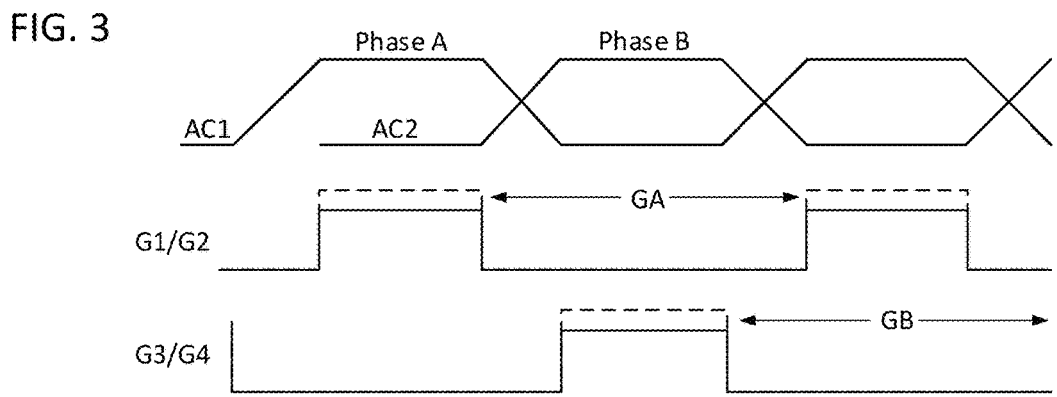
FIG. 3 is a timing diagram showing voltages of the wireless power transmission system of FIG. 2 in operation, when the feedback loop is controlling the bridge rectifier to perform in-phase serial voltage regulation.

Shown in the graph of FIG. 3 are waveform traces of the signals at the nodes Ac1 and Ac2. Notice that when the signal at Ac1 is positive, it is labeled as Phase A, that when the signal at Ac2 is positive, it is labeled as Phase B, and that the signals at Ac1 and Ac2 are 180° out of phase with one another.

During Phase A, corresponding to the positive phase of Ac1 and the negative phase of Ac2, the control signal GA is generated and driven to a high voltage (a level sufficient to fully turn on the transistors M1-M2) by the controller 24, and the control signal GB is generated and pulled to a low voltage (a level to fully turn off the transistors M3-M4) by the controller 24. Conversely, during Phase B, the control signal GB is driven to a high voltage by the controller 24 and the control signal GA is pulled to a low voltage by the controller 24. The controller 24 generates the gate voltages G1-G4 for the transistors M1-M4, and the values of G1-G4 depend upon the voltage values of the control signals GA and GB, the voltage of the feedback signal FB, and the current phase.

When the incoming power delivered by the regtifier 25 to the load is greater than the amount of power consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 so as to place the associated transistors M1-M4 into the linear region (ohmic region) of operation and increase the drain to source resistance of those transistors, resulting in the excess incoming power being dissipated within the activated transistors M1-M4 of the regtifier 25. This modulation continues throughout operation, with the result being that the voltage Vrect remains close to the reference voltage Vref.

When modulation of the gate voltages G1-G4 does not occur, the gate voltages G1-G2 are equal to the voltage of control signal GA.

1. Analog Control of Transistor Gates

In greater detail, as shown in FIG. 3, the gate voltages G1 and G2 are modulated during Phase A so that the transistors M1 and M2 are not fully on, increasing the drain to source resistance of transistors M1 and M2, resulting in additional power dissipation in transistors M1 and M2 over conventional operation; the gate voltages G3 and G4 remain pulled low such that the transistors M3 and M4 remain off. This configuration of the transistors M1-M4 can be seen in FIG. 4.

During Phase B, as shown in FIG. 3, the gate voltages G3 and G4 are modulated so that the transistors M3 and M4 are not fully on, increasing the drain to source resistance of transistors M3 and M4, resulting in additional power dissipation in transistors M3 and M4 over conventional operation; the gate voltages G1 and G2 remain pulled low such that the transistors M1 and M2 remain off. This configuration of the transistors M1-M4 can be seen in FIG. 5.

Figure 4:
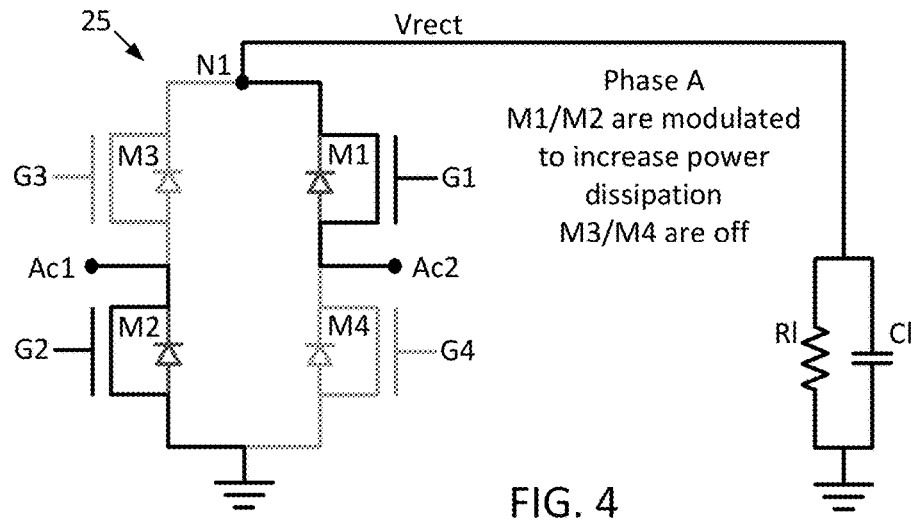
FIG. 4 is a schematic block diagram of the wireless power transmission system of FIG. 2 showing its operation during phase A of the in-phase serial voltage regulation of FIG. 3.
Figure 5:
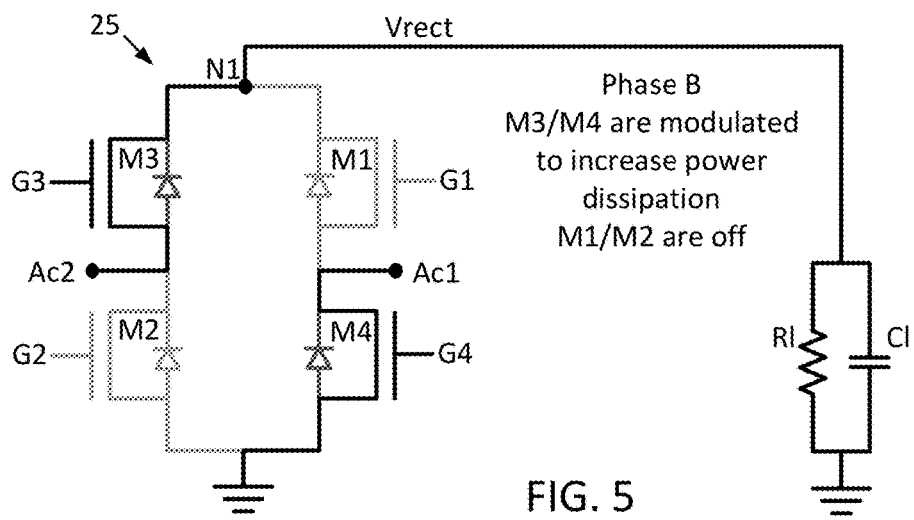
FIG. 5 is a schematic block diagram of the wireless power transmission system of FIG. 2 showing its operation during phase B of the in-phase serial voltage regulation of FIG. 3.

This operating scheme is referred to as in-phase serial regulation because the transistors M1-M4 that are conventionally fully on during a given phase are instead conductivity modulated, and as a result and as shown in FIGS. 4-5, the power dissipation is achieved by increasing the conductivity and voltage drop within elements which are in serial in the main current path to the load during the method.

Note that during Phase A, the voltage level of the gate voltages G1 and G2 need not both be modulated to increase the drain to source resistance of their respective transistors M1 and M2, and instead only one of the gate voltages G1 or G2 can be modulated to increase the drain to source resistance of its respective transistor M1 or M2 while the other control signal can remain high to keep its respective transistor M1 or M2 fully on.

Similarly, during Phase B, the voltage level of the gate voltages G3 and G4 need not both be modulated to increase the drain to source resistance of their respective transistors M3 and M4, and instead only one of the gate voltages G3 or G4 can be modulated to increase the drain to source resistance of its respective transistor M3 or M4 while the other control signal can remain high to keep its respective transistor M3 or M4 fully on.

The choice of applying the technique to one or more elements is to be appreciated/considered versus the maximum amount of excess power to be dissipated by the system.

Figure 9B:
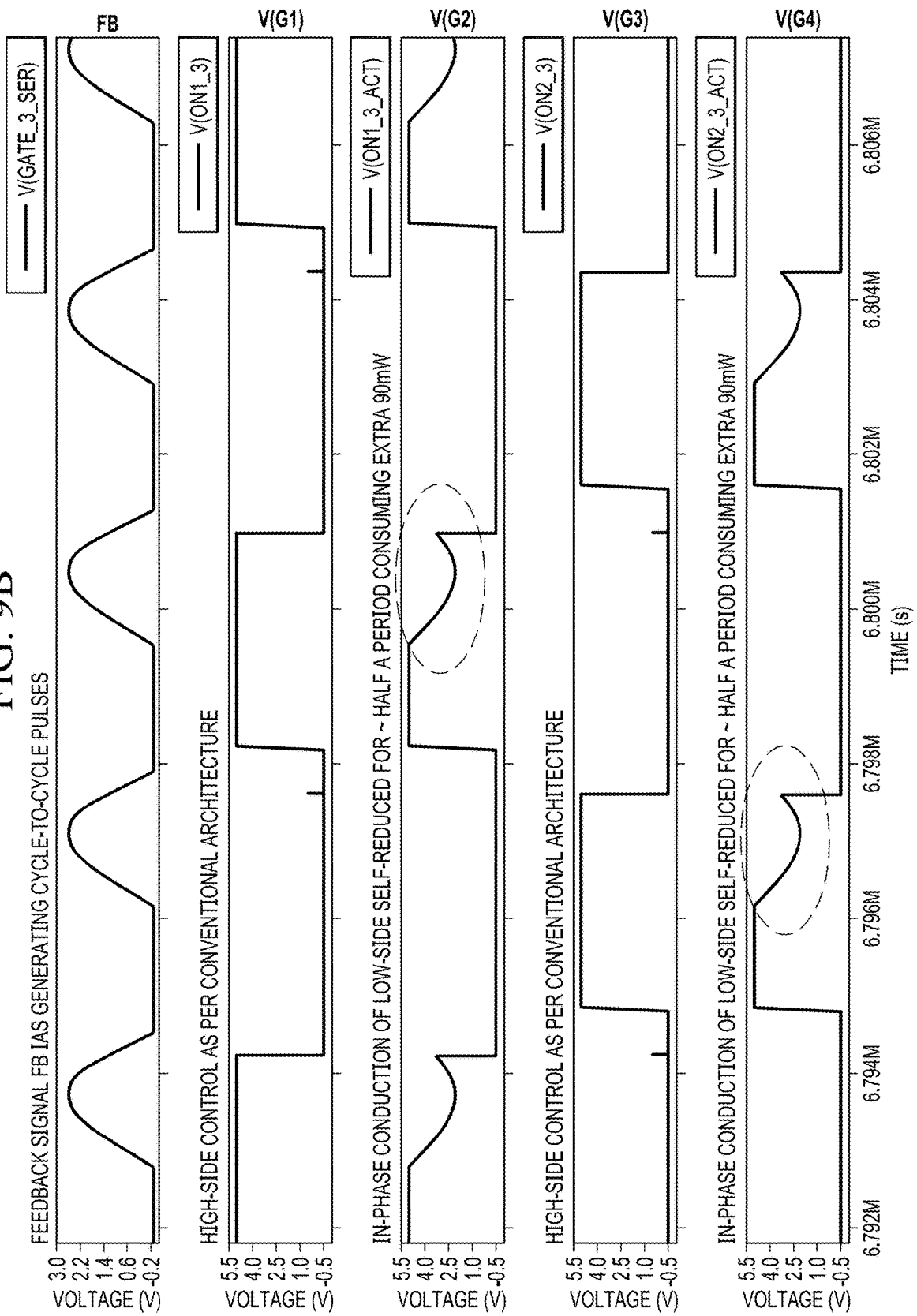

As an example of this form of operation where one transistor M1-M4 at a time is modulated, and the modulation is not flat across each pulse of the gate voltages, FIGS. 9, 9A, 9B show additional waveforms of the wireless power transmission system 20 operating using in-phase serial regulation. Here, it can be seen that during phase A, the gate voltage G2 of the transistor M2 (which turns on the transistor M2) is pulled from a steady high voltage of 5.0V to less than 4V while the gate voltage G1 of the transistor M1 (which turns on the transistor M1) remains high and the gate voltages G3 and G4 of the transistors M3 and M4 remain low. Here, it can also be seen that during phase B, the gate voltage G4 of the transistor M4 (which turns on the transistor M4) is pulled from a steady high voltage of 5.0V to less than 4V while the gate voltages G3 of the transistor M3 (which turns on the transistor G3) remains high and the gate voltages G1 and G2 of the transistors M1 and M2 remain low.

Notice that when the gate voltages G2 and G4 are pulled downward from being fully high so as to modulate the on-resistance of transistors M2 and M4, this is performed for approximately half the pulse of those gate voltages. However, if there is the need to consume additional power over this arrangement, the gate voltages G2 and G4 will be pulled downward lower from being fully high or longer than half the pulse of those gate voltages so as to modulate the on-resistance of transistors M2 and M4 for a longer period of time. The shape of the gate voltage mainly results from the gain of the feedback loop. These techniques are clearly applicable to the case where two transistors are simultaneously modulated.

The in-phase serial voltage regulation scheme described above is particularly suited to use where the voltage output Vrect by the regtifier 25 is relatively low and where the expected excess power to be dissipated is relatively low.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle-to-cycle basis when performing in-phase serial voltage regulation (meaning the gate voltages G1-G4 will naturally, by virtue of the feedback loop gain, self-adjust on the fly to have a different shape and magnitude during each cycle based on the incoming power within the alternance of the cycle, such that the gate voltages G1-G4 may begin a cycle having one magnitude but that magnitude may be changed during a portion of the cycle). This feedback technique can be observed in the graph of FIGS. 9, 9A, 9B, where the feedback signal FB is generated during each phase, enabling the control signals G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically. Waveforms showing this mode of operation, when operating using anti-phase parallel regulation can be seen in FIGS. 22, 22A, 22B and 23, and when operating using in-phase serial regulation can be seen in FIGS. 24, 24A, 24B and 25.

2. PWM Control of Transistor Gates

In the description given above, the gate voltages G1-G4 of the transistors M1-M4 are modulated in an analog fashion by the control circuitry 24 to perform in-phase serial voltage regulation. Now, techniques for modulating the gate voltages G1-G4 of the transistors M1-M4 using pulse width modulation (PWM) to perform in-phase serial voltage regulation are described.

A first way in which to operate the gates of the transistors from among M1-M4 to be regulated involves simple on-off PWM. Here the amplifier 23 is configured as a comparator to provide the feedback signal FB as a digital output, resulting in a pulse FB during which the output voltage Vrect exceeds the reference voltage Vref. During this pulse, the transistors from among M1-M4 that are fully on during the current phase are turned fully off in response to the rising of FB by their respective gate voltages being pulled to ground, in turn increasing power dissipation. Thus, through feedback, the duration of the gate voltages G1-G4 driving the transistors M1-M4 are adjusted so that the output pulse duration of the regtifier 25 is just long enough to provide the requisite power but just short enough to dissipate excess power.

Figure 12:
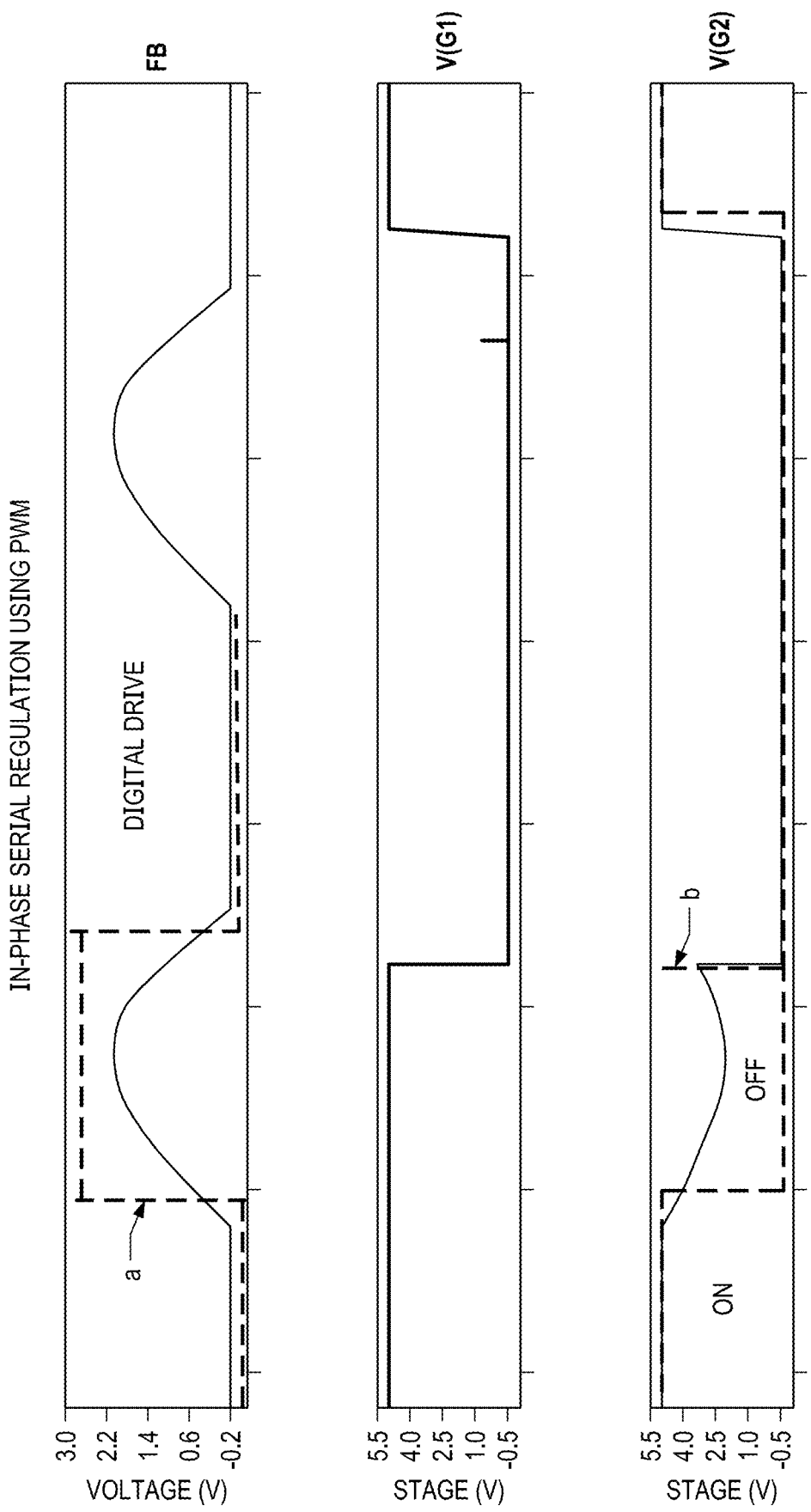
FIG. 12 is a timing diagram showing the digitization of the feedback signal FB and the PWM control of the modulated transistors, when operating using PWM based in-phase serial voltage regulation.

A simple example of this technique as compared to the non-PWM in-phase serial voltage rectification technique can be seen in the traces of FIGS. 12-13, where it can be seen that here the feedback signal FB is digitized, that the gate voltage G1 is maintained as fully high during Phase A, and that the gate voltage G2 is pulled low approximately halfway through Phase A to increase the drain to source resistance of the transistor M2 to increase power dissipation. Note that as shown, spikes may occur in the gate voltage G2 being modulated, and these spikes may be filtered by the control circuitry 24, such as by using a debouncing function.

Figure 13A:
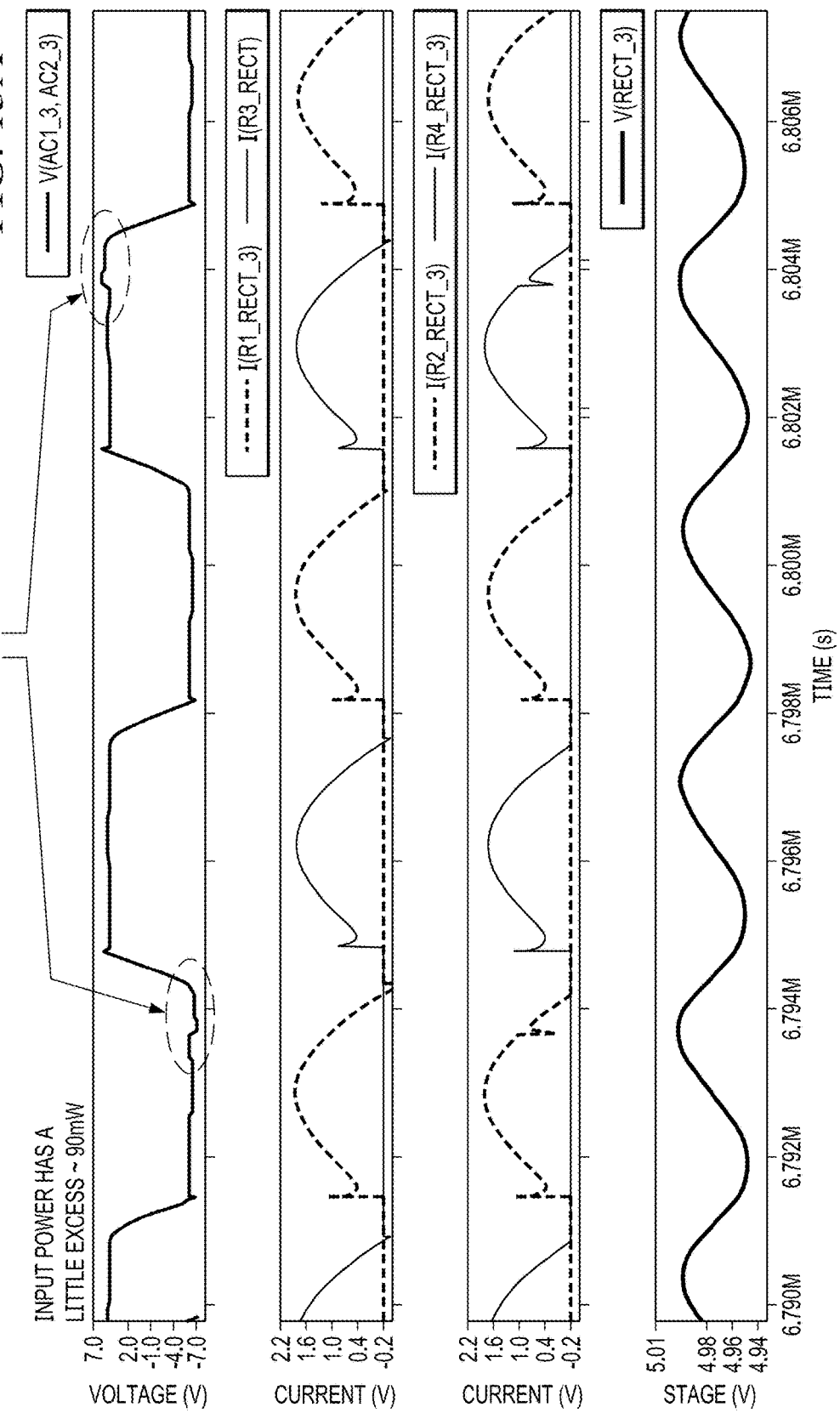
FIGS. 13A and 13B, is a timing diagram showing voltages of the wireless power transmission system of FIG. 2 in operation, when the feedback loop is controlling the bridge rectifier to perform low-side PWM based in-phase serial voltage regulation.
Figure 13B:
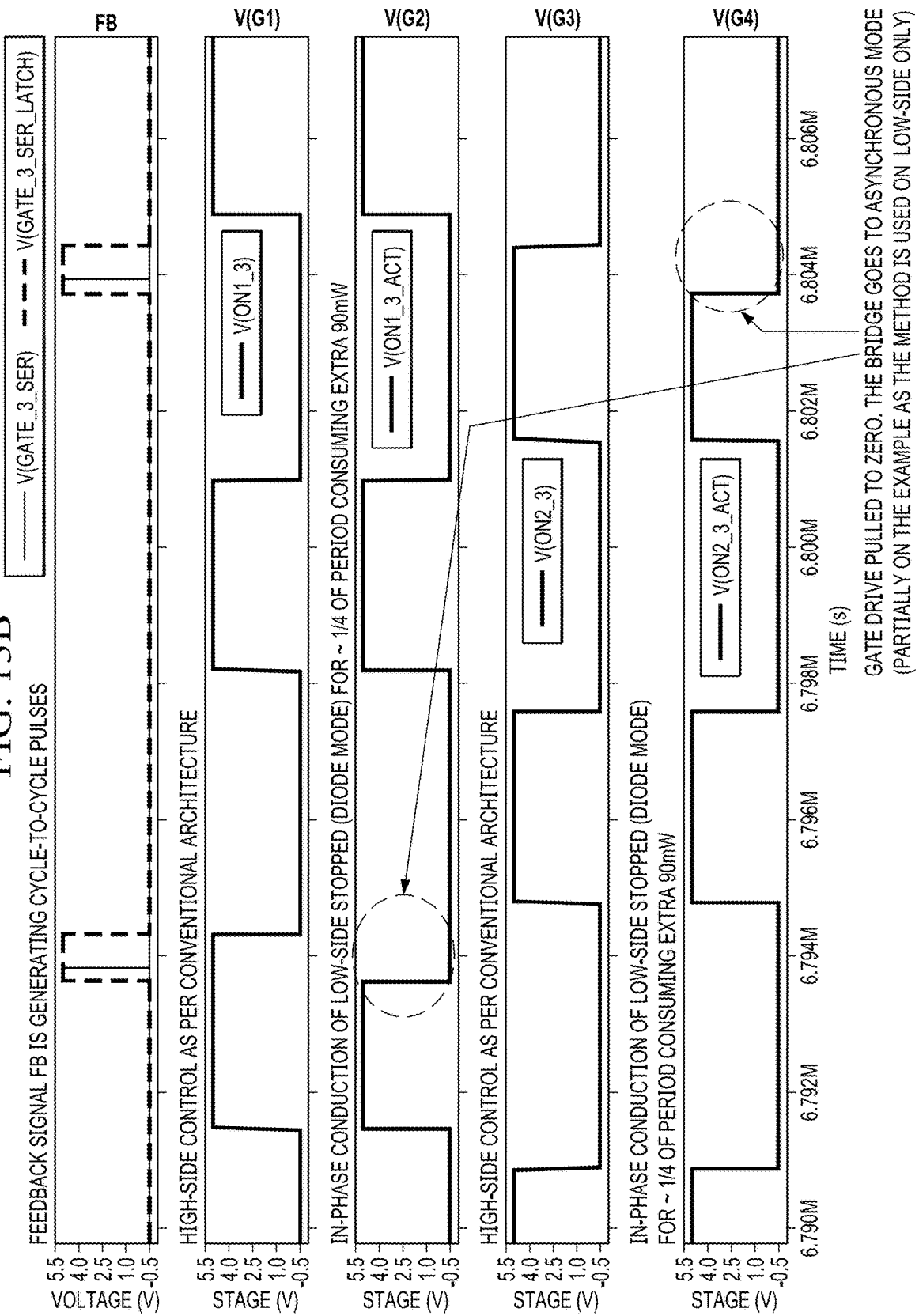
Figure 14:
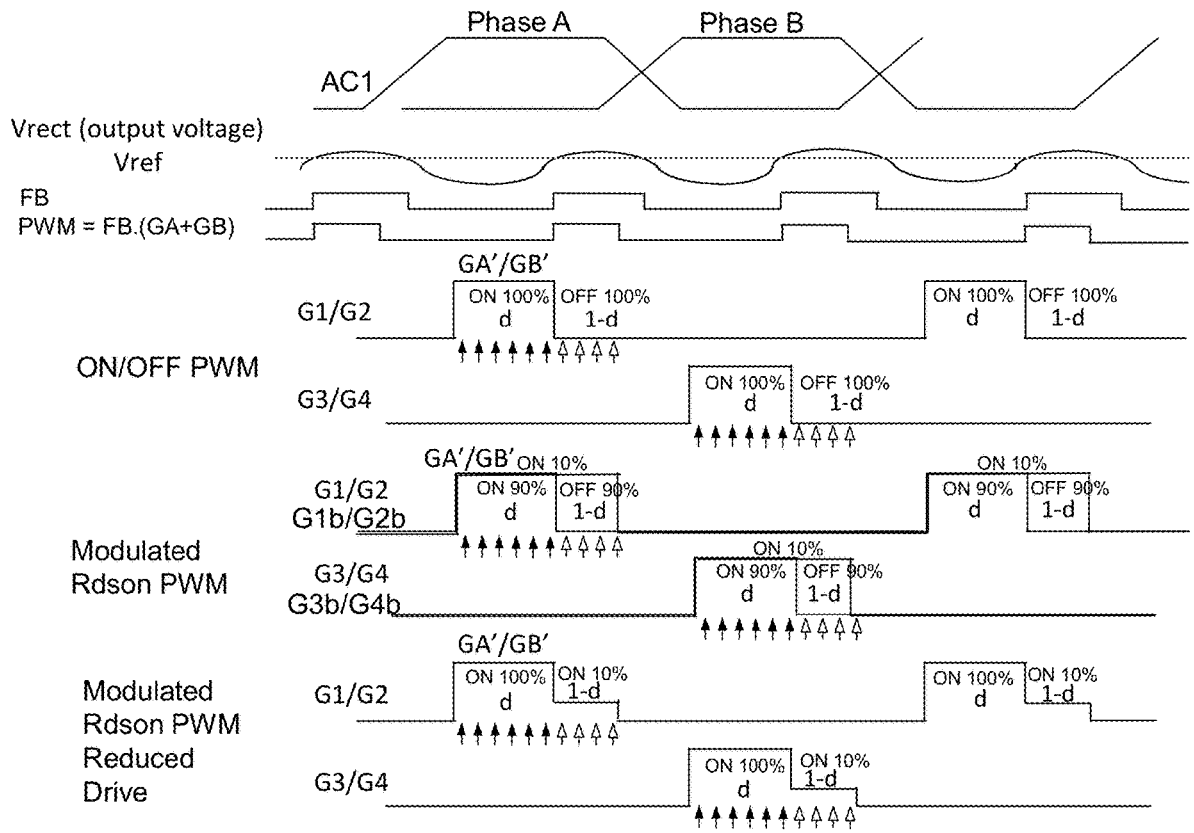
FIG. 14 are timing diagrams showing the three different PWM control techniques available when the feedback loop is controlling the bridge rectifier to perform low-side PWM based in-phase serial voltage regulation.

In the example of FIGS. 13, 13A, 13B, the gate voltages G2 and G4 of the low side transistors (M2 and M4) are modulated while the gate voltages G1 and G3 of the high side transistors (M1 and M3) are not. However, both low side and high side transistors may be modulated. As shown in FIG. 14, during phase A, so as to provide for voltage regulation, the gate voltages G1 and G2 are fully turned off (in response to the feedback signal FB rising, which as can be seen, occurs when Vrect exceeds Vref) earlier than they would otherwise be using a conventional wireless power transmission system, maintaining the output voltage Vrect at a desired level and dissipating excess power. Similarly, during phase B, so as to provide for voltage regulation, the gate voltages G3 and G4 are fully turned off (in response to the feedback signal FB rising) earlier than they would otherwise be using a conventional wireless power transmission system, maintaining the output voltage Vrect at a desired level and dissipating excess power.

Figure 15:
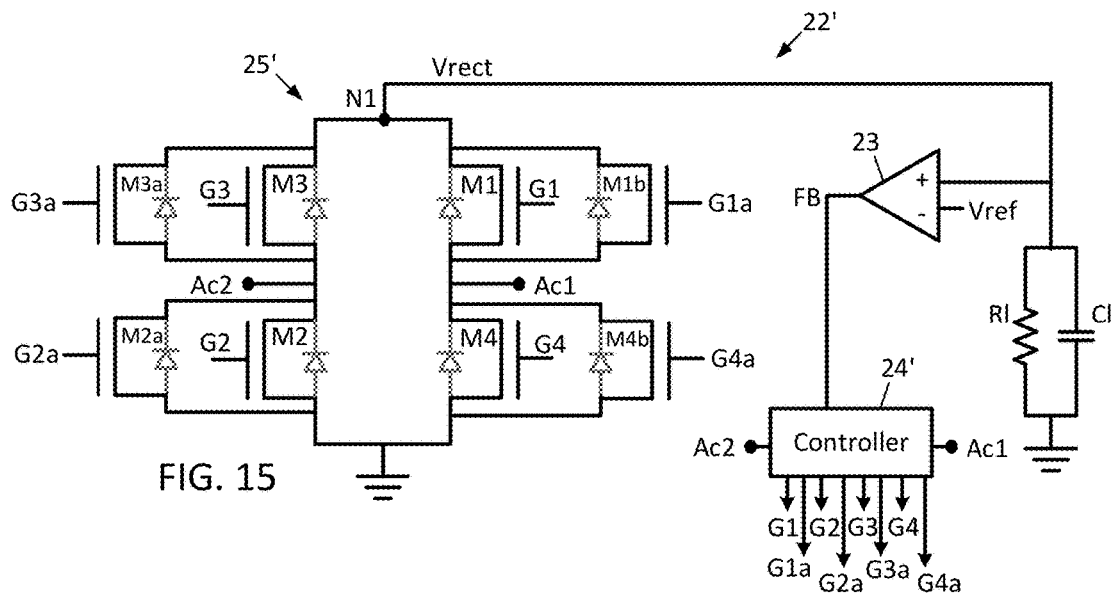
FIG. 15 is a schematic diagram of an alternate configuration for the regtifier of FIG. 2.
Figure 16B:
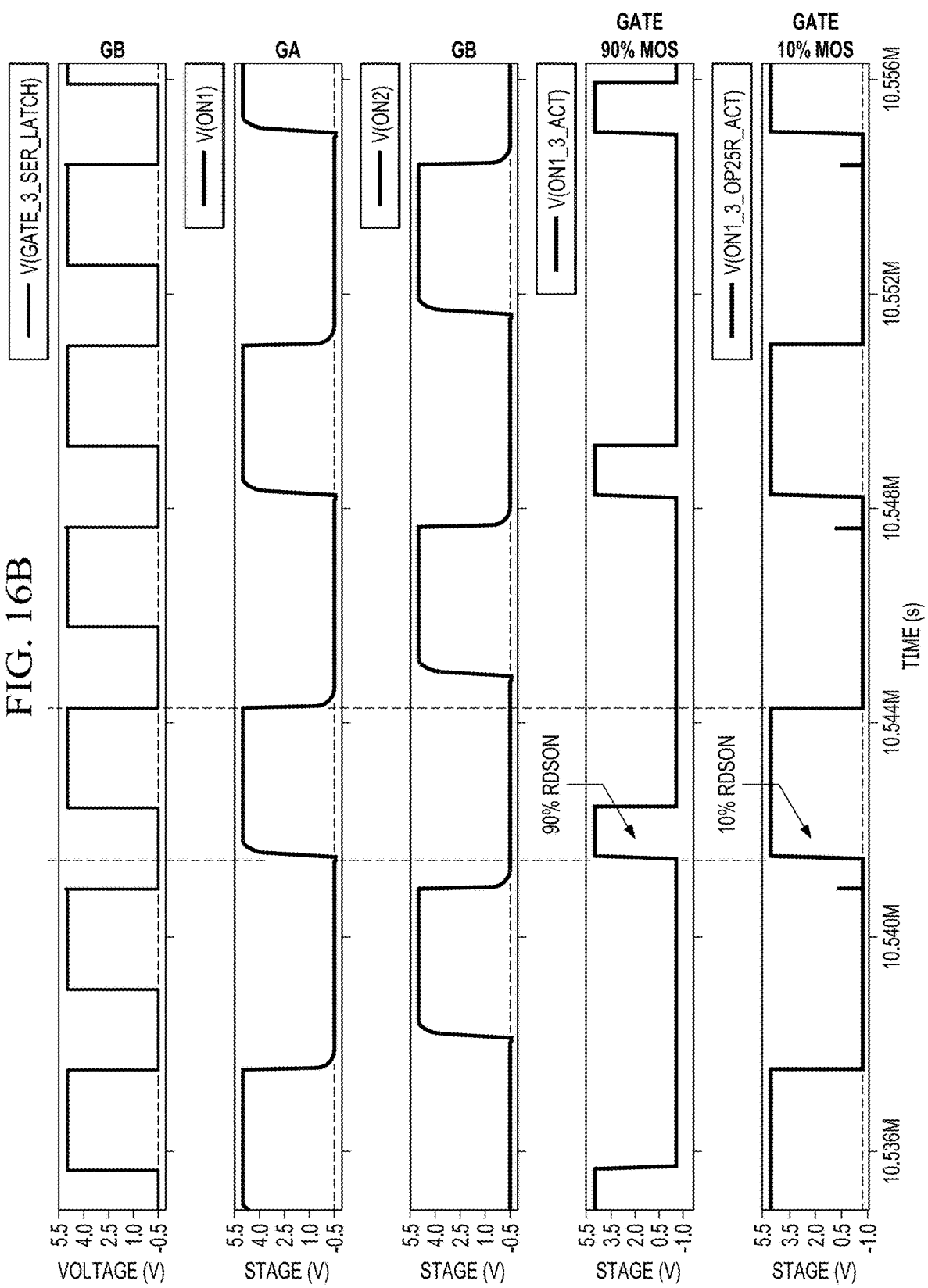

A second way in which to operate the gates of the transistors from among M1-M4 to be regulated involves modifying the regtifier itself to produce a modified regtifier 25'. As can be seen in FIG. 15, each transistor of the regtifier 25' has been divided into two parallel coupled transistors having different W/L ratio as one another so as to provide different resistivities when controlled individually, with the sum of the widths and lengths of the transistors of each parallel coupled pair being equal to the width and length of the corresponding transistor of the regtifier 25, so as to provide a total the same as the regtifier 25 resistivity when fully ON. Therefore, the regtifier 25 is comprised of: n-channel transistors M1 and M1*b* coupled in parallel, with their drains coupled to node N1, their sources coupled to node Ac1, and their gates respectively coupled to receive the gate voltages G1 and G1*a*; n-channel transistors M4 and M4*b* coupled in parallel, with their drains coupled to node Ac1, their sources coupled to ground, and their gates respectively coupled to receive the control signals M4 and M4*a*; n-channel transistors M3 and M3*a* coupled in parallel, with their drains coupled to node N1, their sources coupled to node Ac2, and their gates respectively coupled to receive the gate voltages G3 and G3*a*; and n-channel transistors M2 and M2*a* coupled in parallel, with their drains coupled to node Ac2, their sources coupled to ground, and their gates respectively coupled to receive the gate voltages G2 and G2*a*.

The area of the transistor M1 in the regtifier 25' is 90% of the area of the transistor M1 in the regtifier 25 and the area of the transistor M1*a* in the regtifier 25' is 10% of the area of the transistor M1 in the regtifier 25; the area of the transistor M2 in the regtifier 25' is 90% of the area of the transistor M2 in the regtifier 25 and the area of the transistor M2*a* in the regtifier 25' is 10% of the area of the transistor M2 in the regtifier 25; the area of the transistor M3 in the regtifier 25' is 90% of the area of the transistor M3 in the regtifier 25 and the area of the transistor M3*a* in the regtifier 25' is 10% of the area of the transistor M3 in the regtifier 25; and the area of the transistor M4 in the regtifier 25' is 90% of the area of the transistor M4 in the regtifier 25 and the area of the transistor M4*a* in the regtifier 25' is 10% of the area of the transistor M4 in the regtifier 25. Note that the relative sizes of the transistors M1-M4 described above may change, and that, for example, the transistors M1-M4 of the regtifier 25' may be 80% of the area of the transistors M1-M4 of the regtifier 25, while the transistors M1*a*-M4*a* of the regtifier 25' may be 20% of the area of the transistors M1-M4 of the regtifier 25.

Together with this, the control circuitry 24' is also modified, as shown in FIG. 15, to output the gate voltages G1*a*-G4*a* in addition to the gate voltages G1-G4.

With this modified regtifier 25', as can be seen in FIGS. 14 and 16, 16A, 16B during phase A, the gate voltages G1*a* and G2*a* are fully high for the entire phase, while the gate voltages G1 and G2 are fully high for a first portion of the phase and then fall low for the remainder of the phase. Similarly, during phase B, the gate voltages G3*a* and G4*a* are fully high for the entire phase, while the gate voltages G3 and G4 are fully high for a first portion of the phase and then fall low for the remainder of the phase. Using this technique helps avoid the inducing of noise that can result when a transistor that is fully on is turned off, since the transistors G1*a* and G2*a* remain on for the remainder of Phase A when the transistors G1 and G2 are turned off, and since the transistors G3*a* and G4*a* remain on for the remainder of Phase B when the transistors G3 and G4 are turned off.

A third way in which to operate the gates of the transistors from among M1-M4 to be regulated involves switching the gate voltages G1-G4 between first and second pre-determined constant drive voltages. As shown in FIG. 14 during phase A, the gate voltages G1 and G2 are fully high (the first constant drive voltage) for a first portion of the phase and then fall to the second constant drive voltage for the remainder of the phase. Similarly, during phase B, the gate voltages G3 and G4 are fully high (the first constant drive voltage) for a first portion of the phase and then fall to the second constant drive voltage for the remainder of the phase. The first portion of Phases A and B may be about 90% of the total elapsed time of those phases, while the second portion of Phases A and B may be the remainder of the total elapsed time of those phases.

It is to be noted that while the first way of operating the gates in FIG. 14 may induce noise that can result when a transistor is turned off, while the second way may lead to high current density in the small device (10%) during repeated lapses of time, the third way has the benefit of simplicity of the digital approach as it uses only two drive levels, but also allows minimization of the current density in the devices as would the analog method.

Note that the feedback loop formed by the amplifier 23 and the control circuitry 24 may be operated at a sufficient speed so that its duty cycle reacts on a cycle-to-cycle basis, enabling the control circuitry 24 to alter the generation of the gate voltages G1-G4 on a cycle to cycle basis when performing in-phase serial voltage regulation. This feedback technique can be observed in the graph of FIGS. 9, 9A, 9B where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, leading to a slow-moving duty cycle, allowing the gates of the transistors M1-M4 to be driven pseudo-statically.

C. Operation Using Anti-Phase Parallel Voltage Regulation

Operation of the wireless power transmission system 20 under an anti-phase parallel voltage regulation scheme controlled by the control circuitry 24 is now described.

Figure 6:
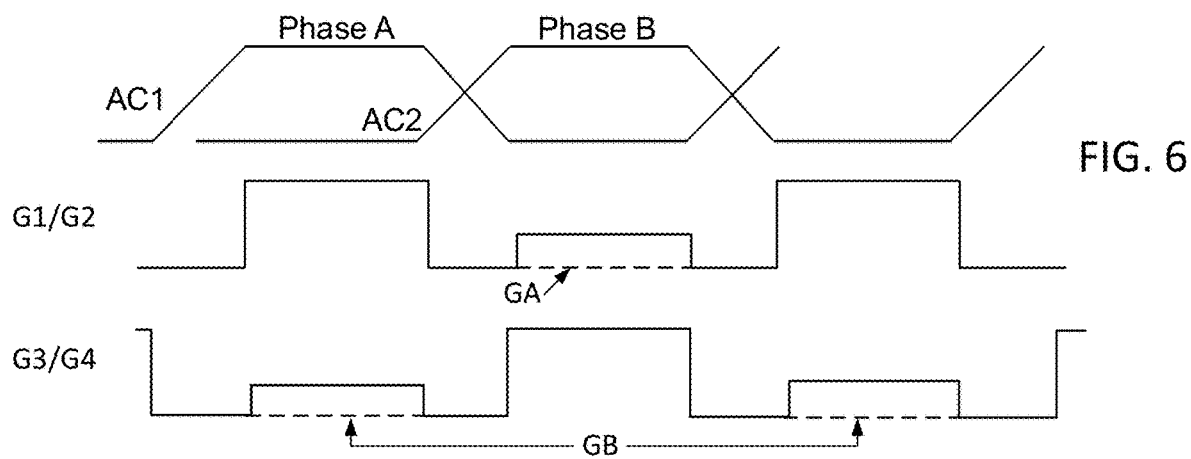
FIG. 6 is a timing diagram showing voltages of the wireless power transmission system of FIG. 2 in operation, when the feedback loop is controlling the bridge rectifier to perform anti-phase parallel voltage regulation.

Shown in the graph of FIG. 6 are waveform traces of the signals at the nodes Ac1 and Ac2. Notice that when the signal at Ac1 is high, it is labeled as Phase A, that when the signal at Ac2 is high, it is labeled as Phase B, and that the signals at Ac1 and Ac2 are 180° out of phase with one another.

During Phase A, the gate voltages G1 and G2 are driven, fully turning on transistors M1 and M2, while during Phase B, the gate voltages G3 and G4 are driven, instead fully turning on transistors M3 and M4. Conventionally, the transistors from among M1-M4 not turned on during a given phase are fully turned off.

However, with the anti-phase parallel voltage regulation scheme, when the incoming power delivered by the regtifier 25 to the load is greater than the amount of load consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 to turn on one or more of the two transistors M1 and M2, or M3 and M4 that would conventionally be off during the current phase and place those transistors in the saturation region of operation. The result is that these transistors M1 and M2, or M3 and M4 that are additionally turned on draw a moderate current but have a large drain to source voltage hence inducing sufficient power losses to consume the excess incoming power.

In greater detail, as shown in FIG. 6, in phase A, the gate voltages G1 and G2 are high to turn transistors M1 and M2 fully on and maintain those transistors fully on during phase A. However, here, the gate voltages G3 and G4 are also driven, albeit at a lesser voltage magnitude than the gate voltages G1 and G2, to thereby sufficiently turn on transistors M3 and M4 with a drain to source voltage and associated impedance sufficient to dissipate additional power over conventional operation. Similarly, in phase B, the gate voltages G3 and G4 are high to turn transistors M3 and M4 fully on and maintain those transistors fully on during Phase B. However, here, the gate voltages G1 and G2 are also driven, albeit at a lesser voltage magnitude than the gate voltages G3 and G4, to thereby sufficiently turn on transistors M1 and M2 with a drain to source voltage and associated impedance and drain to source current sufficient to dissipate additional power over conventional operation.

Figure 7:
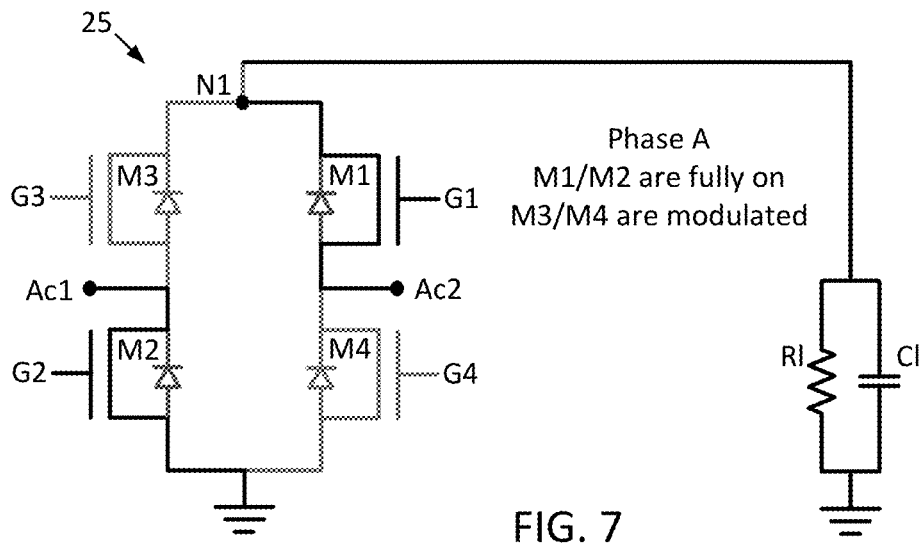
FIG. 7 is a schematic block diagram of the wireless power transmission system of FIG. 2 showing its operation during phase A of the anti-phase parallel voltage regulation of FIG. 6.
Figure 8:
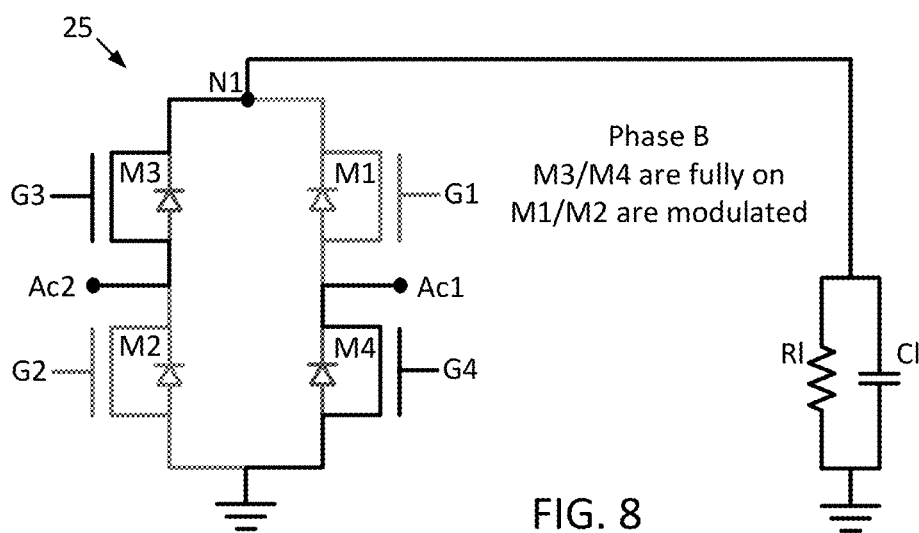
FIG. 8 is a schematic block diagram of the wireless power transmission system of FIG. 2 showing its operation during phase B of the anti-phase serial voltage regulation of FIG. 6.

This operating scheme is referred to as anti-phase parallel regulation because the transistors M1-M4 that are conventionally fully on during a given phase remain fully on while the transistors from among M1-M4 that are conventionally off during the given phase are turned on enough to dissipate the excess power not consumed by the load, and because, as shown in FIGS. 7-8, the power dissipation is achieved by increasing the conductivity of the elements and creating an additional current path in devices which are OFF in conventional operation and which are actually in parallel with the main current path while turned ON when operating using the described method.

Note that during Phase B, the gate voltages G1 and G2 need not both be modulated to turn on their respective transistors M1 and M2 in the linear mode of operation while the gate voltages G3 and G4 remain high to maintain their respective transistors M3 and M4 fully turned on, and instead only one of the gate voltages G1 or G2 can be modulated while the other gate voltage can remain off to keep its respective transistor M1 or M2 fully off.

Similarly, during Phase A the gate voltages G3 and G4 need not both be modulated while the gate voltages G1 and G2 remain high to maintain their respective transistors M1 and M2 fully turned on, and instead only one of the gate voltages G3 or G4 can be modulated while the other gate voltage can remain off to keep its respective transistor M3 or M4 fully off.

Figure 10B:
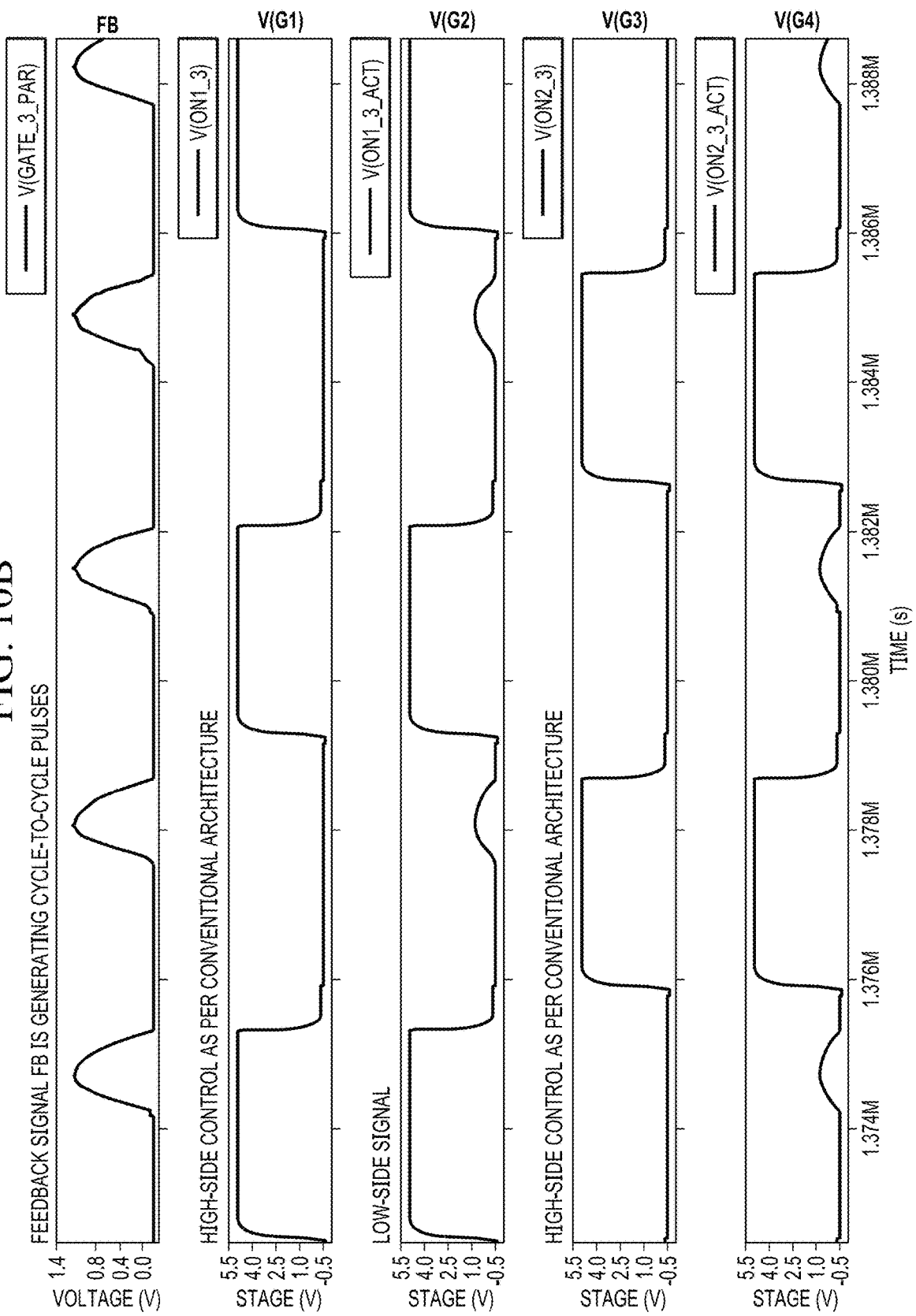

As an example of this form of operation where one transistor M1-M4 is modulated during the phase when it would conventionally be fully off, shown in FIGS. 10, 10A, 10B are additional waveforms of the wireless power transmission system 20 operating using anti-phase parallel regulation. Here, it can be seen that the feedback signal FB is generated during each phase, and that during Phase A, the gate voltages G1 and G2 are fully high to turn on the transistors M1 and M2, while the gate voltage G4 rises to about 1V to turn on the transistor M4 with a drain to source resistance sufficient to dissipate additional power over conventional operation. It can also be seen that during Phase B, the gate voltages G3 and G4 are fully high to turn on the transistors M3 and M4, while the gate voltage G2 rises to about 1V to turn on the transistor M2 with a drain to source resistance sufficient to dissipate additional power over conventional operation.

The anti-phase parallel voltage regulation scheme described above is particularly suited to use where the voltage output Vrect by the regtifier 25 is not relatively low and where the expected excess power to be dissipated is also not relatively low. Therefore, when operated using the anti-phase parallel voltage regulation scheme, the regtifier 25 is able to dissipate substantial excess power while maintaining the transistors of the regtifier 25 within their safe operating limits.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle to basis when performing anti-phase parallel voltage regulation. This feedback technique can be observed in the graph of FIGS. 10, 10A, 10B where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically.

D. Combination of In-Phase Serial and Anti-Phase Parallel Voltage Regulation Since the in-phase serial voltage regulation described above involves modulating the gate voltage of one or both of the transistors conventionally on during a given phase, and since the anti-phase parallel voltage regulation described above involves modulating the gate voltage of one or both of the transistors conventionally off during that given phase, it should be appreciated that these two techniques may be utilized simultaneously. Therefore, the gate voltage of one or two transistors of the regtifier 25 may be modulated according to the in-phase serial regulation scheme, while the gate voltage of one or two other transistors of the regtifier 25 may be modulated according to the anti-phase parallel regulation scheme, and while non-modulated transistors of the regtifier 25 are operated conventionally.

In addition, in some cases, the in-phase serial voltage regulation scheme and the anti-phase parallel voltage regulation scheme may be used separately. For example, the in-phase serial voltage regulation scheme may be used during one phase and the anti-phase parallel voltage regulation scheme may be used during the following phase.

As another example of the combination of the in-phase serial voltage regulation and the anti-phase parallel voltage regulation, the in-phase serial voltage regulation scheme may be used for a given number of phases (e.g., for one phase A and the successive phase B) and then the anti-phase parallel voltage regulation scheme may be used for a given number of phases (e.g., for the next phase A and the successive phase B).

As another example of the combination of the in-phase serial voltage regulation and the anti-phase parallel voltage regulation, the in-phase serial voltage regulation scheme may be used on one or both of the high side transistors (transistors M1 and M3) while the anti-phase parallel voltage regulation scheme may be used on one or both of the low side transistors (transistors M2 and M4), or vice versa.

As yet another example, which of the in-phase serial voltage regulation and the anti-phase parallel voltage regulation schemes is used may be switched depending upon the extra power to be dissipated. The gate voltages G1-G4 may be generated so as to operate the regtifier 25 using the in-phase serial voltage regulation scheme when the extra power to be dissipated is below a certain threshold, and the gate voltages G1-G4 may then switch to being generated so as to operate the regtifier 25 using the anti-phase serial voltage regulation scheme, when the extra power to be dissipated is above the threshold.

E. Control Signal Generation and Feedback Loop

Figure 19:
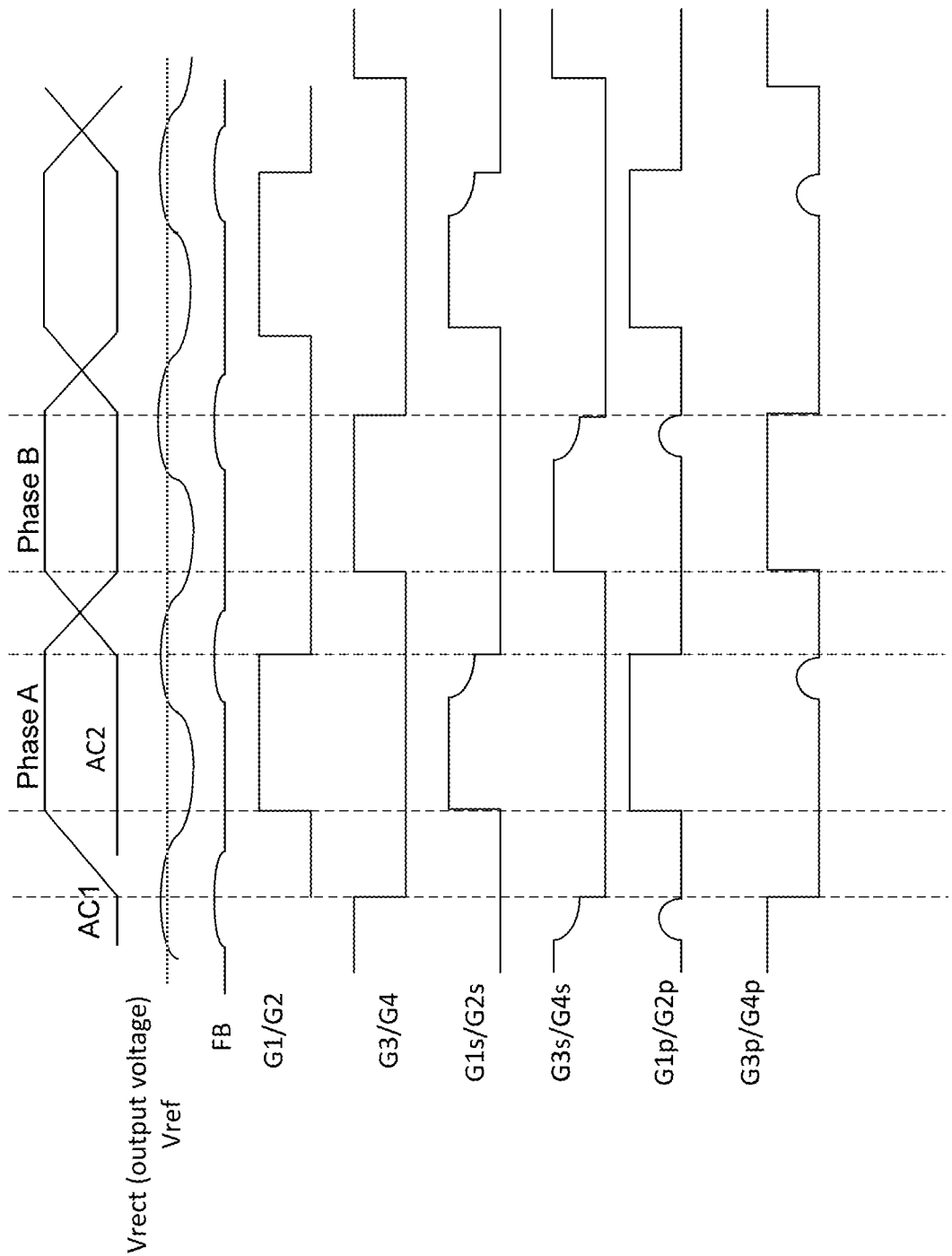
FIG. 19 is a timing diagram showing voltages of the wireless power transmission system of FIG. 2 in operation, when the feedback loop is controlling the bridge rectifier to perform in-phase serial voltage regulation as well as anti-phase parallel voltage regulation.

Now described with reference to FIGS. 17 and 19 is the control circuitry 24. First, the generation of the control signals GA and GB will be described, and thereafter, the generation of the gate voltages for the transistors M1-M4 from the gate voltages GA and GB will be described.

The control circuitry 24 includes a hysteretic comparator 51 having a non-inverting terminal coupled to node Ac1, an inverting terminal coupled to ground, and an output which produces GA.

The control circuitry 24 includes a hysteretic comparator 54 having a non-inverting terminal coupled to node Ac2, an inverting terminal coupled to ground, and an output which produces GB.

Figure 17A:
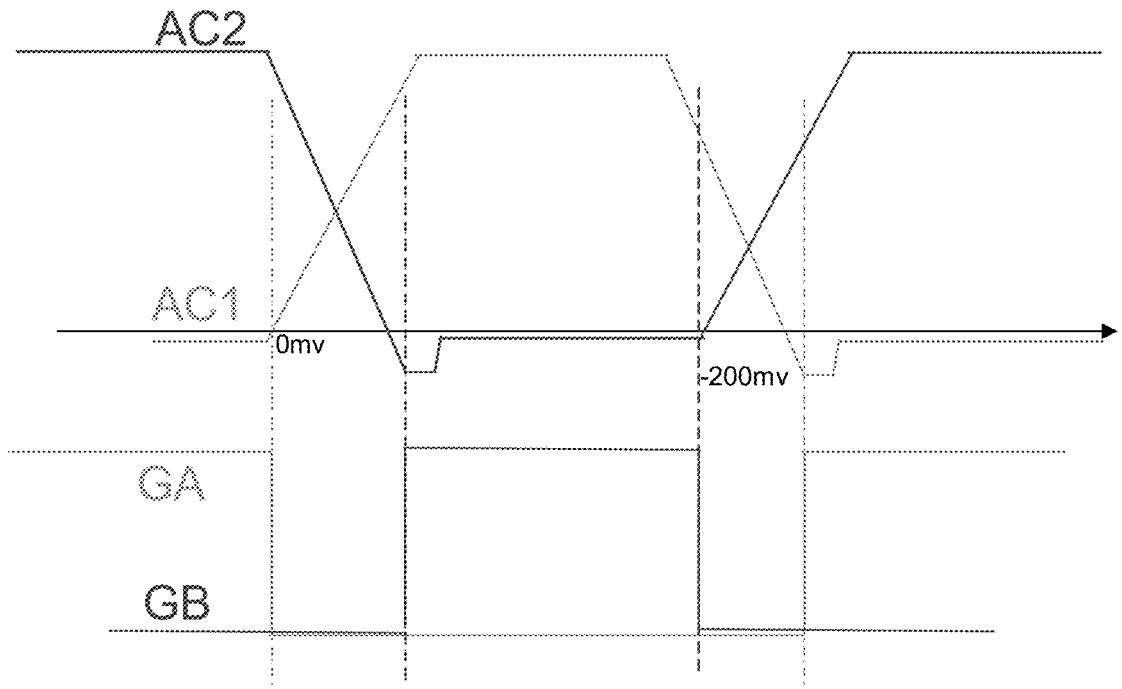
FIG. 17a is a timing diagram of the AC1 and AC2 signals and associated produced GA and GB signals within the controller of FIG. 2.
Figure 17B:
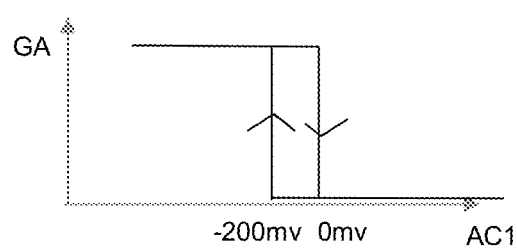
FIG. 17b is an output/input transfer function of a hysteretic comparator used within the controller of FIG. 2 for producing the GA and GB signals.
Figure 17C:
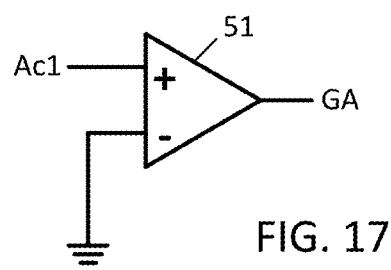
FIG. 17c is a schematic of a hysteretic comparator used for producing the GA signal.
Figure 17D:
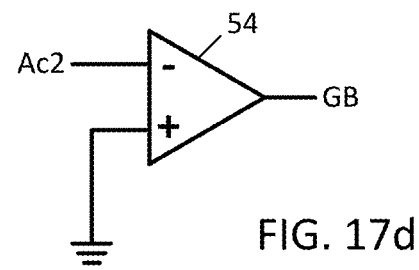
FIG. 17d is a schematic of a hysteretic comparator used for producing the GB signal.

Referring to FIG. 17a, the operation of the control circuitry 24 when generating the control voltages GA and GB is therefore that when the AC signal at node Ac1 rises to become greater than the first threshold (0 mV in this example) of the hysteretic comparator 51 (referring to FIG. 17c), the output GA of the comparator 51 is pulled low. Similarly, when the AC signal at node Ac2 falls (which occurs when the AC signal at node Ac1 rises) and is less than the second threshold (−200 mV in this example) of the hysteretic comparator 54 (referring to FIG. 17d), the output GB of the comparator 54 is pulled high.

Conversely, when the AC signal at node Ac1 falls and as a result is less than the second threshold of the hysteretic comparator 51, the output GA of the comparator 51 is pulled high. Similarly, when the AC signal at node Ac2 rises to become greater than first threshold of the hysteretic comparator 54, the output of the comparator 54 is pulled low.

Figure 18A:
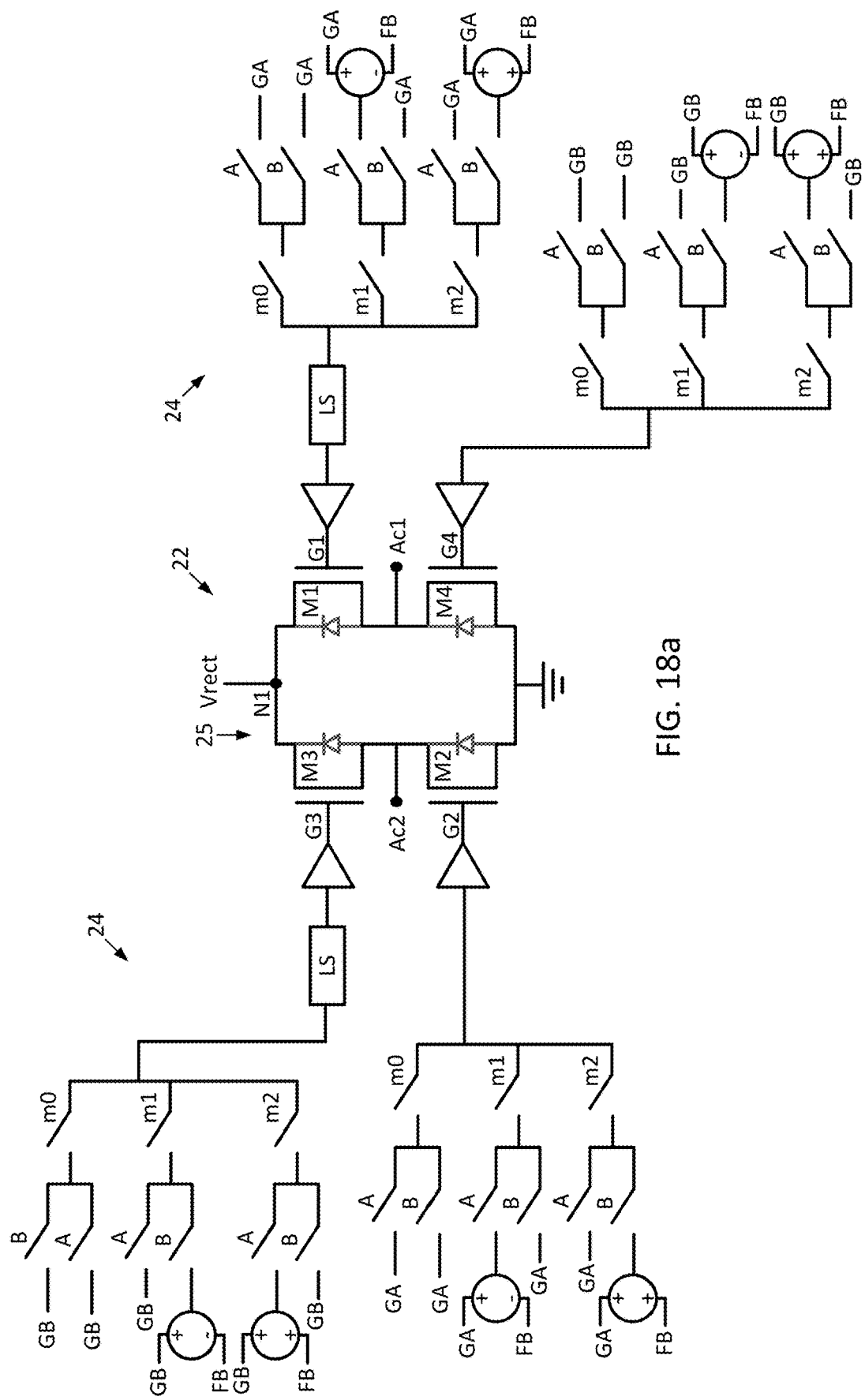
FIG. 18a is a schematic diagram illustrating mode selection circuitry within the controller of FIG. 2 for switching the regtifier of FIG. 2 between in-phase serial voltage regulation and anti-phase parallel voltage regulation.

Now referring to FIGS. 18a-19, the remainder of the control circuitry 24 is described for the cases where PWM control of the transistor gates are not used.

It is to be noted that as a general practice for low-side drive techniques, the signals for driving the gates of M2 and M4 are buffered. Also, it is to be noted that as a general practice for high-side drive techniques, the signals for driving the gates M1 and M3 are level shifted and buffered. For sake of simplification the following description will assume that GA, GB and any composite signal derived from GA, GB, FB are directly coupled to the gates, while in actual implementation buffer and level shifting technique are to be used consistently with the above mentioned techniques for low-side and high-side driving techniques.

When switches m0 are closed, indicating that the regtifier 25 is to operate as a standard rectifier, the control signal GA is coupled to the gates of transistors M1 and M2 as gate voltages G1 and G2 regardless of phase, and the control signal GB is coupled to the gates of transistors M3 and M4 as gate voltages G3 and G4 regardless of phase. Therefore, during phase A, the transistors M1 and M2 are fully turned on while the transistors M3 and M4 are fully turned off, and during phase B, the transistors M3 and M4 are fully turned on while the transistors M1 and M2 are fully turned off.

When switches m1 are closed, indicating that the regtifier 25 is to operate so as to perform in-phase serial voltage regulation, in phase A: the feedback voltage FB is subtracted from the control signal GA, and the result is coupled to the gate of the transistor M1 as gate voltage G1; the feedback voltage FB is subtracted from the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. In phase B: the feedback voltage FB is subtracted from the control signal GB, and the result is then coupled to the gate of the transistor M3 as gate voltage G3; the feedback voltage FB is subtracted from the control signal GB, and the result is then coupled to the gate of the transistor M4 as the gate voltage G4; the control signal GA is coupled to the gate of the transistor M1 as gate voltage G1; and the control signal GA is coupled to the gate of the transistor M2 as gate voltage G2. Therefore, during phase A, the transistors M3 and M4 are fully off, while the gate voltages of the transistors M1 and M2 are reduced by the feedback voltage FB to thereby increase the drain to source resistances of the transistors M1 and M2 sufficiently to dissipate excess power. Similarly, during phase B, the transistors M1 and M2 are fully off, while the gate voltages of the transistors M3 and M4 are reduced by the feedback voltage FB to thereby increase the drain to source resistances of the transistors M3 and M4 sufficiently to dissipate excess power.

When the switches m2 are closed, indicating that the regtifier 25 is to operate so as to perform anti-phase parallel voltage regulation, in phase A: the voltage FB is added to the control signal GB, and the result is then coupled to the gate of the transistor M3 as gate voltage G3; the voltage FB is added to the control signal GB, and the result is then coupled to the gate of the transistor M4 as gate voltage G4; the control signal GA is coupled to the gate of the transistor M1 as gate voltage G1; and the control signal GA is coupled to the gate of the transistor T2 as gate voltage G2. In phase B: the voltage FB is added to the control signal GA, and the result is coupled to the gate of the transistor M1 as gate voltage G1; the voltage FB is added to the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. Therefore, during phase A, the transistors M1 and M2 are fully on, while the gates of the transistors M3 and M4 are driven sufficiently cause dissipation of excess power by transistors M3 and M4 but not sufficiently to impede rectification. Similarly, during phase B, the transistors M3 and M4 are fully on, while the gates of the transistors M1 and M2 are driven sufficiently cause dissipation of excess power by transistors M1 and M2 but not sufficiently to impede rectification.

Figure 18B:
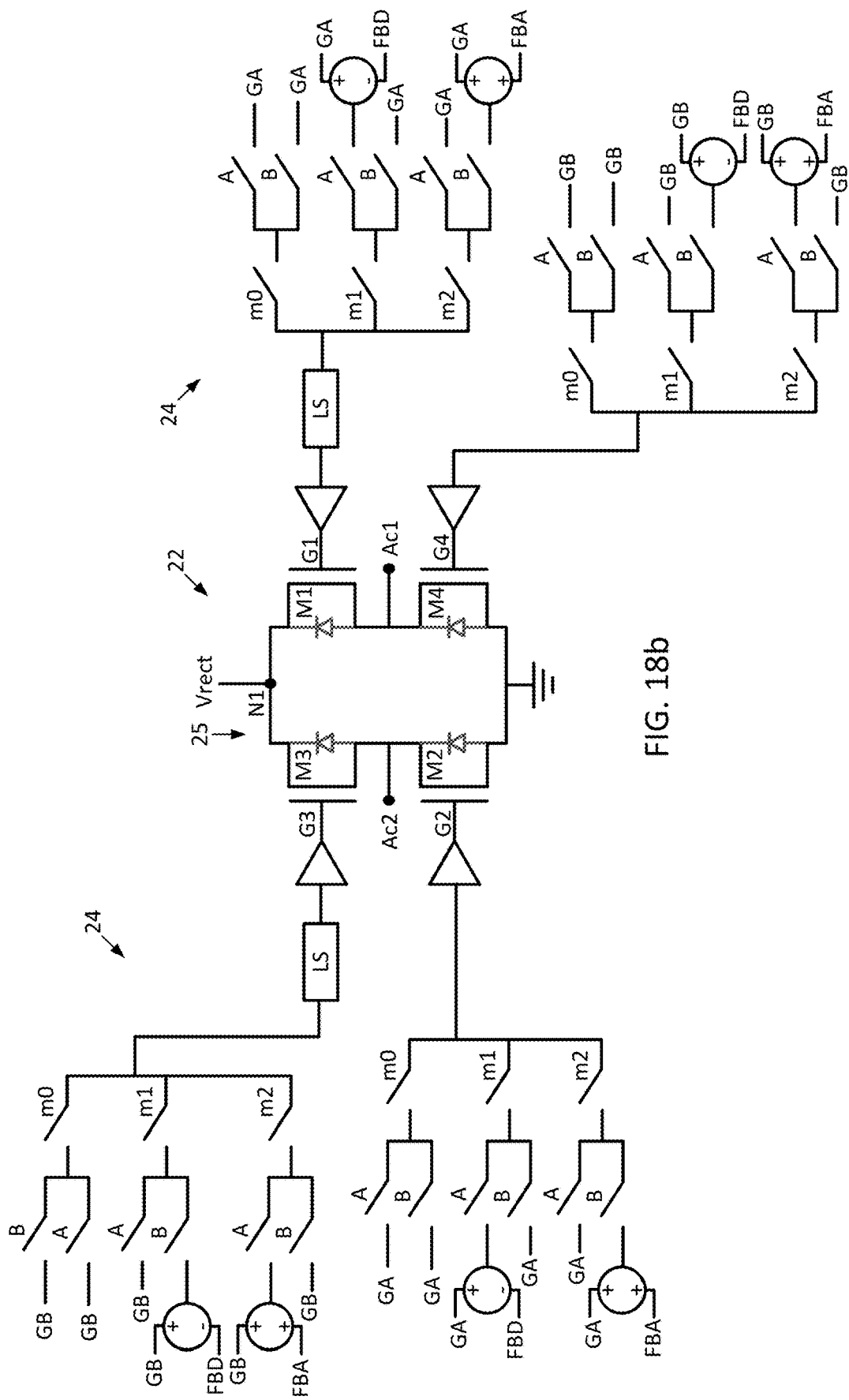
FIG. 18b is a schematic diagram illustrating mode selection circuitry within the controller of FIG. 2 for switching the regtifier of FIG. 2 between in-phase serial voltage regulation and anti-phase parallel voltage regulation and supporting PWM based in-phase serial voltage regulation.
Figure 18C:
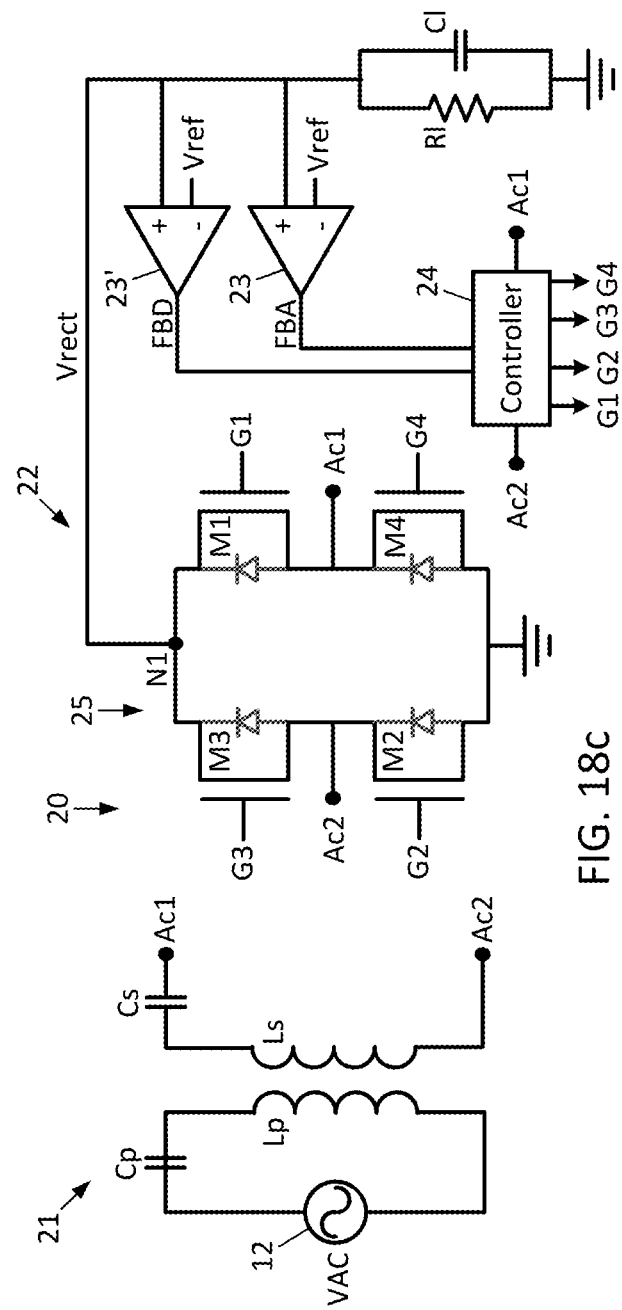
FIG. 18c is a schematic diagram illustrating the presence of an amplifier and a comparator as feedback loops.

Now referring to FIG. 18b and FIG. 18c, the remainder of the control circuitry 24 is described for the cases where PWM control of the transistor gates are used as per first and second ways of operating the gates in FIG. 14. The feedback signal FB as per FIG. 18a has been split in two, with FBA being the output of the feedback amplifier 23 named FB on FIG. 2) and FBD being the output of the digitized feedback provided by a comparator 23' and generating signal accordingly to timing diagrams as per FIG. 12. During operation FBD may take two levels, noted FBD_H and FBD_L. Assume now that the drive strength of GA, GB is VDD, the signal GA-FBD (resp. GB-FBD) will provide two levels VDD−VGH and VDD−VGL. Therefore, in the case where VGH=VDD and VGL=0 are used, the signal GA-FBD (resp. GB−FBD) will provide two levels of drive strength, 0 and VDD, so as to drive according to the first way of operating the gates on FIG. 14.

Now, in the case where VGH=VDD−V1 and VGH=0 are used, the signal GA-FBD (resp. GB−FBD) will provide two levels of drive strength, V1 and VDD so as to drive according to the third way of operating the gates on FIG. 14.

It is to be noted that when the regtifier 25' is in serial mode controlled by m1, or in parallel mode controlled by m2, and if the FB signals (resp. FBA and FBD) are gated to zero, the regtifier 25' behaves exactly similarly to the regtifier 25' in conventional mode controlled by m0, because GA+FBD, GB+FBD, GA-FBA, GB-FBA are equal to GA, GB when FBA and FBD are gated to zero, which may occur for example when Vrect is far below the target.

Those skilled in the art will appreciate from FIG. 15 how to generalize FIG. 18b for supporting the third way of operating the gates.

Hardware and techniques for automatically switching the regtifier 25' between in-phase serial voltage regulation using PWM and anti-phase parallel voltage regulation is now described.

Figure 20:
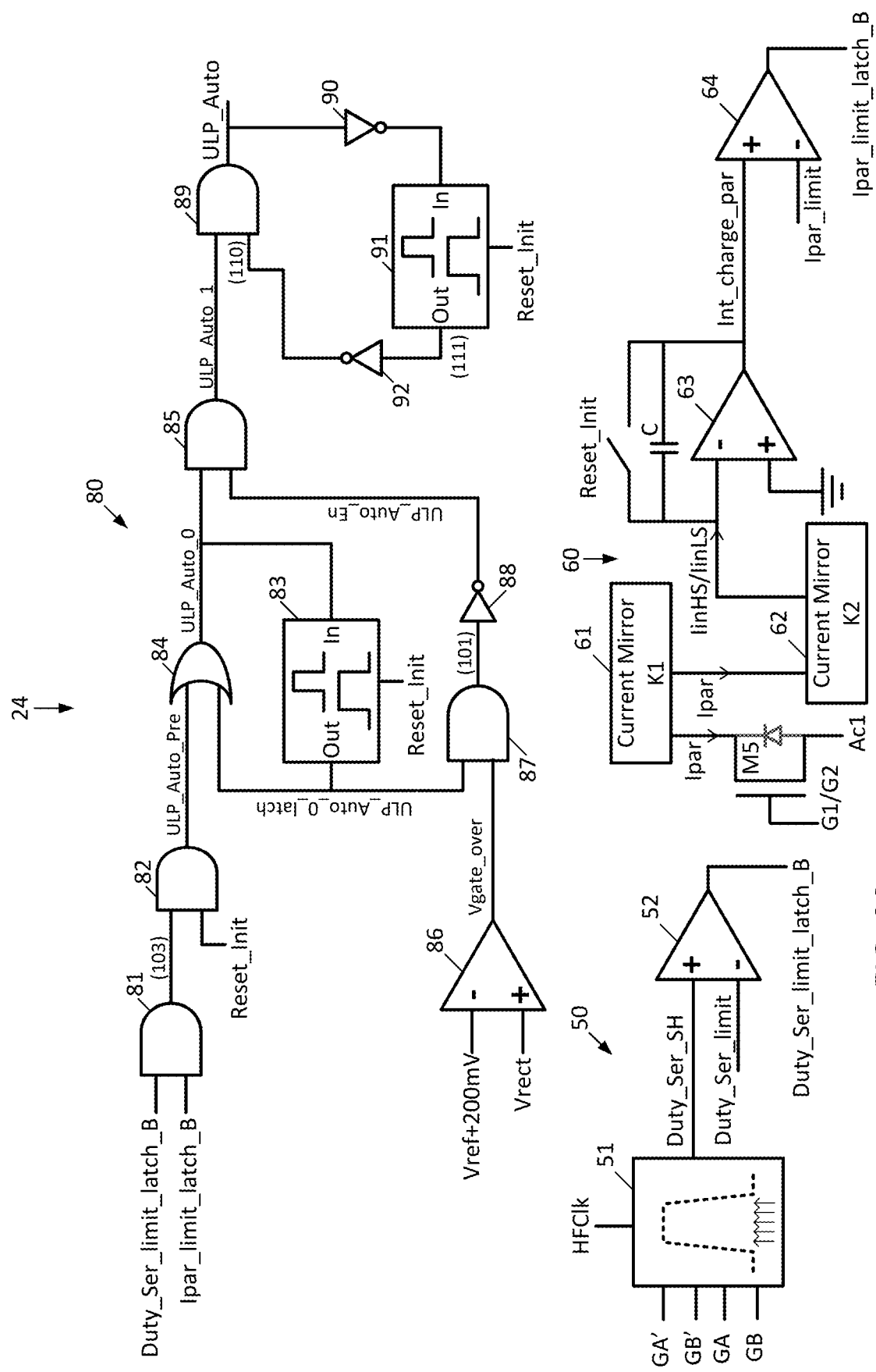
FIG. 20 is a block diagram showing components of the controller for performing on the fly mode switching between in-phase serial voltage regulation and anti-phase parallel voltage regulation.

Refer now to FIG. 20, illustrating the hardware included within the controller 24 for automatically switching the regtifier 25' between in-phase serial voltage regulation using PWM and anti-phase parallel voltage regulation. Serial monitoring circuit 50 includes a duty cycle determination circuit that utilizes counters to determine the duty cycle of control signals GA and GB (from which the gate voltages G1-G4 are determined) during performance of PWM in-phase serial voltage regulation, and therefore the duty cycle of the output of the regtifier 25', by counting a number of pulses of a high frequency counter clock HFClk within each pulse of the control signals GA and GB, by counting a number of pulses of the high frequency counter clock within each pulse of the control signals GA' and GB' (from which the gate voltages G1a-G4a are determined), and dividing the number of pulses of the high frequency clock HFClk within each pulse of control signals GA and GB by the number of pulses of the high frequency clock within each pulse of control signals GA' and GB'. The duty cycle will be referred to hereinafter as as Duty_Ser_SH; for example, if the duty cycle of the regtifier 25' is found to be 90%, then Duty_Ser_SH will be 90%. The serial monitoring circuit 50 also includes a digital comparator 52 that compares each occurrence of Duty_Ser_SH to an established duty cycle limit, Duty_Ser_limit, and latches then asserts the Duty_Ser_limit_latch_B signal when the current occurrence of Duty_Ser_SH is greater than Duty_Ser_limit. When the current occurrence of Duty_Ser_SH is less than the duty cycle limit Duty_Ser_limit, the digital comparator 52 deasserts the Duty_Ser_limit_latch_B signal. It is to be noted that Duty_Ser_limit_latch_B signal is always asserted high during anti-phase parallel mode.

The controller 24 also includes a parallel monitoring circuit 60 including an n-channel transistor M5 that is a replica of one of the transistors in the regtifier 25' (illustratively a replica of either G1 or G2) that receives the corresponding gate voltage G1 or G2 at its gate, has its source coupled to the node Ac1, and has its drain coupled to a first current mirror 61. The first current mirror 61 mirrors the current Ipar flowing through the replica transistor M5 during anti-phase parallel voltage regulation to a second current mirror 62, which in turn mirrors the current to the inverting terminal of amplifier 63 configured as an integrator as either IinHS (in the case where the transistor M5 is a replica of transistor M1 or M3) or IinLS (in the case where the transistor M5 is a replica of transistor M2 or M4). It is to be noted that the current mirror 61 can be advantageously supplied from the Vrect node, and that the power consumption by the current mirror is not critical as in any case it is contributing as part of the overall objective of consuming an excess of incoming power. As such it will be appreciated that the ratio K1 does not need to be very high and good matching performances of the mirror is doable. The inverting terminal of the integrator 63 is coupled to ground, and a capacitor C and reset switch are coupled in parallel between the inverting terminal and output of the integrator 63. The integrator 63 output is the Int_charge_par signal, which is compared to the limit current Ipar_limit by a latchable comparator 64, and the result latched by the comparator 64 and thereafter inverted by the inverter 65 to produce the Ipar_limit_latch_B signal. It is to be noted that the Ipar_limit_latch_B signal is by design always asserted high during in-phase serial mode as there is no current flowing in the anti-phase parallel regulation HW.

Mode switch control circuitry 80 includes an AND gate 81 that receives the Duty_Ser_limit_latch_B and Ipar_limit_latch_B signals, performs a logical AND operation, and produces the signal 103 as output. Given that Duty_Ser_limit_latch_B signal is always asserted high during anti-phase parallel mode and signal Ipar_limit_latch_B is by design also always asserted high during in-phase serial mode, the AND gate 81 does always have one of its two inputs which is at a logical one. The AND gate 81 is therefore the entry point of the automatic switching between the two modes.

An AND gate 82 receives the signal 104 and an initialization signal Reset_Init as input, performs a logical AND operation, and produces the ULP_Auto_Pre signal as output. An OR gate 84 receives the ULP_Auto_Pre signal from the AND gate 82 as input, and receives the ULP_Auto_0_latch signal from a non-retriggerable monostable 83 as input, performs a logical OR operation, and produces the ULP_Auto_0 signal as output. The monostable 83 receives the ULP_Auto_0 signal as input and produces the ULP_Auto_0_latch signal as output.

A comparator 86 receives the output voltage Vrect at its non-inverting terminal and the reference voltage Vref+200 mv at its inverting terminal, and produces the Vgate_over signal as output. An AND gate 87 receives the Vgate_over signal and the ULP_Auto_0 signal as input, performs a logical AND operation, and generates the signal 101 as output, which is in turn inverted by the inverter 88 to produce the ULP_Auto_En signal as output. An AND gate 85 receives the ULP_Auto_0 and ULP_Auto_En signals as input, performs a logical AND operation, and generates the ULP_Auto_1 signal as output. An AND gate 89 receives the ULP_Auto_1 signal from the AND gate 85 as input, as well as the signal 110, which is the output of an inverter gate 92 which receives its input from the output 111 of a non-retriggerable monostable 91. The AND gate 89 performs a logical AND operation to produce the ULP_Auto signal as output, which is inverted by the inverter 90 and passed to the input of the monostable 91.

The non-retriggerable monostables 83 and 91 receive the initialization signal Reset_Init, which is asserted when it is desired to reset the monostables 83 and 91 to be triggerable again one time.

As will be explained, when the ULP_Auto signal is a logical one, the controller 24 generates the gate voltages G1-G4 and G1a-G4a of the transistors M1-M4 and M1a-M4a to cause the regtifier 25' to perform in-phase serial voltage regulation, and when the ULP_Auto signal is a logical zero, the controller 24 generates the gate voltages G1-G4 and G1a-G4a of the transistors M1-M4 and M1a-M4a to cause the regtifier 25' to perform anti-phase parallel voltage regulation.

Figure 21:
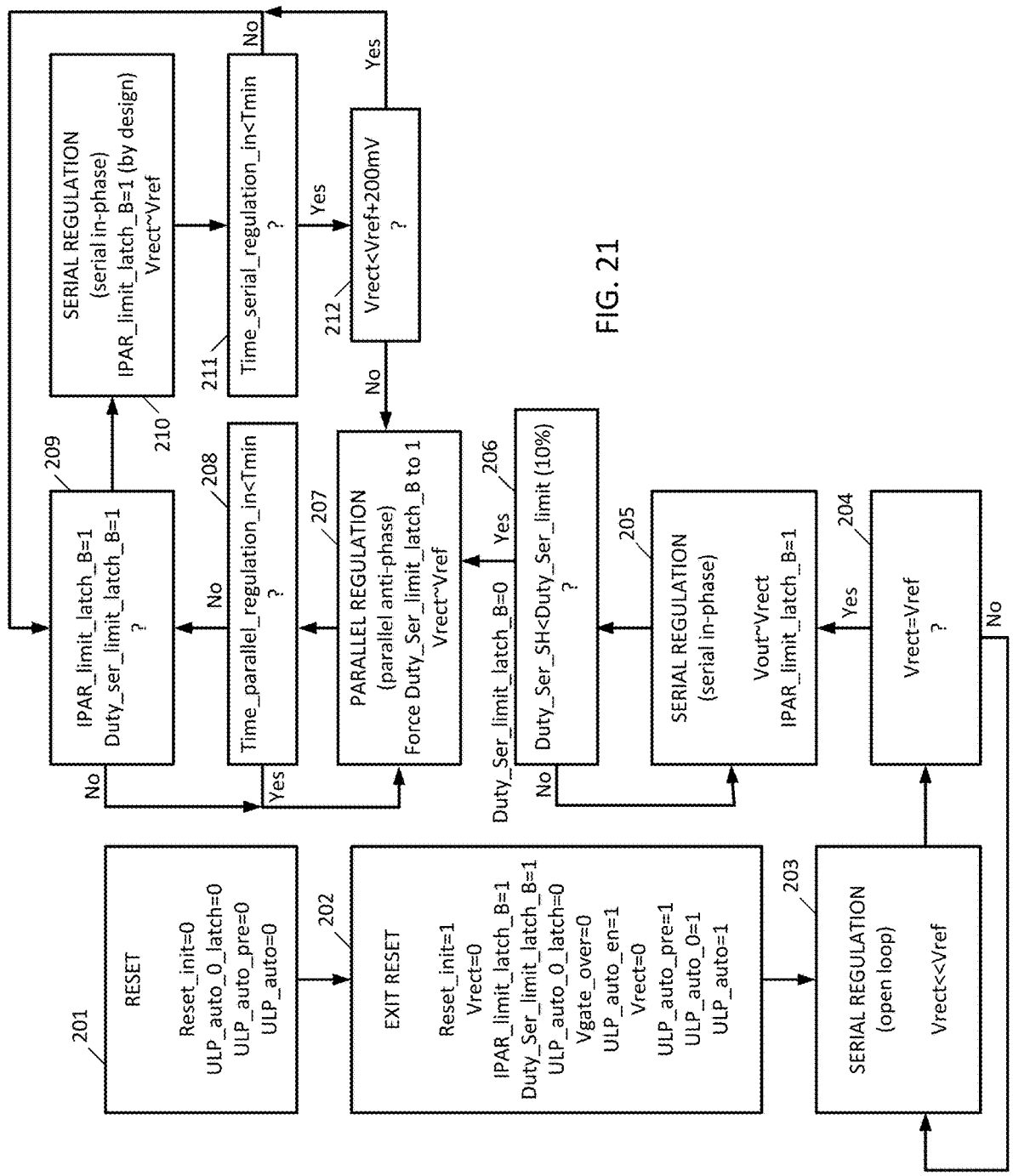
FIG. 21 is a flowchart of a method of operating the mode switching circuitry of FIG. 20 to switch the regtifier between performing in-phase serial voltage regulation and anti-phase parallel voltage regulation.
Figure 22B:
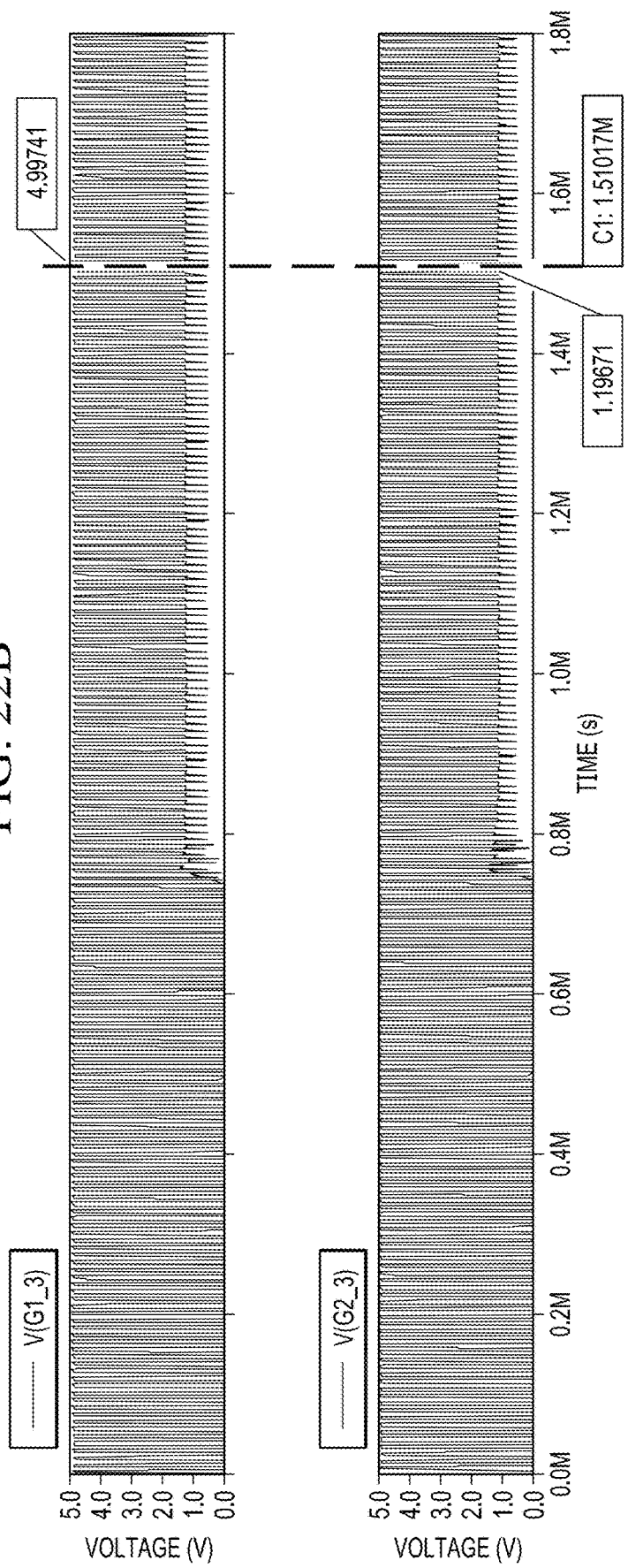
Figure 23:
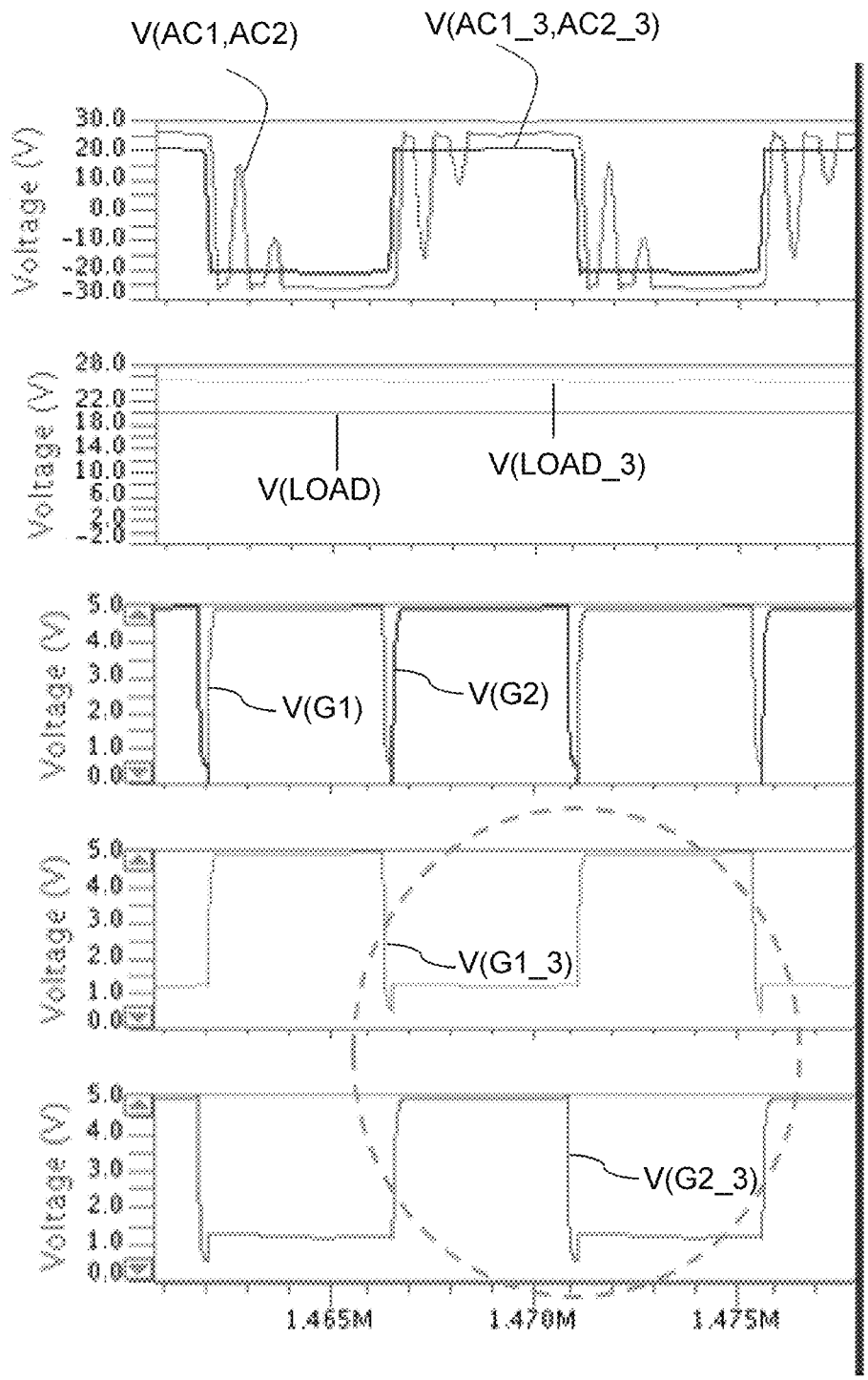
FIG. 23 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 24A:
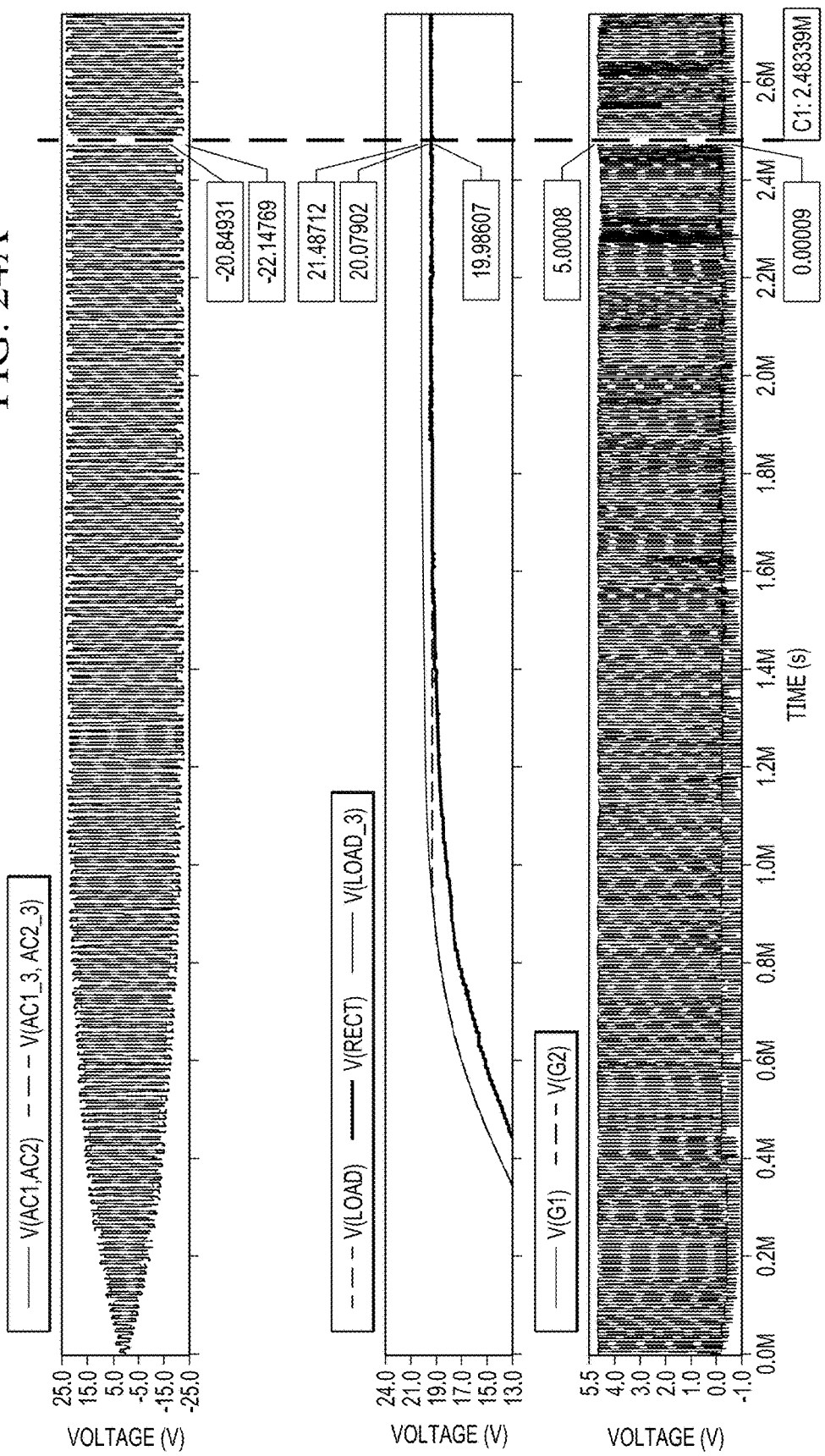
FIGS. 24A and 24B, is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.
Figure 24B:
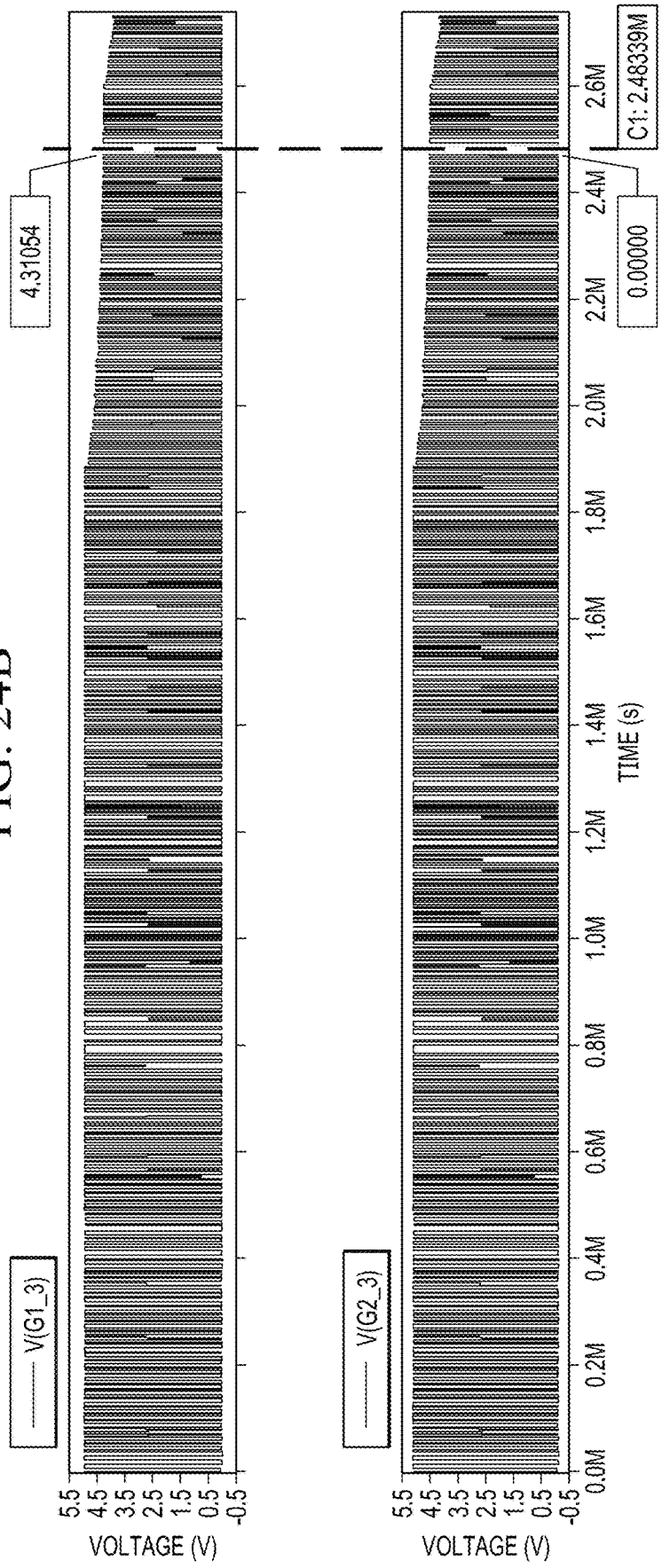
Figure 25:
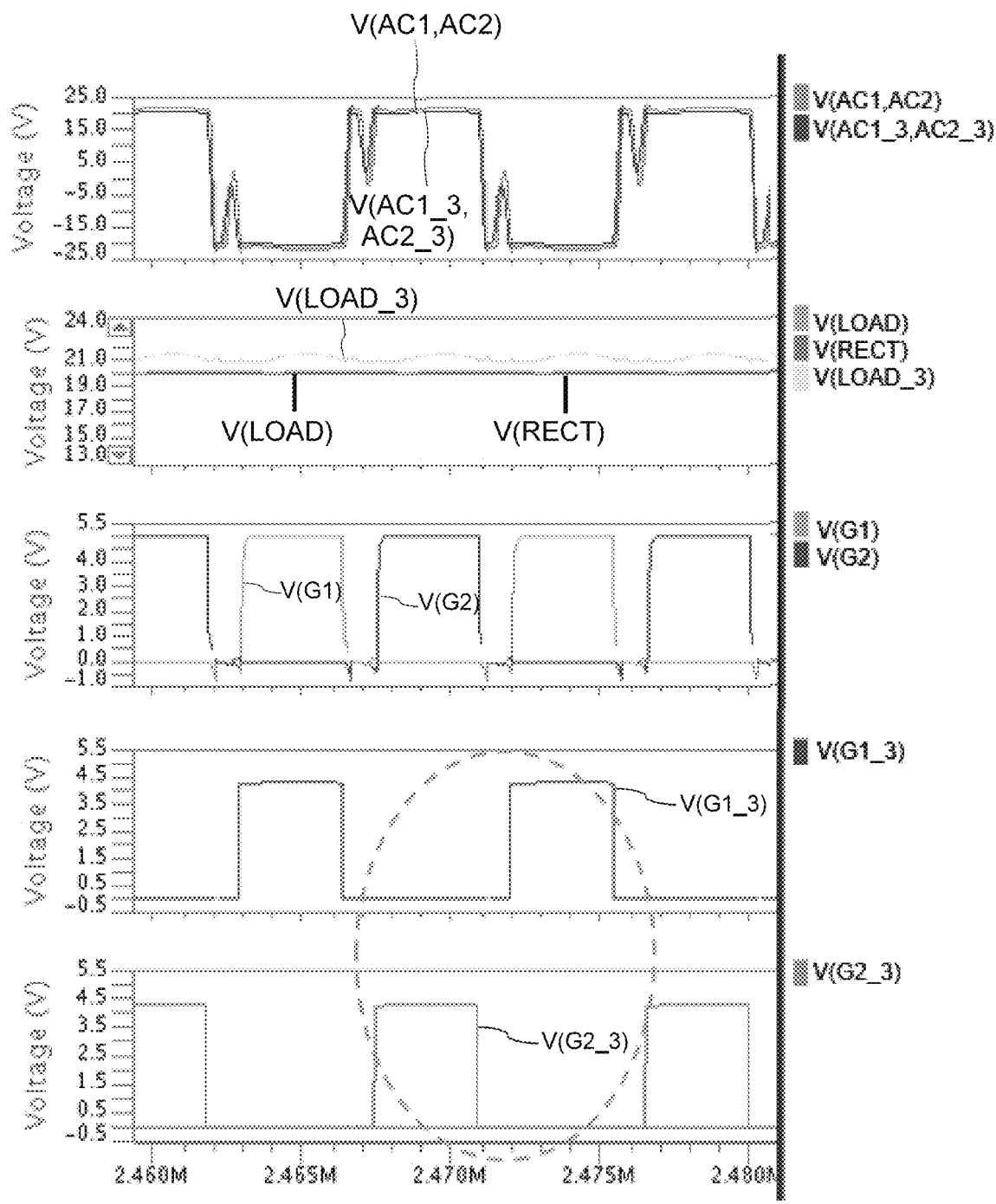
FIG. 25 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.

The operation of the mode switch control circuitry 80 will now be described with additional reference to FIG. 21.

At power-up and/or reset, the Reset_Init signal is set to a logical zero, resetting the monostables 83 and 91, as well as the integrator 63 (Block 201) by closing its switch. As a result, the AND gate 82 outputs the ULP_Auto_Pre signal as a logical zero and the monostable 83 outputs ULP_Auto_0_latch as a logical zero, resulting in the OR gate 84 outputting the ULP_Auto_0 signal as a logical zero. Since the ULP_Auto_0 signal is a logical zero, the AND gate 85 will output the ULP_Auto_1 signal as a logical zero, and in turn the AND gate 89 will output the ULP_Auto signal as a logical zero. It is to be noted that input 110 has no effect at this point, as ULP_Auto_1 is a logical 0. Input 110 would however hold ULP_Auto to logical 0 for a while, should ULP_Auto_1 have just transitioned from logical one to logical zero.

Next, to exit the reset, the Reset_Init signal is set to a logical one (Block 202). At this point in time, power transfer has not begun, and therefore the control signals GA, GB, GA', and GB' are zero. The result of the control signals GA, GB, GA', and GB' being zero is that the gate voltages G1-G4 and G1a-G4a are generated as being zero.

The result of G1-G4, G1a-G4b being zero is that the regtifier 25' is operating as a conventional 4 diodes rectifier in asynchronous mode, and the Vrect is free to rise under the effect of the incoming power, which in turn supplies the controller 24', which in turn generates the signals G1-G4, G1a-G4b.

At this point, and because the Vrect voltage is still low and below the target, the regtifier 25' is operating as conventional rectifier as highlighted previously, and as a first result the Duty_Ser_SH signal is high and the comparator 52 outputs Duty_Ser_limit_latch_B signal as a logical one.

As a second effect of the regtifier 25' operating as per conventional rectifier, the currents Ipar and IinHS/IinLS are zero, as no anti-phase conduction is occurring, with the result being that the amplifier 63 outputs the Int_charge_par signal as being zero. As a result of the Int_charge_par signal being zero, Ipar_limit is greater than Int_charge_par, and the comparator 64 will latch and output a logical zero, which is inverted by the inverter 65 to produce the Ipar_limit_latch_B signal at a logical one.

Since Duty_Ser_limit_latch_B and Ipar_limit_latch_B are both at a logical one, the signal 103 output by the AND gate 81 is a logical one, and since the Reset_Init signal is at a logical one, the ULP_Auto_Pre signal output by the AND gate 82 is a logical one. As a result of the ULP_Auto_Pre signal being a logical one, the ULP_auto_0 signal output by the OR gate 84 as a logical one, which in turn causes the ULP_Auto_0_latch signal to rise to a logical one, which in turn triggers the monostable 83, which in turn applies a logical one to the ULP_Auto_0_latch which remains at logical one during the duration of the monostable 83 pulse, which guarantees a logical one on ULP_Auto_0 during the duration of the pulse generated by the monostable 83. The system therefore has the capability to self-lock the ULP_Auto_0 logic to logical one during a minimum duration set by the monostable pulse duration, each time ULP_Auto_0 transitions from logical zero to logical one.

Since the output voltage Vrect will be lower than Vref, the reference voltage Vref+200 mV is larger than Vrect, resulting in the Vgate_over signal output by the comparator 86 being a logical zero, and in turn, the signal 101 output by the AND gate 87 being a logical zero and inverted by the inverter 88 to produce the ULP_Auto_En signal as being a logical one. In other words, the Vgate_over signal does not have any incidence during this phase. The relevance of the function will be explained further.

Note that since ULP_Auto was produced as a logical zero during reset, the inverter 90 outputs a logical one, causing the monostable 91 to produce a logical one at its output as signal 110. Since the ULP_Auto_0 is a logical one and since the ULP_Auto_En signal is a logical one, the ULP_Auto_1 signal output by the AND gate 85 is produced as being a logical one. Since the ULP_Auto_1 signal is a logical one and since the signal 110 is a logical one, the ULP_Auto signal at this point will be output by the AND gate 89 as a logical one.

The ULP_Auto signal being at a logical one causes the controller 23 to generate GA, GB, GA', and GB' so that on top of conventional operation of rectification of the currents induced in the secondary coil Ls, it performs in-phase serial regulation (Block 203). Initially, the output voltage Vrect will be substantially less than Vref and therefore the comparator 23 will not assert the feedback signal FB.

Operation continues in this open-loop fashion while the output voltage Vrect remains less than the reference voltage Vref (Block 204). As operation continues, the output voltage Vrect will rise. Once the output voltage Vrect becomes superior or equal to the reference voltage Vref (Block 204), the feedback signal FB is asserted by the comparator 23, and closed loop serial in-phase regulation begins (Block 205). At this point, the closed loop serial in-phase regulation using PWM continues, as described above in detail, and continues until the Duty_ser_limit_latch_B signal is pulled to a logic low (Block 206). This occurs when the duty cycle Duty_Ser_SH of the regtifier 25' falls below 10% (meaning that the Duty_Ser_SH signal falls below 10% to become lesser than Duty_Ser_limit, which is set at 10%, resulting in the comparator 52 outputting Duty_Ser_limit_latch_B as a logical zero.

Duty_ser_limit_latch_B being output as a logical zero in turn causes the signal 103 output by the AND gate 81 to become a logical zero, causing the ULP_Auto_Pre signal output by the AND gate 82 to become a logical zero, resulting in the OR gate 84 outputting the ULP_Auto_0 signal as a logical zero (because ULP_Auto_0 is a logical zero), in turn resulting in the ULP_Auto_1 signal being output by the AND gate 85 as a logical zero, and therefore the ULP_Auto signal being output by the AND gate 89 as a logical zero.

The ULP_Auto signal being output as a logical zero causes the controller 23 to generate GA, GB, GA', and GB' so as to rectify currents induced in the secondary coil Ls while performing anti-phase parallel regulation (Block 207).

It is to be noted that the transition of ULP_Auto from logical one to logical zero, after inversion by the inverter gate 90, does trigger the monostable 91, the output of which, once inverted by the inverter gate 92, secures a logical zero on input 110 and ensures that logical zero on AND gate 89 is maintained during the duration of the non-retriggerable monostable 91.

Therefore, until an elapsed time starting from the beginning of anti-phase parallel regulation becomes greater than a minimum time (Block 208), the anti-phase parallel regulation continues. If the elapsed time becomes greater than the minimum time (Block 208), but the IPAR_limit_latch_B and Duty_ser_limit_latch_B signals are not both a logical one, then ULP_Auto continues to be output as a logical zero, and anti-phase parallel regulation continues. However, if both the IPAR_limit_latch_B and Duty_ser_limit_latch_B signals become equal to a logical one (Block 209), then the controller 23 again generates GA, GB, GA', and GB' so as to rectify currents induced in the secondary coil Ls while performing in-phase serial regulation (Block 210).

The system remains in serial in-phase regulation until the elapsed time becomes greater than the minimum time (Block 211). Once this has occurred, the system continues checking if the IPAR_limit_latch_B and Duty_ser_limit_latch_B signals are both at a logical one, and if the two conditions are still true then it continues with in-phase serial regulation.

However, if the output exceeds the reference voltage plus a tolerance margin (set at 200 mV in the example Block 212) while the time has not yet elapsed, the signal 101 rises to logical one and ULP_Auto_En falls to zero and then the controller 23 returns to generating the control signals G1-G4 and G1a-G4a so as to cause the transistors M1-M4 and M1a-M4a of the regtifier 25' to perform anti-phase parallel regulation. The system therefore also has the capability of self-exiting the in-phase serial loop with the highest priority in the event that Vrect is too high, which helps guarantee that if the system entered the in-phase serial regulation for less than the elapsed time, but the incoming power is getting too high by coincidence, the system is yet able to exit the in-phase serial mode and enter the anti-phase parallel anti-phase mode.

This way, the regtifier 24' is switched between in-phase serial voltage regulation and anti-phase parallel voltage regulation on the fly, with the in-phase serial voltage regulation being used from powerup/reset and until the closed loop in-phase serial regulation has the regtifier 24' operating at less than a 10% duty cycle (indicated by the Duty_Ser_SH signal falling below the Duty_Ser_Limit signal), at which point anti-phase parallel voltage regulation is used. The continues until anti-phase parallel voltage regulation has been used for a given period of time as well as until the anti-phase parallel current falls below a current threshold (the duty cycle limit detection Duty_Ser_Limit_Lacth_B being asserted by default during parallel regulation), at which point serial regulation is returned to. Then, if serial regulation has not yet been used for a given period of time but the output voltage Vrect becomes greater than the reference voltage Vref+200 mv, parallel voltage regulation is returned to. Otherwise the serial regulation remains and loop until the duty cycle falls too low.

Therefore, in summary, in-phase serial voltage regulation is used until the duty cycle of the regtifier 25' fall below 10%, meaning that 90% of the power dissipation capability of the regtifier 25' is being utilized. At that point, anti-phase parallel voltage regulation is used for its additional power dissipation capabilities. Parallel voltage regulation has the capability to cease serial regulation in case the regulated voltage becomes too high during a given time window, and anti-phase voltage regulation is used until the current it draws fall below a defined limit. This advantageously allows for the proper voltage regulation scheme to be used given the current operation conditions.

F. Advantages

The in-phase serial voltage regulation and anti-phase parallel voltage regulation schemes offer a variety of advantages, including the significant area savings provided by eliminating a separate discrete voltage regulator (including a power transistor and a tank capacitor) such as a low dropout amplifier, as well as power savings when the wireless power transmission system 20 is operating at equilibrium. In addition, these schemes spread excess power consumption over four devices (transistors M1-M4), instead of all excess power consumption being absorbed by a single power transistor within an additional voltage regulator. Still further, these schemes permit easy utilization of the receiver 22 as a transmitter, since direct access to node N1 (at which the voltage Vrect is developed) is available.

Efficiency differences between a prior art wireless power transmission system and the wireless power transmission system 20 are illustrated in the table below:

| Value | Rectifier + Regulator | Regtifier |
|---|---|---|
| Vrect | 5.2 V | 4.99 V with 50 mV ripple |
| Power Delivered by TX | 5.84 W | 5.63 W |
| Power Received by RX | 5.43 W | 5.23 W |
| Power Deliverd to Load | 4.97 W | 4.97 W |
| Efficiency of Rectifier + Regulator | 91.57% | NA |
| Efficiency of Regtifier | NA | 95.11% |
| Power lost | 457 mW | 255 mW |
| System efficiency | 85.11% | 87.88% |

Among other advantages, note that the system efficiency increases by nearly 3%

Figure 11B:
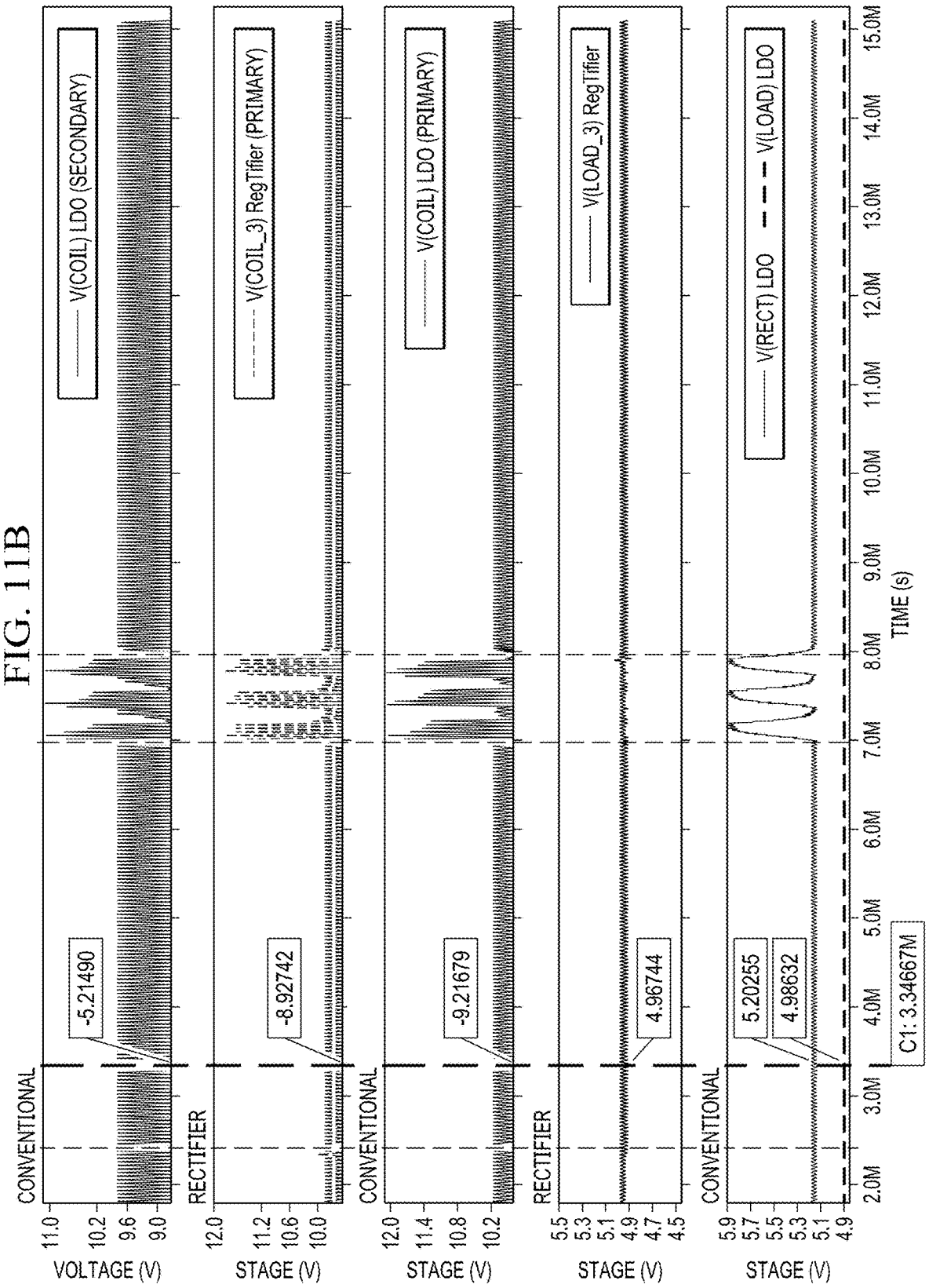

Another advantage provided is that when the operation of the wireless power transmission system 20 includes data communication together with power transfer, such as by using amplitude shift keying (ASK) when data transmission is from the receiver 22 to the transmitter 21, the data symbols (ASK symbols) received by the transmitter 21 are cleaner. This can be seen in FIGS. 11, 11A, 11B, where the signal received by the transmitter 21 (labeled as Vcoil LDO primary) using a prior art wireless power transmission system 20 contains decreasing amplitude peaks in its pulses, but where the signal received by the transmitter 21 (labeled as Vcoil_3 Regtifier) contains flat amplitude peaks in its pulses using the wireless data transmission system 20, which is easing the symbols extraction at primary side.

Also, when ASK data transmission is performed using a prior art power transmission system, the modulation depth changes depending upon the incoming power and the magnitude of the output voltage Vrect, since the drain to source resistance of the power transistor of a discrete voltage regulator will vary greatly depending upon the incoming power and the magnitude of the output voltage Vrect. However, when using the wireless data transmission system 20 described herein, the drain to source resistance of the four transistors M1-M4 of the regtifier varies far less than that of the single power transistor of a discrete voltage regulator, maintaining the modulation depth at a generally constant level.

G. Description of Further Embodiment Utilizing Current and Voltage Feedback

Figure 26:
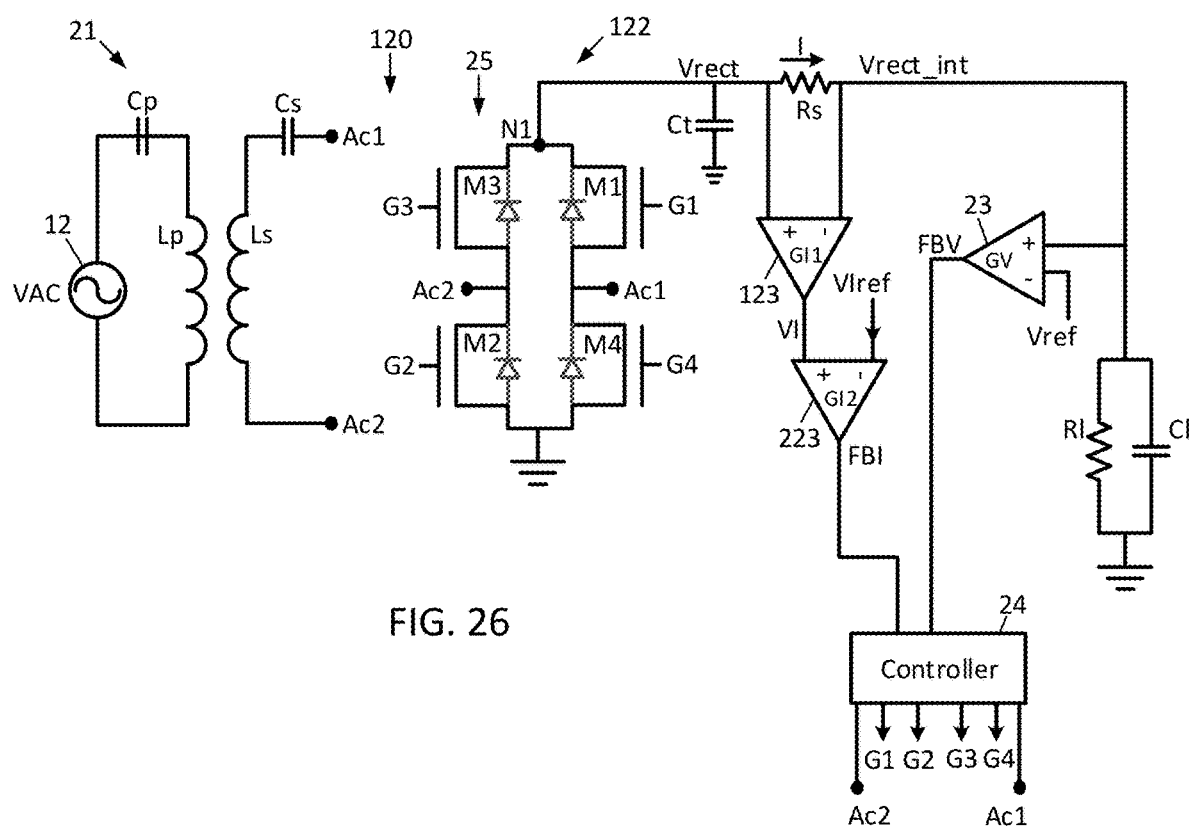
FIG. 26 is a schematic block diagram of a wireless power transmission system disclosed herein in which the bridge rectifier performs a regulation function based upon both voltage and current monitoring, enabling the lack of an additional voltage regulation circuit.

Now described with reference to FIG. 26 is a wireless power transmission system 120 similar to that of FIG. 2, but where feedback is provided based upon both the rectified output voltage Vrect and an output current I.

The wireless power transmission system 120 includes a transmitter 21 and a receiver 122. The transmitter 21 is comprised of an AC voltage source 12 coupled to a serial resonant transmitter coil Lp and capacitance Cp. The receiver 122 includes a serial resonant receiver coil Ls and capacitance Cs coupled between nodes Ac1 and Ac2, and a "regtifier" 25 (a bridge rectifier also capable of voltage regulation when controlled using techniques described herein) formed by transistors M1-M4 coupled between node N1 and ground.

The regtifier is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An optional tank capacitor Ct is coupled between node N1 and ground, and a rectified output voltage Vrect is formed across the tank capacitor Ct. A sense resistor Rs is connected between node N1 and a load represented by resistor R1 and capacitor C1, and an intermediate rectified output voltage Vrect_int is formed across the load.

An amplifier 23 with a gain of GV has an inverting input terminal coupled to receive a reference voltage Vref (which is set to be equal to a desired voltage target at node N1, taking note that the voltage drop across the sense resistor Rs is negligible), a non-inverting input terminal coupled to node N1 through the negligible sense resistor Rs, and an output coupled to control circuitry 24 and generating a voltage feedback signal FBV.

An amplifier 123 with a gain of GI1 has a non-inverting input terminal coupled to a first terminal of the sense resistor Rs (said first terminal being connected to node N1), an inverting input terminal coupled to a second terminal of the sense resistor Rs (said second terminal being connected to the load), and an output. An amplifier 223 with a gain of GI2 has a non-inverting input terminal coupled to receive the output of the amplifier 123 and an inverting input coupled to receive a voltage VIref representative of a reference current Iref, the amplifier 223 generating a current feedback signal FBI.

The control circuitry 24 receives input from the voltage feedback signal FBV and current feedback signal FBI, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitably modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit. To that end, the amplifier 23 and the control circuitry 24 form a voltage feedback loop, and the amplifiers 123/223 and control circuitry 24 form a current feedback loop, with both loops being used to control the power delivered to the load.

As explained above in great detail in Section B of this disclosure, such feedback may be used by the control circuitry 24 to cause the regtifier 25 to both rectify the AC current and dissipate excess power to produce a regulated output voltage Vrect by reducing the driving of turned-on in-phase transistors M1/M2 or M3/M4 (M1/M2 being turned on is one phase and M3/M4 being turned on is the other phase). As also explained above in great detail in Section C of this disclosure, such feedback may be used by the control circuitry 24 to cause the regtifier 25 to both rectify the AC current and dissipate excess power to produce a regulated output voltage Vrect by lightly driving anti-phase transistors M1/M2 or M3/M4 (M1/M2 being lightly turned on when transistors M3/M4 are fully turned on and performing rectification, or M3/M4 being lightly turned on when transistors M1/M2 are fully turned on and performing rectification). And, as explained above in great detail in section D of this disclosure, such feedback may be used by the control circuitry 24 to cause the regtifier 25 to both rectify the AC current and dissipate excess power to produce a regulated output voltage Vrect by performing both in-phase regulation and anti-phase regulation at the same time.

In the below description, one will assume first that the two loops do operate independently, and the operating mode of each loop will be described.

When the incoming current from nodes Ac1/Ac2 is too high, the regulated output voltage Vrect rises (and therefore Vrect_int rises), with the result being that this voltage becomes greater than the reference voltage Vref, and therefore the voltage feedback signal FBV produced by the amplifier 23 increases, which is in turn read by the controller 24 and used to modify generation of the control signals G1-G4 according to the desired control scheme (in-phase regulation, anti-phase regulation, or both in-phase regulation and anti-phase regulation) so as to reduce the regulated output voltage Vrect to the desired level (e.g., to be equal to Vref). The voltage FBV can be calculated as:

$$FBV = GV \times (Vrect - Vref)$$

When the outgoing current from the bridge formed by transistors M1-M4 (the current I through the sense resistor Rs) is too high, the voltage difference of Vrect-Vrect_int across the sense resistor Rs increases, with the result being that the output voltage of the amplifier 223 rises to become more than the voltage VIref (which represents a reference current Iref), and therefore the current feedback signal FBI produced by the amplifier 223 increases, which is read by the controller 24 and used to modify generation of the control signals G1-G4 according to the desired control scheme (in-phase regulation, anti-phase regulation, or both in-phase regulation and anti-phase regulation) so as to consume power and induce an associated reduction of the output voltage Vrect to a lower level, hence reducing the output current until it reaches the desired level (e.g., to be equal to VIref). The voltage FBI can be calculated as:

$$FBI = GI2 \times (VI - VIref)$$

As mentioned previously the two loops were assumed not to interfere, but as one may foresee, it is a conditional assumption.

Figure 27:
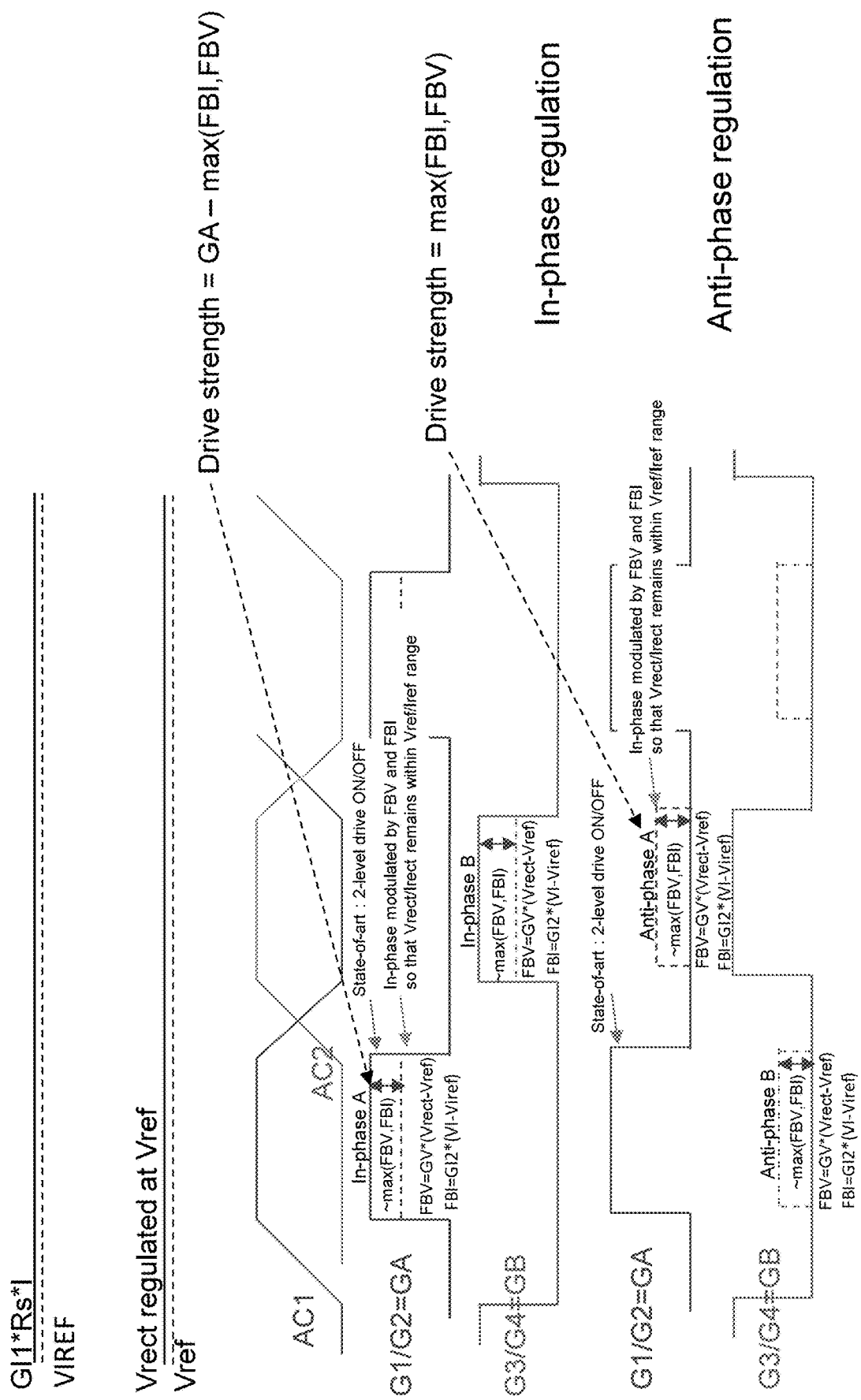
FIG. 27 is a timing diagram showing voltages of the wireless power transmission system of FIG. 26 in operation, when both voltage feedback loop and current feedback loop are simultaneously and concurrently controlling the bridge rectifier to perform in-phase regulation based upon voltage and current feedback, as well as when both voltage feedback loop and current feedback loop are simultaneously and concurrently controlling the bridge rectifier to perform anti-phase regulation based upon voltage and current feedback.

The interplay between the voltage feedback (feedback loop formed by amplifier 23 and control circuitry 24) and the current feedback (feedback loop formed by amplifiers 123/223 and control circuitry 24) will be described in detail with additional reference to FIG. 27.

In the waveforms illustrated for performing in-phase regulation, instead of the first phase drive signal GA (drive signals G1/G2) being equal to what GA would be in the absence of regulation, the first phase drive signal GA is reduced by whichever of the feedback signals FBI or FBV is greater, and instead of the second phase drive signal GB (drive signals for G3/G4) being equal to what GB would be in the absence of regulation, the second phase drive signal GB is reduced by whichever of the feedback signals FBI or FBV is greater.

In the waveforms illustrated for performing anti-phase regulation, the first anti-phase drive signal GA (drive signals G1/G2 when transistors M3/M4 are on and performing rectification) is equal to whichever of the feedback signals FBI or FBV is greater, and the second anti-phase drive signal GB (drive signals G3/G4 when transistors M1/M2 are on and performing rectification) is equal to whichever of the feedback signals FBI or FBV is greater.

The voltage VIref representing the reference current Iref is set to be a threshold amount higher than a voltage representing an expected nominal current I (for example, 10% greater than the expected nominal current I) through the sense resistor Rs. Therefore, regulation performed based upon the feedback signal FBV via the feedback loop formed by the amplifier 23 and the controller 24 is used for steady state operation, with regulation or limitation performed based upon the feedback signal FBI via the feedback loop formed by the amplifiers 123/223 and the controller 24 being used to control transients, and act as a safety measure and help avoid the situation where the load current exceeds values which could be detrimental in a particular application.

Figure 28:
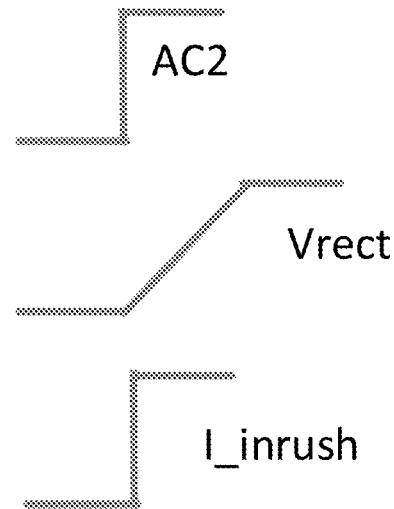
FIG. 28 is a graph showing the sharp rise in inrush current in the regtifier of FIG. 28 at startup despite the fact that the rectified output voltage has not yet reached its steady state level.
Figure 29:
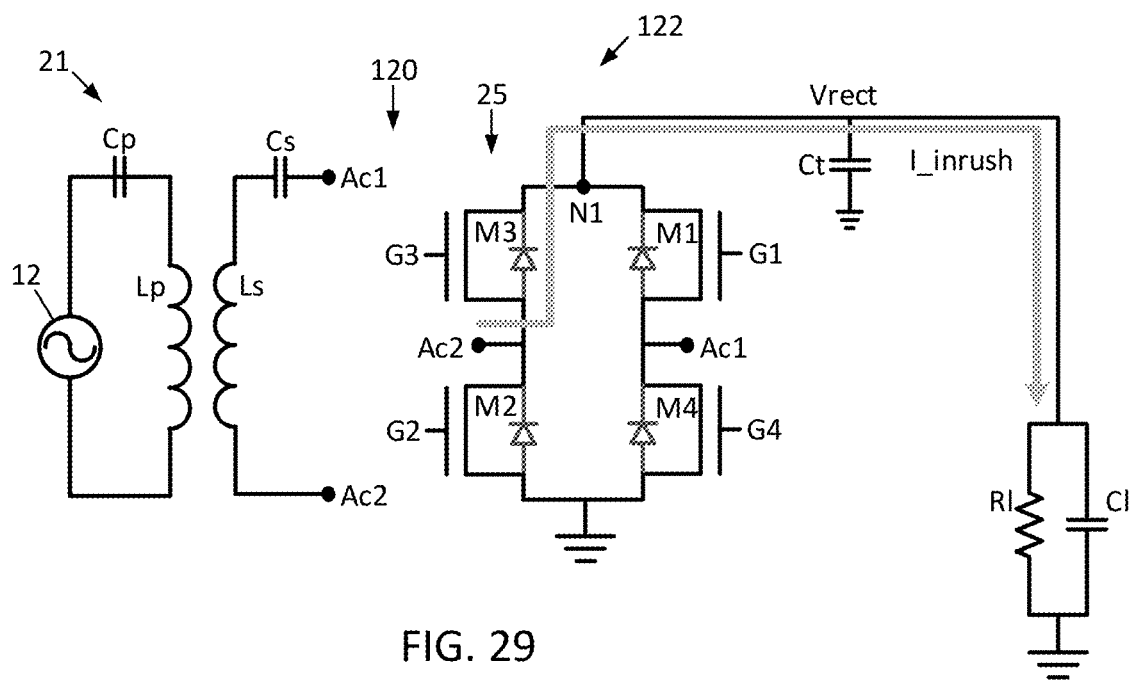
FIG. 29 is a schematic diagram of the transmitter and regtifier of FIG. 26 during startup, illustrating the path the inrush current takes.

It is useful for the wireless power transmission system 120 to be capable of regulation based upon both FBV and FBI, not only to control transients, but also at startup. As can be observed in the graph of FIG. 28, during startup (before steady state operation is reached), the inrush current I_inrush can rise to a high level even though the regulated output voltage Vrect is still below the threshold voltage Vth. Shown in FIG. 29 is the regtifier 25, and the path of the resulting inrush current I_inrush during startup.

Figure 30:
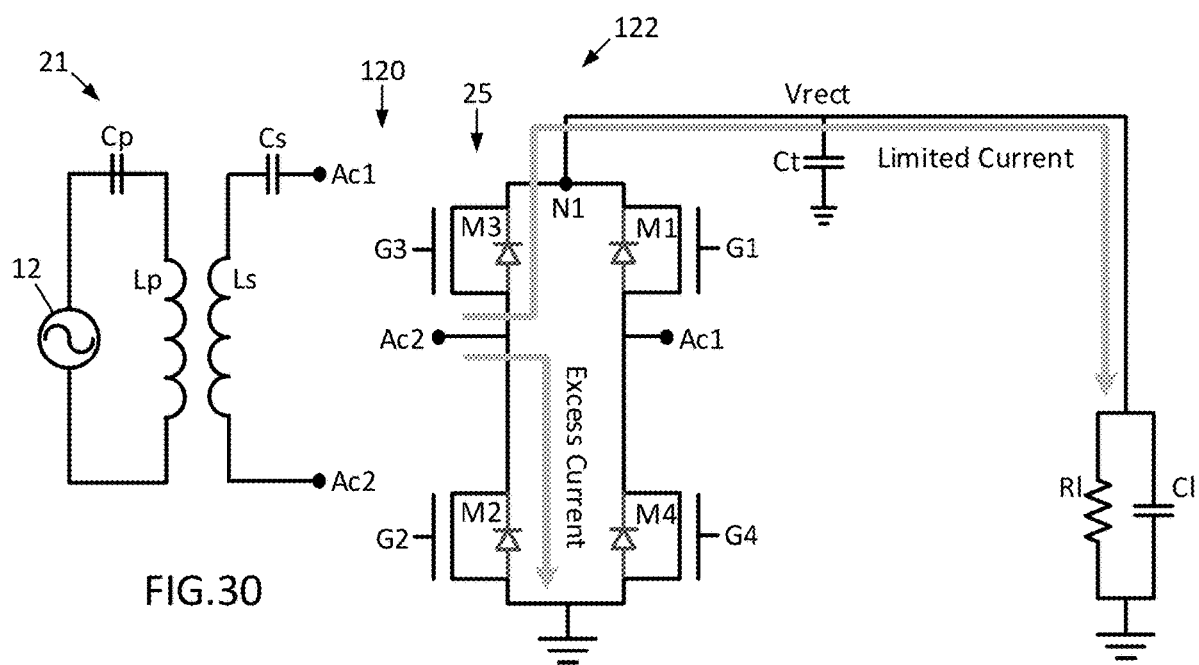
FIG. 30 is a schematic diagram of the transmitter and regtifier of FIG. 26 during startup, illustrating the control of the inrush current using anti-phase regulation based upon current feedback.

To prevent damage or issues arising from this high inrush current I_inrush, the regulation based upon the feedback signal FBI via the feedback loop formed by the amplifiers 123/223 and the controller 24 is used. The in-phase regulation mode would be unable to limit the inrush current I_inrush, as the body diode of the transistor M1/M3 would conduct the inrush current I_inrush even if the regulation were to turn off the transistor M1/M3. However, as can be observed in the regtifier 25 of FIG. 30, the excess inrush current can be limited using the anti-phase regulation. As shown, excess inrush current is shunted to ground through the anti-phase transistors (here, by control signals G2/G4 being set to the maximum of FBI or FBV, which in this case is the feedback signal FBI, when the transistors M1/M3 are the in-phase transistors on performing rectification). Once steady state operation is reached, regulation based upon the voltage feedback signal FBV may then be used in either in-phase or anti-phase mode, with regulation based upon FBI being used to control transients.

Figure 31:
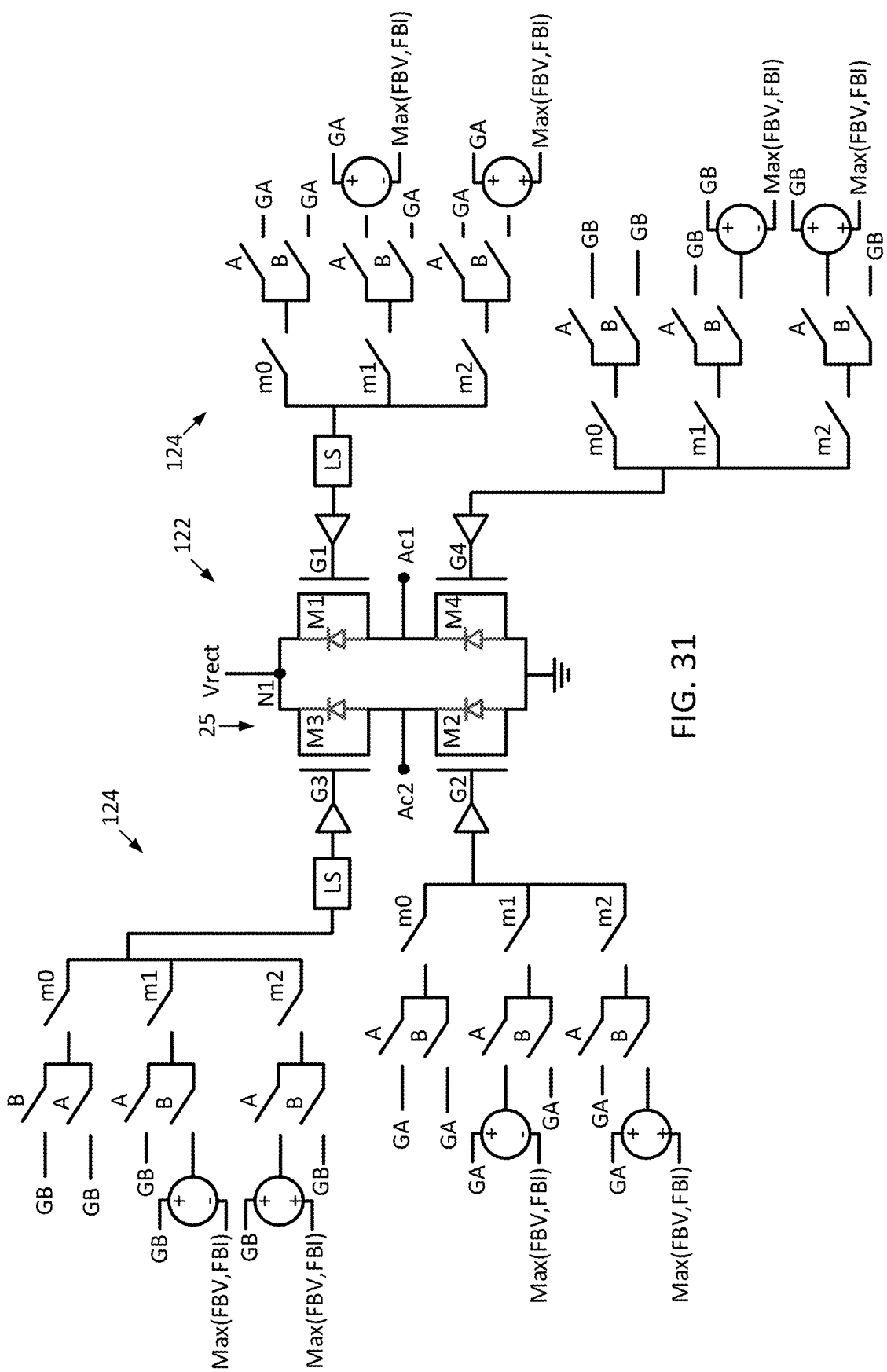
FIG. 31 is a schematic diagram illustrating mode selection circuitry within the controller of FIG. 26 for switching the regtifier of FIG. 26 between in-phase regulation and anti-phase regulation.

As explained, it is desired to start operation using anti-phase regulation based upon the current feedback signal FBI. Shown in FIG. 31 is a schematic diagram illustrating mode selection circuitry within the controller 24 of FIG. 26 for switching the regtifier 25 between in-phase regulation and anti-phase regulation, enabling a system that utilizes anti-phase regulation based upon the current feedback signal FBI during startup, and that utilizes in-phase regulation based upon the voltage feedback signal FBV during steady state operation, with either in-phase regulation or anti-phase regulation based upon the voltage feedback FBV or current feedback signal FBI being utilized to control transients that occur. This circuit shown in FIG. 31, and its operation, is analogous to that of FIG. 18*a* described above, except that the feedback signal FB is replaced with whichever of the feedback signals FBI or FBV is greater, and that the anti-phase mode is selected during startup.

H. Further Embodiment Utilizing Current and Voltage Feedback After Power Conversion Consider the case where the load is a battery of a portable electronic device. In such a situation, the battery requires a substantially lower voltage than that of the rectified output voltage Vrect for charging, and such voltage is to be precisely delivered. For example, the battery may require 4.5V for charging, but the voltage produced by rectification (without regulation) is 18V.

Figure 32:
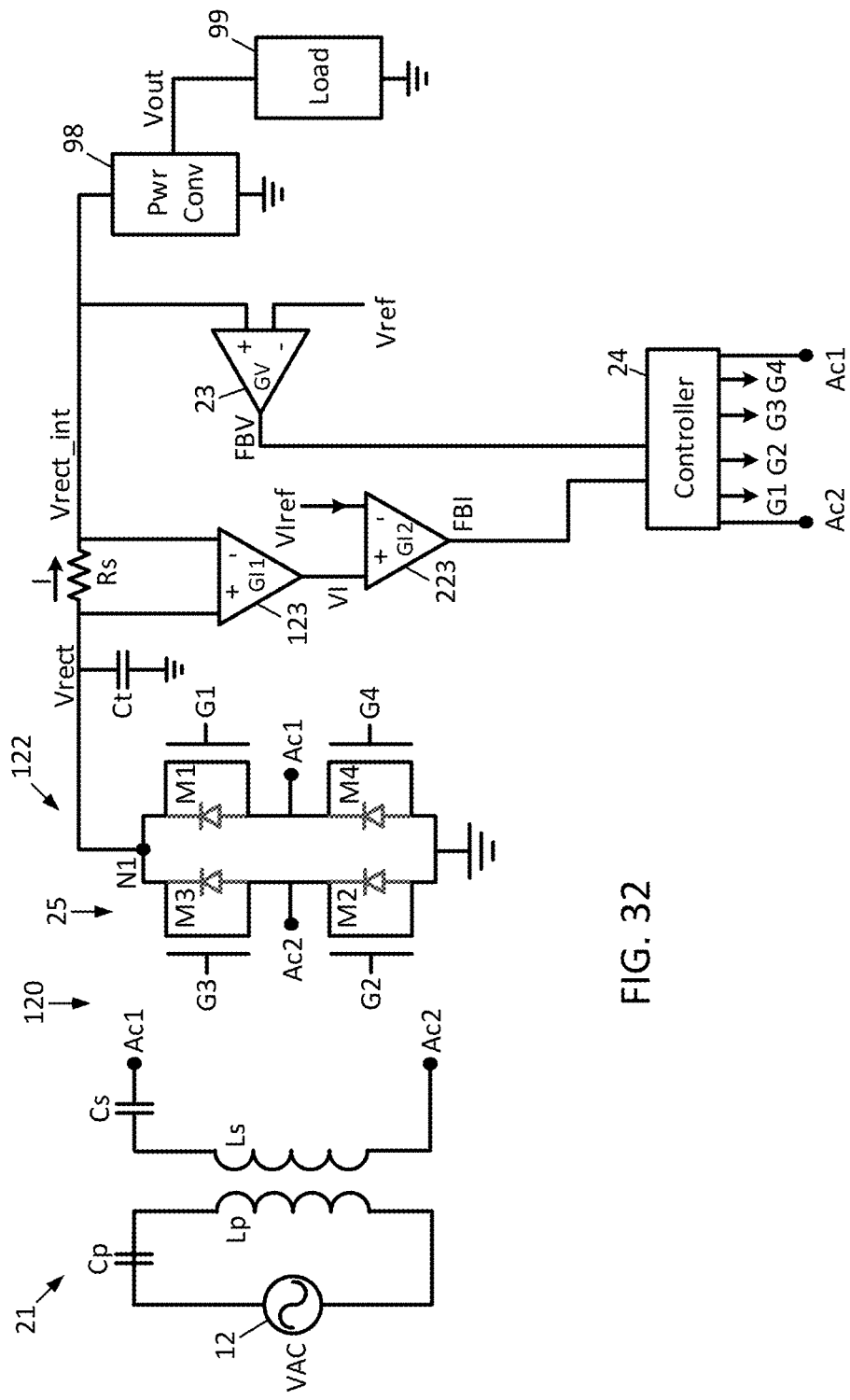
FIG. 32 is a schematic block diagram of a wireless power transmission system disclosed herein in which the bridge rectifier performs a regulation function based upon both voltage and current monitoring, used with an additional voltage converter to power a battery.

An embodiment effectuating this using the wireless charging system 120 is now described with reference to FIG. 32. Here, the structure and operation of the wireless power transmission system 120 is the same as described above with reference to FIG. 26, but the regtifier 25 is coupled through the sense resistor Rs to a DC-DC power converter 98 (such as a switched-capacitance converter), and the power converter 98 generates an output voltage Vout that is provided to a load 99 (such as a battery). In this example, in-phase regulation based on the voltage feedback signal FBV or current feedback signal FBI is used to regulate the rectified output voltage Vrect to 9V. The power converter 98 is a 2:1 converter and converts the rectified output voltage Vrect 9V to 4.5V to provide to the load 99.

While this wireless power transmission system 120 works reasonably well, the load current to the load 99 may vary (particularly where the load is a battery 99), causing the impedance of the power converter 98 to vary. Therefore, the exact conversion ratio of the power converter 98 does not remain constant. Since the rectified output voltage Vrect does remain constant due to the regulation of the regtifier 25, the output voltage Vout may therefore vary or try to vary resulting in unexpected variations of the output current in case the load is a battery.

In order to address this, the feedback used to control the regtifier 25 may instead be based upon the output voltage Vout, so that the rectified output voltage Vrect is regulated to ensure that the output voltage Vout stays at precisely the desired value. The approach involves taking into account the variations of the load impedance by integrating the power converter within the regulation loop.

Figure 33:
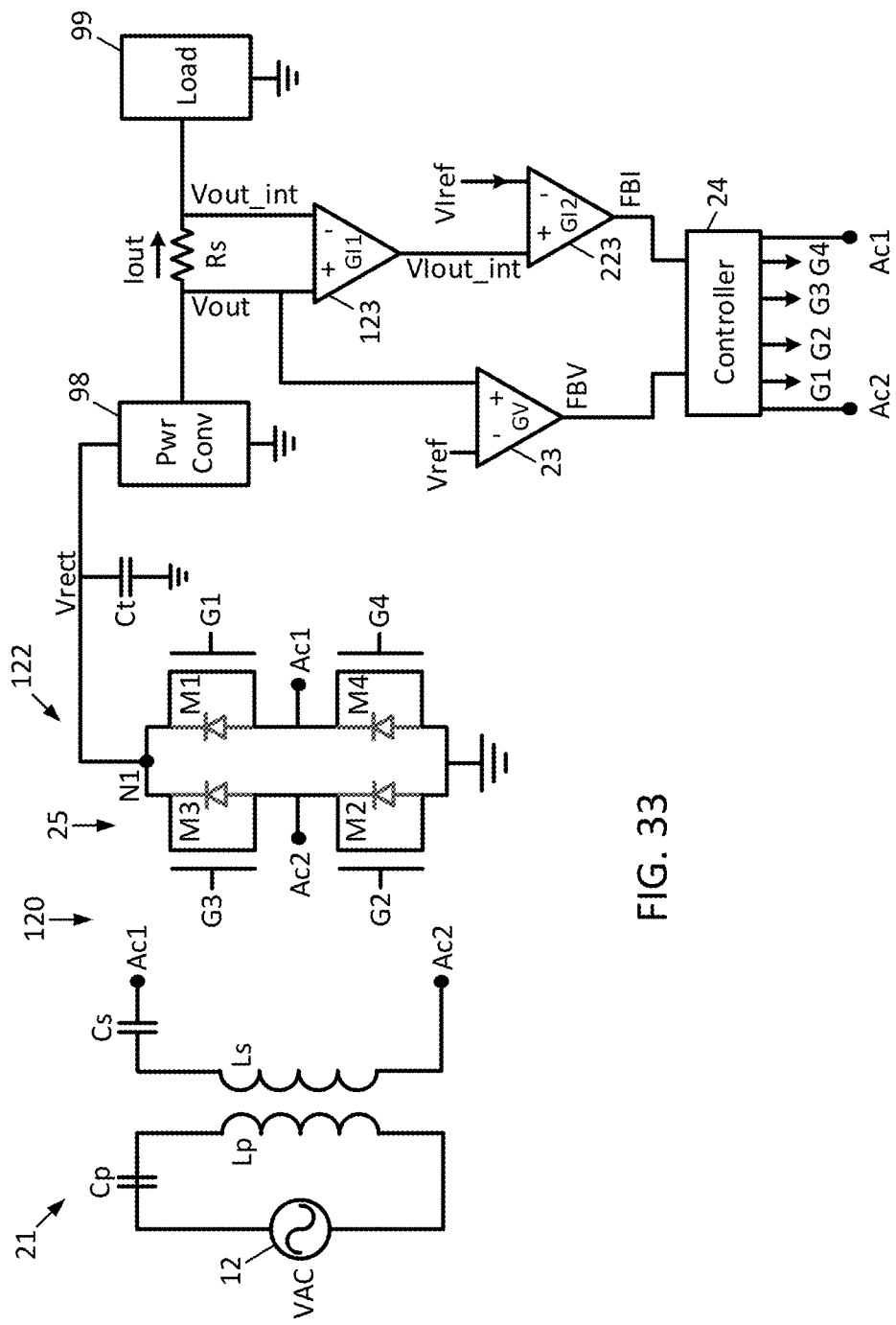
FIG. 33 is a schematic block diagram of a wireless power transmission system disclosed herein in which the bridge rectifier performs a regulation function based upon both voltage and current monitoring, used with an additional voltage converter to power a battery, in which feedback is taken from the output voltage and output current generated by the additional voltage converter.

Such an embodiment of the wireless charging system 120 is shown in FIG. 33. Here, notice that the power converter 98 is connected between node N1 and the sense resistor Rs, and that the load 99 is coupled to the power converter 98 through the sense resistor Rs.

The amplifier 23 has its inverting input terminal coupled to receive the reference voltage Vref, its non-inverting input terminal coupled to the receive the output voltage Vout generated by the power converter 98, and its output coupled to control circuitry 24 to provide the voltage feedback signal FBV thereto. For further improving the precision of the control voltage of the load, a minor variation involves coupling the non-inverting input of the amplifier 23 directly to Vout_int instead of Vout.

The amplifier 123 has its non-inverting input terminal coupled receive the output voltage Vout, an inverting input terminal coupled to receive the intermediate output voltage Vout_int provided to the load (with Vout-Vout_int being representative of the output current Iout through the sense resistor Rs), and an output at which a voltage VIout_int representing an intermediate current feedback signal Iout_int is generated. The amplifier 223 has its non-inverting input terminal coupled to receive VIout_int and an inverting input coupled to receive a voltage VIref representative of a reference current Iref, and an output at which the current feedback signal FBI is generated.

The control circuitry 24 receives input from the voltage feedback signal FBV and current feedback signal FBI, and based thereupon, generates the control signals G1-G4 for the transistors M1-M4 according to the in-phase and/or anti-phase regulation schemes described above with reference to FIG. 26.

Here, the voltage FBV can be calculated as:

$$FBV=GVx(Vout-Vref)$$

Similarly, FBI can be calculated as:

$$FBI=GI2x(VIout\_int-VIref)$$

By performing regulation based on the output voltage Vout and the output current Iout, the rectified output voltage Vrect is regulated such that the output voltage Vout provided to the load 99 remains at the desired value.

Figure 34:
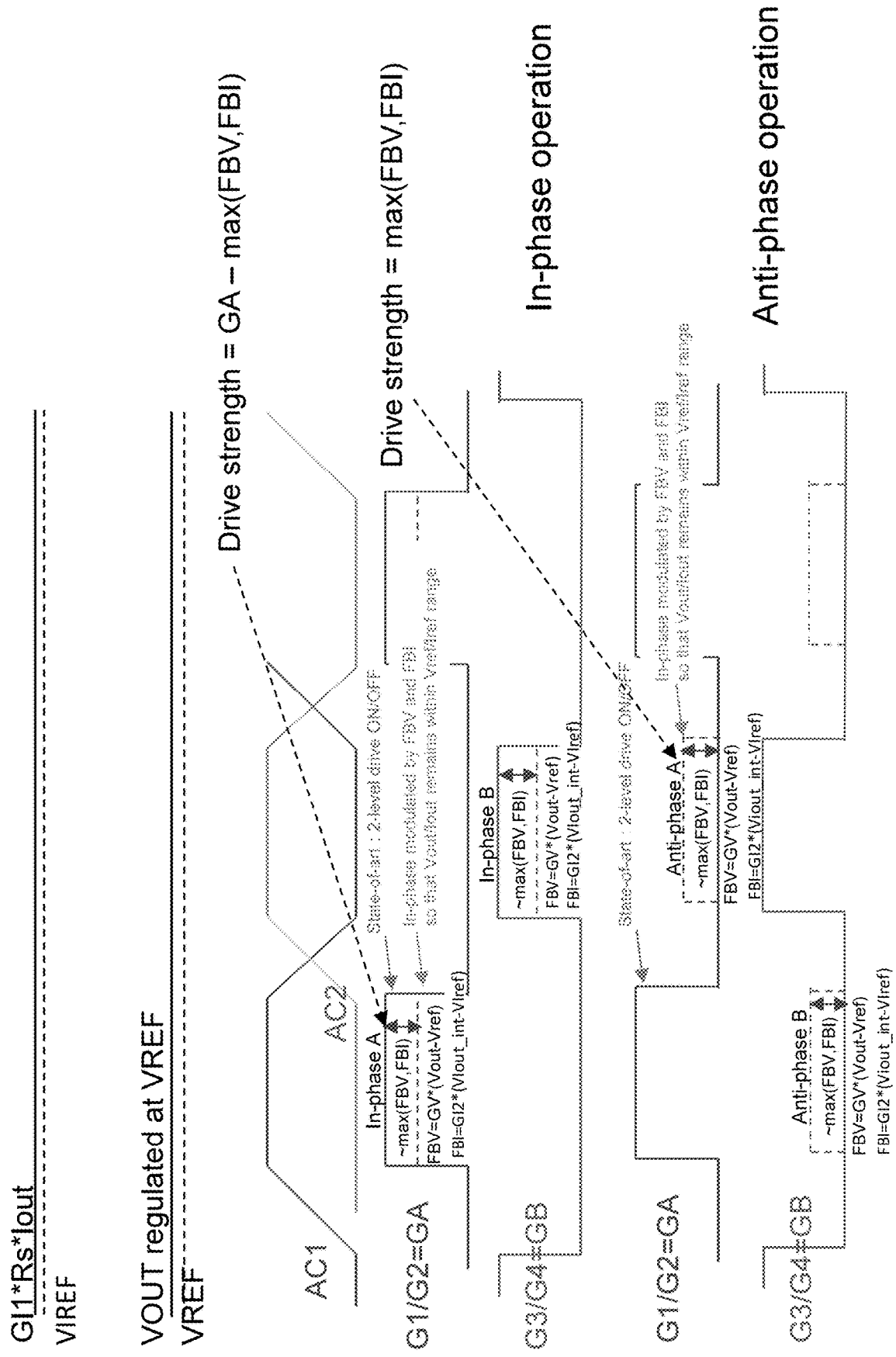
FIG. 34 is a timing diagram showing voltages of the wireless power transmission system of FIG. 33 in operation, when both voltage feedback loop and current feedback loop are simultaneously and concurrently controlling the bridge rectifier to perform in-phase regulation based upon voltage and current feedback, as well as when both voltage feedback loop and current feedback loop are simultaneously and concurrently controlling the bridge rectifier to perform anti-phase regulation based upon voltage and current feedback.

Waveforms showing the operation of the wireless power transmission system 120 are contained in FIG. 34. Waveforms for both in-phase regulation and anti-phase regulation are shown.

In the waveforms illustrated for performing in-phase regulation, the first phase drive signal GA (drive signals G1/G2) is reduced by whichever of the feedback signals FBI or FBV is greater, and the second phase drive signal GB (drive signals G3/G4) is reduced by whichever of the feedback signals FBI or FBV is greater. In the waveforms illustrated for performing anti-phase regulation, the first anti-phase drive signal GA is equal to whichever of the feedback signals FBI or FBV is greater, and the second anti-phase drive signal GB is equal to whichever of the feedback signals FBI or FBV is greater. As explained earlier with reference to the wireless power transmission system 120 of FIG. 26, the voltage VIref representing the reference current Iref is set to be a threshold amount higher than an expected nominal value of a voltage representing the current Iout (for example, 10% greater than the expected nominal current Iout) through the sense resistor Rs. Thus, the difference over the wireless power transmission system 120 of FIG. 26 is in where the feedback is taken, but the regulation scheme remains the same.

Figure 35:
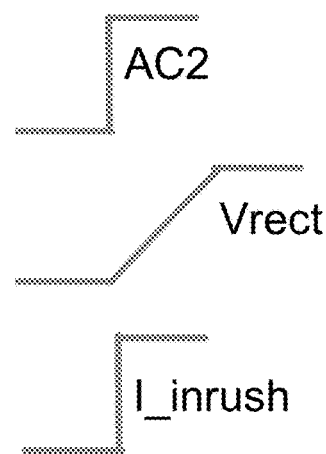
FIG. 35 is a graph showing the sharp rise in inrush current in the regtifier of FIG. 33 at startup despite the fact that the rectified output voltage has not yet reached its steady state level.
Figure 36:
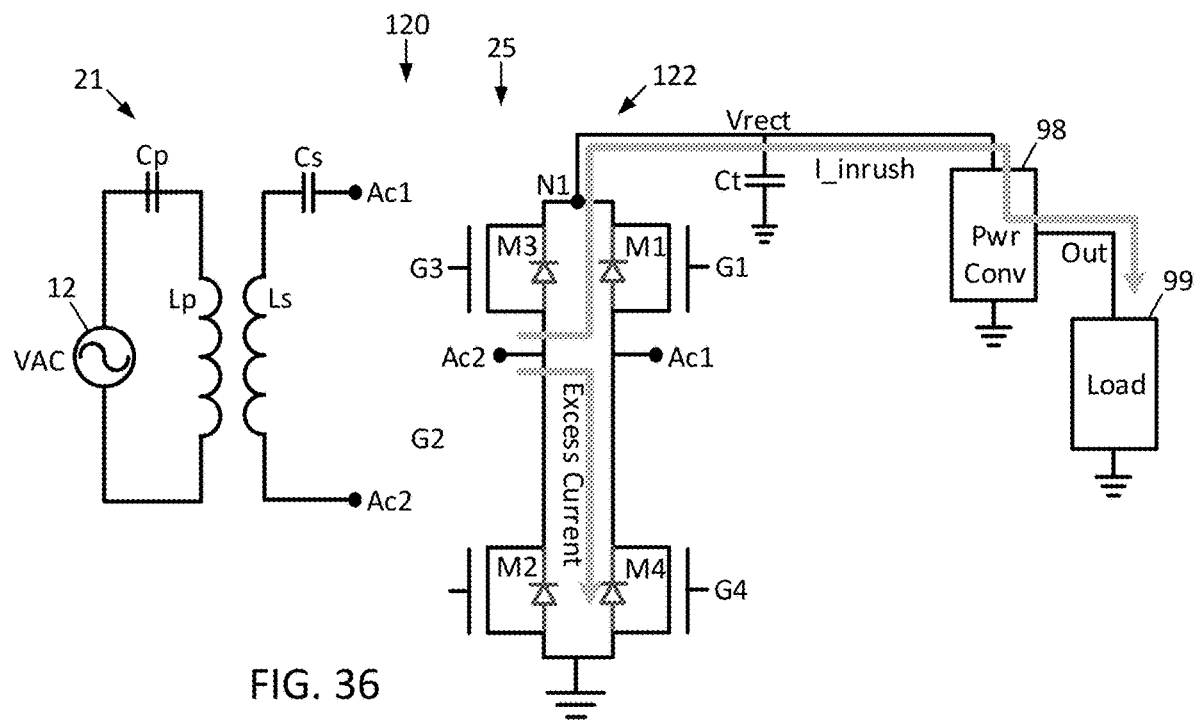
FIG. 36 is a schematic diagram of the transmitter and regtifier of FIG. 33 during startup, illustrating the control of the inrush current using anti-phase regulation based upon current feedback.

The use of anti-phase regulation based upon the current feedback signal FBI during startup to protect against a high inrush current also remains the same. Waveforms showing high inrush current I_inrush while the rectified output voltage Vrect is still below Vref are shown in FIG. 35, and the current paths for the inrush current I_inrush and the excess current dissipated by the regtifier 25 due to the anti-phase regulation during startup can be seen in FIG. 36. Once steady state operation is reached, regulation performed based upon the voltage feedback signal FBV is used, with regulation performed based upon the feedback signal FBI being used to control transients and act as a safety limit for the maximum current.

Figure 37:
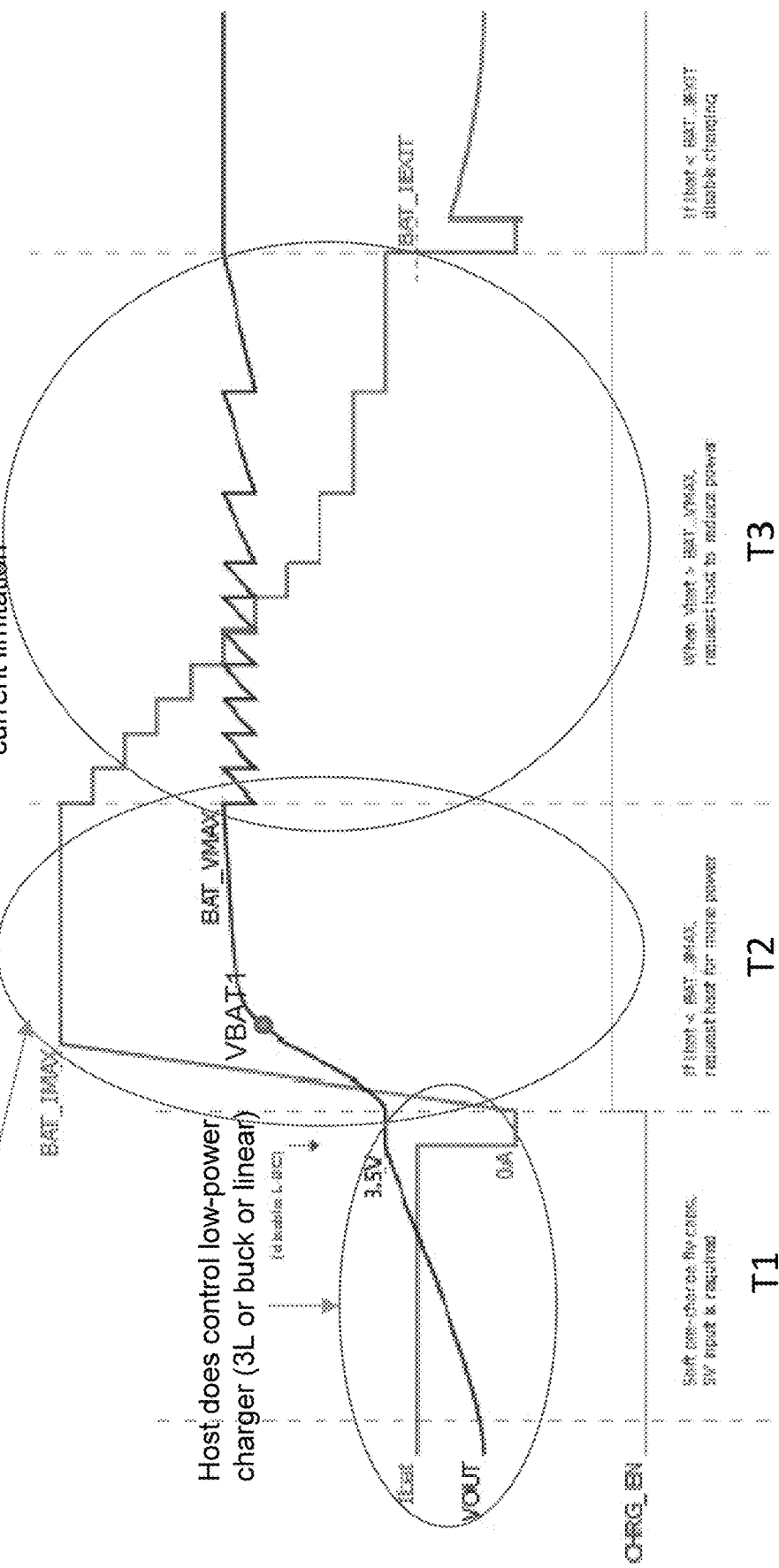
FIG. 37 is a graph of battery voltage and output voltage produced by the wireless power transmission system of FIG. 33 when charging a battery as a load.

Since the wireless power transmission system 120 is well suited to a situation where the load 99 is a battery, a battery charging profile utilizing the wireless power transmission system 120 has been improved and is now described with additional reference to the graph of FIG. 37. At the beginning of the charging cycle, shown as time interval T1, the host enables a low power charging system (not shown, but could be based upon a buck converter, linear converter, of 3 L converter) to charge the load 99 to a starting voltage, such as 3.5V. The low power charging system takes input power from the Vrect.

Once the starting voltage is reached, the time interval T2 begins, and the host enables the fast charging wireless power transmission system 120. In a conventional system the host is controlling the overall operation by progressively ramping the battery voltage from 3.5V to VBAT1. The control is performed by the main slow loop from the receiver 15 to the transmitter 10 and it takes few milliseconds of ASK communication with transmitter 10 before corrective actions is taken on the adjustment of the power level at the receiver 15 side.

Still referring to a conventional system, as the voltage Vout applied to the battery is a divided down version of the voltage at the input of the power converter 98 in case of a 2:1 converter for example, the host is to precisely control the input voltage of the power converter 98. Given that the power converter 98 input/output impedance is generally in the few tens of milliohms, a voltage error (overvoltage) of a few tens of millivolts at the input of the converter leads to an output current error (overcurrent) in the Ampere range. Also, it is likely that the input of the power converter 98 is not necessarily limited in power as it may be a regulator 17 output (since a LDO is generally cascaded after the rectifier) with a decoupling capacitance at its output which may be able to deliver high current peaks to the input of the power converter 98. This requires the regulator 17 output and the power converter 98 input to be equipped with current/voltage protections, and in the event the input voltage of the power converter 98 is not exactly what it should be, the power converter 98 may stop operating, or the regulator 17 may stop providing power. The effect of these protections kicking-in and out is that some over voltages or over currents may occur for example at the input of the power converter 98, and it has been seen that when the self-protection of one circuit (the LDO) triggers, it might induce the destruction of the other (power converter 98) and vice-versa. Ultimately, with such conventional systems, it takes significant hardware requirement and timing optimization efforts to properly bring-up the system, as well as to make attempts to ensure proper and safe operation in a variety of conditions, especially during transients when the wireless incoming power may surge. The main challenge is therefore to ensure that the load voltage/current is well-regulated despite the fact that the wireless incoming power may vary. The critical point with these conventional systems is the adaptation of impedance at power converter 98 input.

The wireless power transmission system described herein has a clear advantage in that it regulates the output Vrect of the regtifier 25 in a closed-loop such that the load 99 voltage Vout (battery voltage) is following a target, and cycle-to-cycle action can be taken if required, while in conventional systems the blocks (rectifier 16, regulator 17, power converter 98) are simply cascaded without a feedback loop other than the main loop slow loop from the receiver 15 to the transmitter 10, this main loop relying on slow ASK communication with transmitter 10 before corrective actions are taken at the receiver level 15.

The wireless power transmission system 120, when performing the charging shown in FIG. 37, operates as follows. The host targets stepping the voltage Vout from 3.5V to VBAT1. Anti-phase regulation with voltage feedback FBV is activated, with the voltage Vref being representative of a reference voltage set to a suitable value (for example, a few percent slightly above the host target from 3.5V to VBAT1), such that the voltage regulation is just at the limit for taking regulating action if called for, but the overall control of the level of power is left to the main loop through the transmitter 10. In other words, the transmitter 10 adapts the power such that the voltage Vout on the load is as per the expected voltage by the host, while Vref is set just higher. This operation is helping ensure that the power dissipation within the regtifier 25 and power converter 98 is low and the charging protocol is becoming closer to the objective of direct charging (direct charging here indicating a charging scheme in which the resistive path from input power to load is limited to a few resistive drops). Also, the system remains under supervision of the current feedback signal FBI, with the voltage VIref representative of a reference current being set to a suitable value (for example, 5% above the BAT IMAX current target) to limit inrush current to the load 99 so that the load 99 is not damaged but is quickly charged to a voltage VBAT1, with the output voltage Vout matching VBAT1. By setting Vref and VIref just above targets, the main loop adjusts the power as close as possible to the required power for obtaining the appropriate voltage/level on the load 99 without suffering any voltage drop in a regulator 17, and relying on the regtifier 25 for the features of ensuring that the load 99 is protected from excess of voltage and current.

Once the load 99 charge has been reached at the beginning of the time interval T3, the output voltage Vout has become greater than Vref, and regulation based upon the voltage feedback signal FBV takes over. The regulation at this point may be either in-phase or anti-phase. The reference voltage Vref is generated by the host and is adaptively adjusted so as to manage excess voltage transients and maintain the charge on the load 99 at or about BAT_VMAX, with current limitation based upon the current feedback signal FBI and decreasing VIref being used to control current transients, as the current to the load decreases within T3.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power reception system, comprising:
    a bridge rectifier arrangement of transistors receiving an input time varying power signal and being coupled between ground and an output node;
    a current sensor coupled between the output node and a load node and configured to sense a current flowing from the output node to the load node;
    a first feedback circuit configured to compare a voltage at the load node to a reference voltage and generate a first feedback voltage based thereupon;
    a second feedback circuit configured to compare the sensed current to a reference current and generate a second feedback voltage based thereupon; and
    a control circuit configured to receive the input time varying power signal and the first and second feedback voltages, and generate gate voltages for the transistors of the bridge rectifier arrangement based upon the input time varying power signal, and the first and second feedback voltages to cause:
        turn on of two transistors of the bridge rectifier arrangement during a first phase, and turn on of two other transistors of the bridge rectifier arrangement during a second phase, to thereby cause rectification of the input time varying power signal to produce an output voltage at the output node; and
        modulation of a gate voltage of at least one transistor of the bridge rectifier arrangement during the first phase based upon a greater of the first feedback voltage and the second feedback voltage, and modulation of a gate voltage of at least one other transistor of the bridge rectifier arrangement during the second phase based upon the greater of the first feedback voltage and the second feedback voltage, to thereby cause dissipation of excess power delivered by the input time varying power signal and therefore perform output voltage regulation on top of rectification.

2. The wireless power reception system of claim 1, wherein the first feedback circuit comprises a first amplifier having a non-inverting terminal receiving the voltage at the load node, an inverting terminal receiving the reference voltage, and an output at which the first feedback voltage is generated.

3. The wireless power reception system of claim 1, wherein the second feedback circuit comprises a second amplifier receiving input from the current sensor and providing output to a non-inverting terminal of a third amplifier, the third amplifier having an inverting terminal receiving a voltage representative of the reference current and having an output at which the second feedback voltage is generated.

4. The wireless power reception system of claim 3, wherein the current sensor comprises a sense resistor coupled between the output node and the load node; and wherein the second amplifier has a non-inverting input and an inverting input, with the sense resistor being coupled between the non-inverting input and the inverting input of the second amplifier.

5. The wireless power reception system of claim 1, wherein the at least one transistor that has its gate voltage modulated during the first phase is one of the two transistors that is turned on during the first phase;

wherein the at least one other transistor that has its gate voltage modulated during the second phase is one of the two transistors that is turned on during the second phase; and wherein the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated.

6. The wireless power reception system of claim 1, wherein the at least one transistor that has its gate modulated during the first phase is not one of the two transistors that is turned on during the first phase;

wherein the at least one other transistor that has its gate modulated during the second phase is not one of the two transistors that is turned on during the second phase; and wherein the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

7. The wireless power reception system of claim 1, wherein the control circuit is configured to switch between in-phase regulation of the bridge rectifier arrangement and anti-phase regulation of the bridge rectifier arrangement;

wherein, during in-phase regulation of the bridge rectifier arrangement:
  the at least one transistor that has its gate voltage modulated during the first phase is one of the two transistors that is turned on during the first phase; and
  the at least one other transistor that has its gate voltage modulated during the second phase is one of the two transistors that is turned on during the second phase; and
  wherein the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated; and wherein, during anti-phase regulation of the bridge rectifier arrangement:
  the at least one transistor that has its gate modulated during the first phase is not one of the two transistors that is turned on during the first phase;
  the at least one other transistor that has its gate modulated during the second phase is not one of the two transistors that is turned on during the second phase; and
  the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

8. The wireless power reception system of claim 7, wherein the control circuit switches to anti-phase regulation of the bridge rectifier arrangement during startup such that inrush current at startup is conducted through the at least one transistor that has its gate modulated during the first phase and is not one of the two transistors that is turned on during the first phase; and the at least one other transistor that has its gate modulated during the second phase and is not one of the two transistors that is turned on during the second phase and the modulation of the gate voltage of the at least one transistor during the first phase and the modulation of the gate voltage of the at least one other transistor during the second phase serves to sufficiently turn on the at least one transistor and the at least one other transistor so that an excess of the inrush current is conducted to ground.

9. The wireless power reception system of claim 8, wherein the control circuit switches back to in-phase regulation of the bridge rectifier arrangement once steady state operation of the bridge rectifier arrangement has been reached after startup.

10. The wireless power reception system of claim 1, wherein the reference current is set to be a threshold amount higher than the sensed current is expected to be during steady state operation such that during steady state operation, the first feedback voltage is greater than the second feedback voltage.

11. The wireless power reception system of claim 1, wherein the bridge rectifier arrangement of transistors is comprised of series coupled second and third transistors connected between the output node and ground, and series coupled first and fourth transistors connected between the output node and ground.

12. The wireless power reception system of claim 1, wherein the control circuit comprises:
  a control signal generator configured to:
    during the first phase, generate a first control signal that has a voltage magnitude sufficient to fully turn on the transistors of the bridge rectifier arrangement, and generate a second control signal that has a voltage magnitude low enough to fully turn off the transistors of the bridge rectifier arrangement;
    during the second phase, generate the second control signal as having a voltage magnitude sufficient to fully turn on the transistors of the bridge rectifier arrangement, and generating the first control signal as having a voltage magnitude low enough to fully turn off the transistors of the bridge rectifier arrangement;
  a first switch circuit configured to:
    during the first phase, generate the gate voltage for the at least one transistor by generating the gate voltage as being equal to the voltage magnitude of the first control signal less the greater of the first feedback voltage and the second feedback voltage; and
    during the second phase, generate the gate voltage for the at least one transistor by generating the gate voltage as being equal to the voltage magnitude of the first control signal; and
  a second switch circuit configured to:
    during the first phase, generate the gate voltage for the at least one other transistor by generating the gate voltage as being equal to the voltage magnitude of the second control signal; and
    during the second phase, generate the gate voltage for the at least one other transistor by generating the gate voltage as being equal to the voltage magnitude of the second control signal less the greater of the first feedback voltage and the second feedback voltage.

13. The wireless power reception system of claim 1, wherein the control circuit comprises:
a control signal generator configured to:
during the first phase, generate a first control signal that has a voltage magnitude sufficient to fully turn on the transistors of the bridge rectifier arrangement, and generate a second control signal that has a voltage magnitude low enough to fully turn off the transistors of the bridge rectifier arrangement; and
during the second phase, generate the second control signal as having a voltage magnitude sufficient to fully turn on the transistors of the bridge rectifier arrangement, and generating the first control signal as having a voltage magnitude low enough to fully turn off the transistors of the bridge rectifier arrangement;
a first switch circuit configured to:
during the first phase, generate a gate voltage for the at least one transistor as being equal to the voltage magnitude of the first control signal; and
during the second phase, generate the gate voltage for the at least one transistor as being equal to a sum of the voltage magnitude of the first control signal and the greater of the first feedback voltage and the second feedback voltage; and
a second switch circuit configured to:
during the first phase, generate a gate voltage for the at least one other transistor as being equal to a sum of the voltage magnitude of the second control signal and the greater of the first feedback voltage and the second feedback voltage; and
during the first phase, generate the gate voltage for the at least one other transistor as being equal to the voltage magnitude of the second control signal.

14. A wireless power reception system, comprising:
a bridge rectifier arrangement of transistors receiving an input time varying power signal and being coupled between ground and an output node;
a voltage converter coupled between the output node and a current sensor;
a load node coupled to the current sensor, wherein the current sensor is configured to sense a current flowing from the voltage converter to the load node;
a first feedback circuit configured to compare a voltage output by the voltage converter to a reference voltage and generate a first feedback voltage based thereupon;
a second feedback circuit configured to compare the sensed current to a reference current and generate a second feedback voltage based thereupon;
a control circuit configured to receive the input time varying power signal and the first and second feedback voltages, and generate gate voltages for the transistors of the bridge rectifier arrangement based upon the input time varying power signal, and the first and second feedback voltages to cause:
turn on of two transistors of the bridge rectifier arrangement during a first phase, and turn on of two other transistors of the bridge rectifier arrangement during a second phase, to thereby cause rectification of the input time varying power signal to produce an output voltage at the output node; and
modulation of a gate voltage of at least one transistor of the bridge rectifier arrangement during the first phase based upon a greater of the first feedback voltage and the second feedback voltage, and modulation of a gate voltage of at least one other transistor of the bridge rectifier arrangement during the second phase based upon the greater of the first feedback voltage and the second feedback voltage, to thereby cause dissipation of excess power delivered by the input time varying power signal and therefore perform output voltage regulation on top of rectification.

15. The wireless power reception system of claim 14, wherein the first feedback circuit comprises a first amplifier having a non-inverting terminal receiving the voltage output by the voltage converter, an inverting terminal receiving the reference voltage, and an output at which the first feedback voltage is generated.

16. The wireless power reception system of claim 14, wherein the second feedback circuit comprises a second amplifier receiving input from the current sensor and providing output to a non-inverting terminal of a third amplifier, the third amplifier having an inverting terminal receiving a voltage representative of the reference current and having an output at which the second feedback voltage is generated.

17. The wireless power reception system of claim 16, wherein the current sensor comprises a sense resistor coupled between an output of the voltage converter and the load node; and wherein the second amplifier has a non-inverting input and an inverting input, with the sense resistor being coupled between the non-inverting input and the inverting input of the second amplifier.

18. The wireless power reception system of claim 14,
wherein the at least one transistor that has its gate voltage modulated during the first phase is one of the two transistors that is turned on during the first phase;
wherein the at least one other transistor that has its gate voltage modulated during the second phase is one of the two transistors that is turned on during the second phase; and
wherein the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated.

19. The wireless power reception system of claim 14,
wherein the at least one transistor that has its gate modulated during the first phase is not one of the two transistors that is turned on during the first phase;
wherein the at least one other transistor that has its gate modulated during the second phase is not one of the two transistors that is turned on during the second phase; and
wherein the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

20. The wireless power reception system of claim 14,
wherein the control circuit is configured to switch between in-phase regulation of the bridge rectifier arrangement and anti-phase regulation of the bridge rectifier arrangement;
wherein, during in-phase regulation of the bridge rectifier arrangement:

the at least one transistor that has its gate voltage modulated during the first phase is one of the two transistors that is turned on during the first phase;

the at least one other transistor that has its gate voltage modulated during the second phase is one of the two transistors that is turned on during the second phase; and wherein the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated; and wherein, during anti-phase regulation of the bridge rectifier arrangement:

the at least one transistor that has its gate modulated during the first phase is not one of the two transistors that is turned on during the first phase;

the at least one other transistor that has its gate modulated during the second phase is not one of the two transistors that is turned on during the second phase; and the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

21. The wireless power reception system of claim 20, wherein the control circuit switches to anti-phase regulation of the bridge rectifier arrangement during startup such that inrush current at startup is conducted through the at least one transistor that has its gate modulated during the first phase and through the at least one transistor that has its gate modulated during the second phase.

22. The wireless power reception system of claim 21, wherein the control circuit switches back to in-phase regulation of the bridge rectifier arrangement once steady state operation of the bridge rectifier arrangement has been reached after startup.

23. The wireless power reception system of claim 14, wherein the reference current is set to be a threshold amount higher than the sensed current is expected to be during steady state operation such that during steady state operation, the first feedback voltage is greater than the second feedback voltage.

24. The wireless power reception system of claim 14, wherein the bridge rectifier arrangement of transistors is comprised of series coupled second and third transistors connected between the output node and ground, and series coupled first and fourth transistors connected between the output node and ground.

25. The wireless power reception system of claim 14, wherein the control circuit comprises:

a control signal generator configured to:
during the first phase, generate a first control signal that has a voltage magnitude sufficient to fully turn on the transistors of the bridge rectifier arrangement, and generate a second control signal that has a voltage magnitude low enough to fully turn off the transistors of the bridge rectifier arrangement; and during the second phase, generate the second control signal as having a voltage magnitude sufficient to fully turn on the transistors of the bridge rectifier arrangement, and generating the first control signal as having a voltage magnitude low enough to fully turn off the transistors of the bridge rectifier arrangement;

a first switch circuit configured to:
during the first phase, generate the gate voltage for the at least one transistor by generating the gate voltage as being equal to the voltage magnitude of the first control signal less the greater of the first feedback voltage and the second feedback voltage; and during the second phase, generate the gate voltage for the at least one transistor by generating the gate voltage as being equal to the voltage magnitude of the first control signal; and a second switch circuit configured to:
during the first phase, generate the gate voltage for the at least one other transistor by generating the gate voltage as being equal to the voltage magnitude of the second control signal; and during the second phase, generate the gate voltage for the at least one other transistor by generating the gate voltage as being equal to the voltage magnitude of the second control signal less the greater of the first feedback voltage and the second feedback voltage.

26. The wireless power reception system of claim 14, wherein the control circuit comprises:

a control signal generator configured to:
during the first phase, generate a first control signal that has a voltage magnitude sufficient to fully turn on the transistors of the bridge rectifier arrangement, and generate a second control signal that has a voltage magnitude low enough to fully turn off the transistors of the bridge rectifier arrangement; and during the second phase, generate the second control signal as having a voltage magnitude sufficient to fully turn on the transistors of the bridge rectifier arrangement, and generating the first control signal as having a voltage magnitude low enough to fully turn off the transistors of the bridge rectifier arrangement;

a first switch circuit configured to:
during the first phase, generate a gate voltage for the at least one transistor as being equal to the voltage magnitude of the first control signal; and during the second phase, generate the gate voltage for the at least one transistor as being equal to a sum of the voltage magnitude of the first control signal and the greater of the first feedback voltage and the second feedback voltage; and a second switch circuit configured to:
during the first phase, generate a gate voltage for the at least one other transistor as being equal to a sum of the voltage magnitude of the second control signal and the greater of the first feedback voltage and the second feedback voltage; and during the second phase, generate the gate voltage for the at least one other transistor as being equal to the voltage magnitude of the second control signal.

\* \* \* \* \*